(12) United States Patent
Okajima

(10) Patent No.: US 7,633,326 B2
(45) Date of Patent: Dec. 15, 2009

(54) TIMING CONTROLLER AND CONTROLLED DELAY CIRCUIT FOR CONTROLLING TIMING OR DELAY TIME OF A SIGNAL BY CHANGING PHASE THEREOF

(75) Inventor: Yoshinori Okajima, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 25 days.

(21) Appl. No.: 11/502,395

(22) Filed: Aug. 11, 2006

(65) Prior Publication Data
US 2006/0273840 A1 Dec. 7, 2006

Related U.S. Application Data

(60) Division of application No. 10/708,145, filed on Feb. 11, 2004, now Pat. No. 7,119,595, which is a division of application No. 10/158,141, filed on May 31, 2002, now abandoned, which is a division of application No. 09/975,412, filed on Oct. 12, 2001, now Pat. No. 6,420,922, which is a division of application No. 09/518,930, filed on Mar. 3, 2000, now Pat. No. 6,333,657, which is a division of application No. 08/681,978, filed on Jul. 30, 1996, now Pat. No. 6,081,147, which is a continuation-in-part of application No. 08/534,650, filed on Sep. 27, 1995, now abandoned.

(30) Foreign Application Priority Data

Sep. 29, 1994 (JP) .................................... 6-235398
Mar. 19, 1996 (JP) ...................................... 8-62675

(51) Int. Cl.
*H03H 11/26* (2006.01)

(52) U.S. Cl. ...................................... 327/261; 327/276
(58) Field of Classification Search .................. None
See application file for complete search history.

(56) References Cited

U.S. PATENT DOCUMENTS 4,719,608 A    1/1988 Genat et al. .................. 368/113

(Continued)

FOREIGN PATENT DOCUMENTS

EP    0-460-669    12/1991

(Continued)

OTHER PUBLICATIONS

W. Jutzi: "Active Tapped Delay Line Filter," IBM Technical Disclosure Bulletin, vol. 12, No. 9, Feb. 1970.
Timo Rahkonen et al.: "The Use of Stabilized CMOS Delay Lines in the Digitization of Short Time Intervals," IEEE International Symposium on Jun. 16, 1991, vol. 4, pp. 2252-2255.

*Primary Examiner*—Cassandra Cox
(74) *Attorney, Agent, or Firm*—Kratz, Quintos & Hanson, LLP

(57) ABSTRACT

A controlled delay circuit has a first gate chain, and a second gate chain. The first gate chain is used to measure a time difference between a changeover point of a first control signal and a changeover point of a second control signal. The second gate chain, which receives third signals generated in the first gate chain and representing the time difference, is used to provide an appropriate delay time from an input to an output depending on the time difference. The controlled delay circuit is capable of properly controlling the timing of the control signal according to the period of the control signal.

16 Claims, 82 Drawing Sheets

U.S. PATENT DOCUMENTS

| | | | |
|---|---|---|---|
| 4,859,954 A | 8/1989 | Yoshimura | 328/155 |
| 4,999,526 A | 3/1991 | Dudley | 307/269 |
| 5,087,829 A * | 2/1992 | Ishibashi et al. | 327/152 |
| 5,179,303 A | 1/1993 | Searles et al. | 307/603 |
| 5,204,564 A | 4/1993 | Ochiai | 307/603 |
| 5,216,302 A | 6/1993 | Tanizawa | 307/603 |
| 5,223,755 A | 6/1993 | Richley | 307/603 |
| 5,245,231 A | 9/1993 | Kocis et al. | 307/606 |
| 5,304,953 A | 4/1994 | Heim et al. | 331/1 A |
| 5,355,037 A | 10/1994 | Andresen et al. | 307/602 |
| 5,376,849 A | 12/1994 | Dickol et al. | 327/278 |
| 6,075,395 A | 6/2000 | Saeki | 327/161 |
| 6,229,363 B1 | 5/2001 | Eto et al. | 327/158 |
| RE37,232 E * | 6/2001 | Saeki | 327/261 |
| 6,313,674 B1 * | 11/2001 | Akita et al. | 327/155 |

FOREIGN PATENT DOCUMENTS

| | | |
|---|---|---|
| JP | 55-166331 | 12/1980 |
| JP | 3-241918 | 10/1991 |
| JP | 4-364609 | 12/1992 |
| JP | 6-112782 | 4/1994 |
| JP | 6-232709 | 8/1994 |
| JP | 09215005 A | 8/1997 |

* cited by examiner

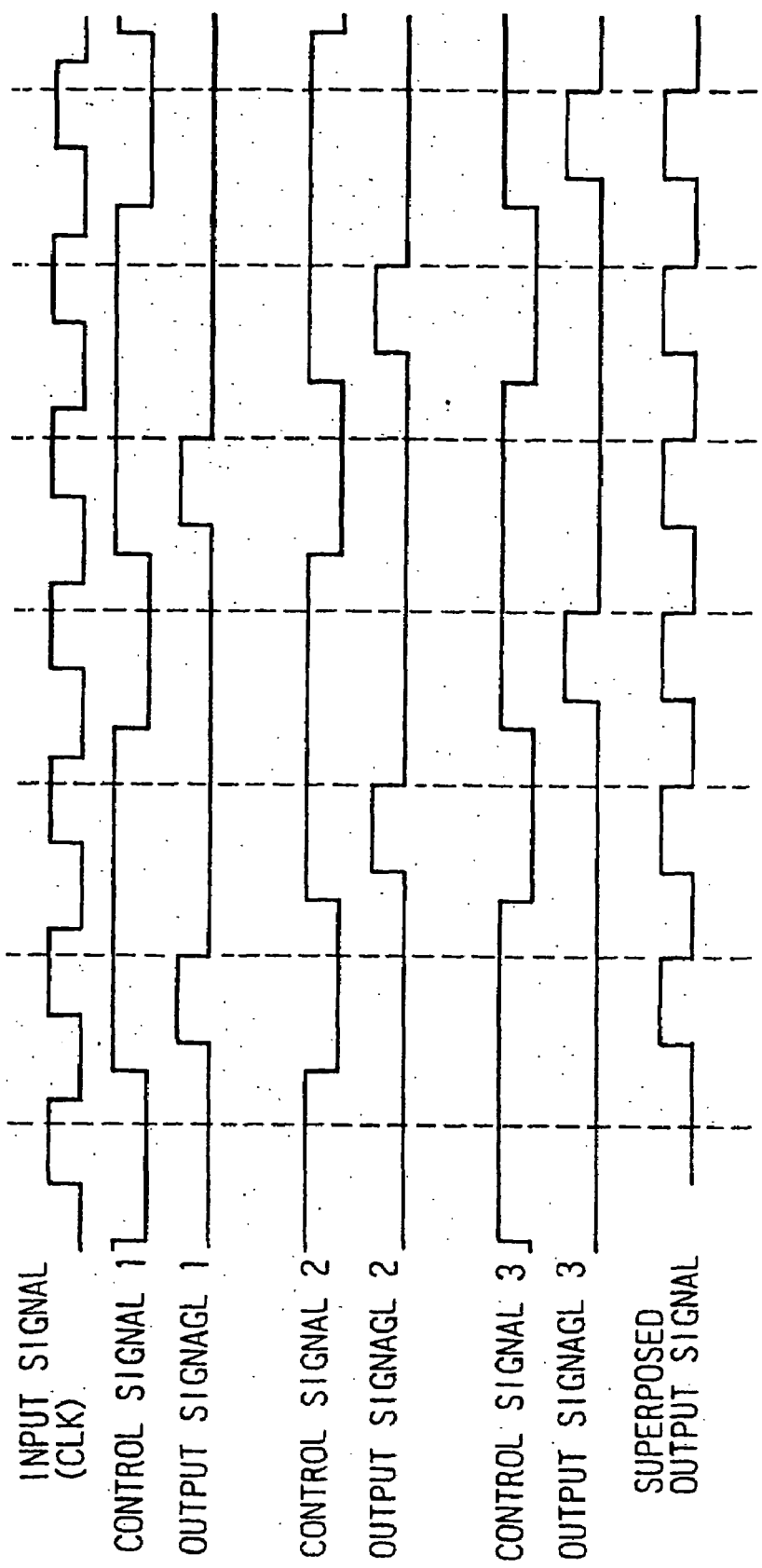

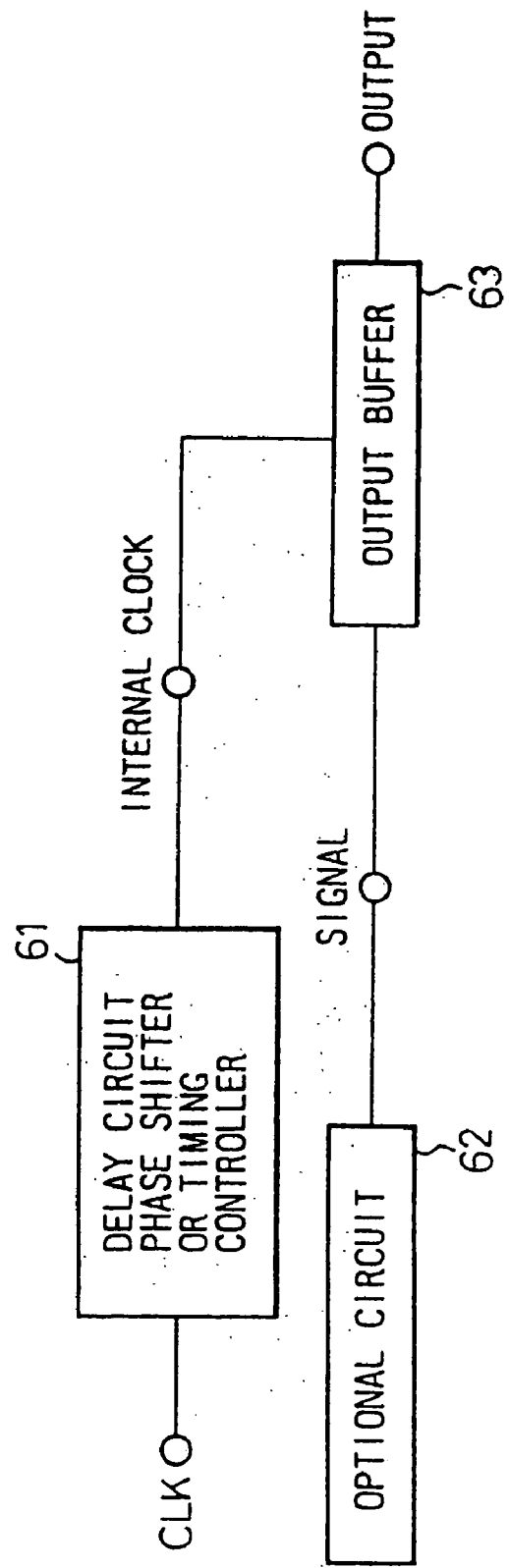

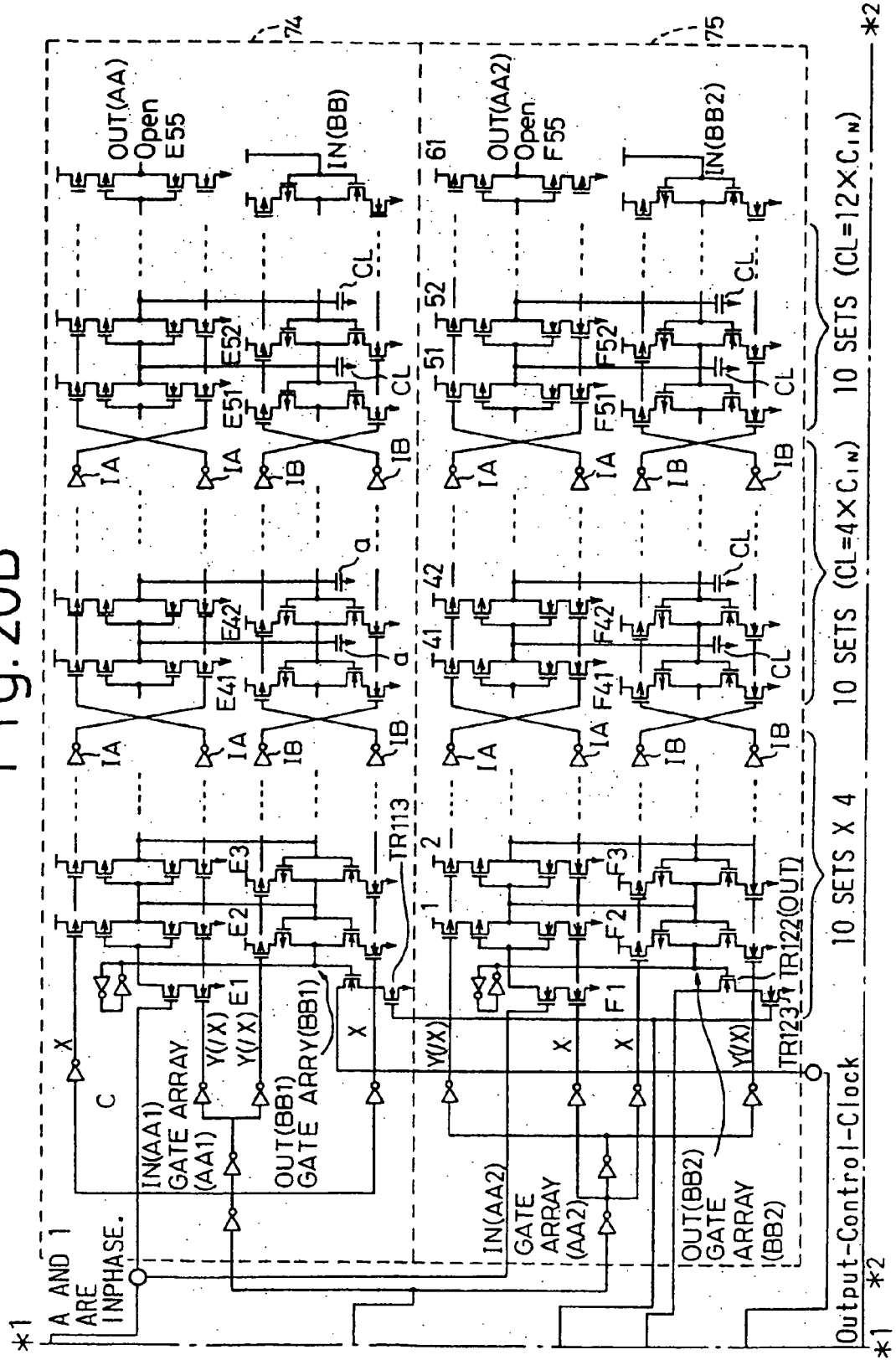

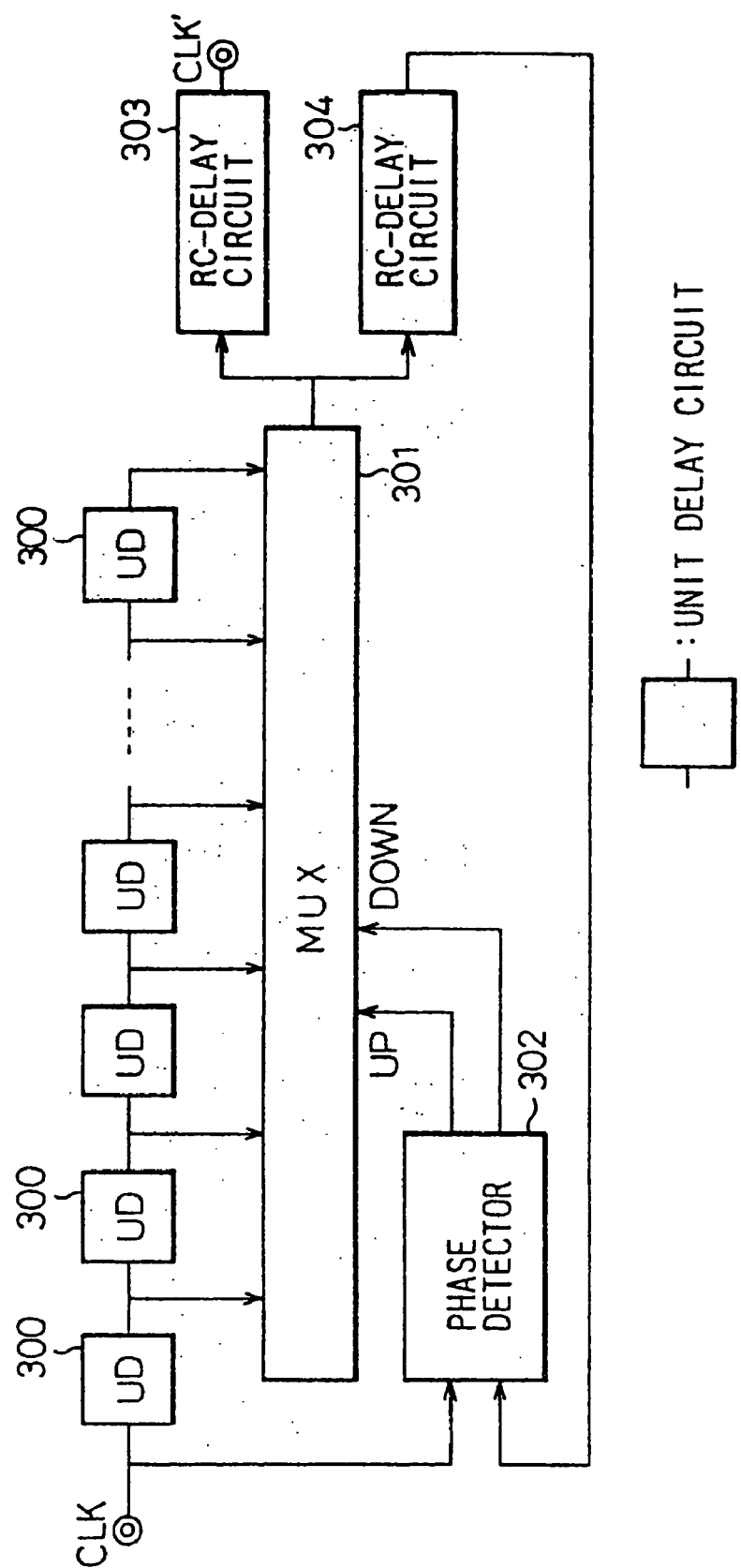

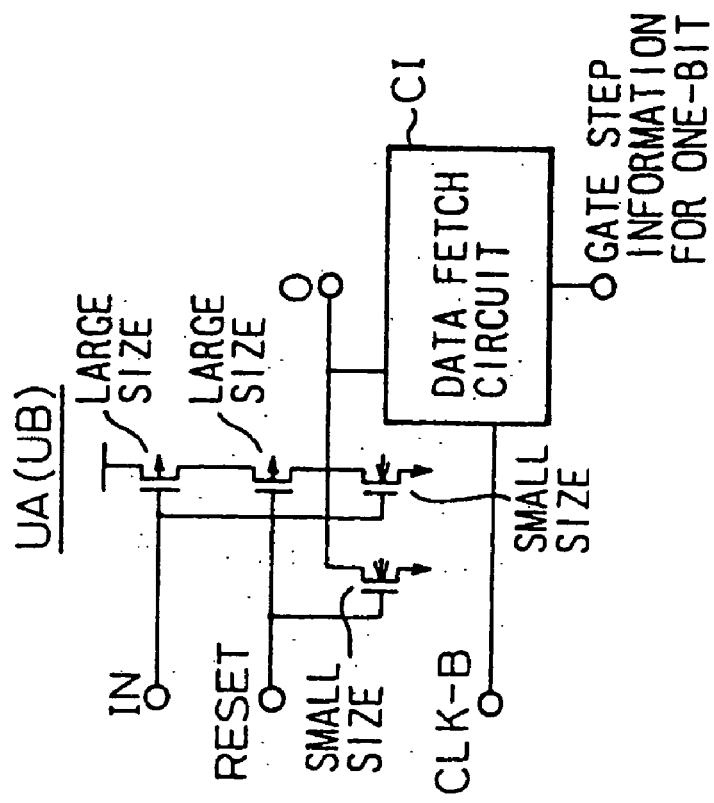
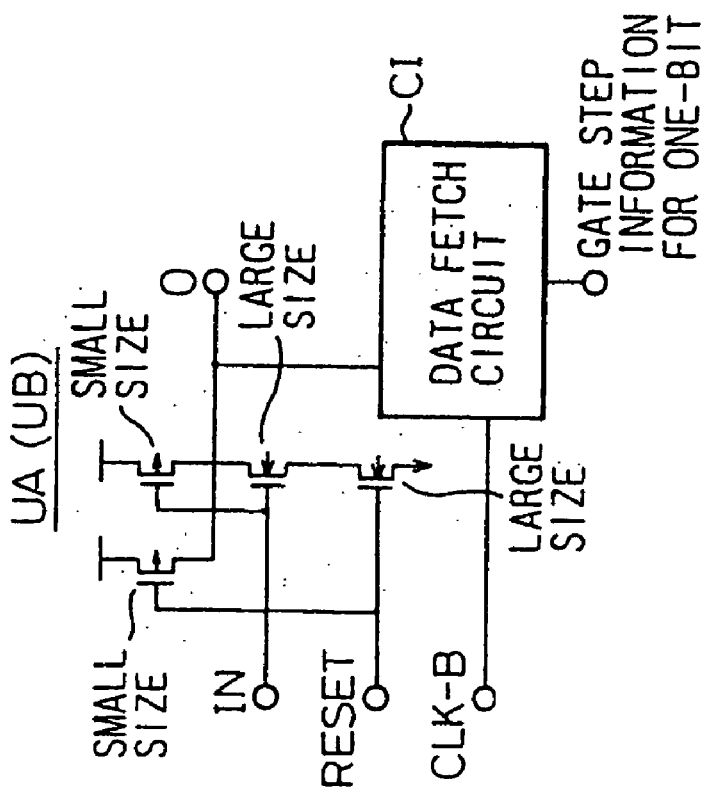
Fig.34A
Fig.34B

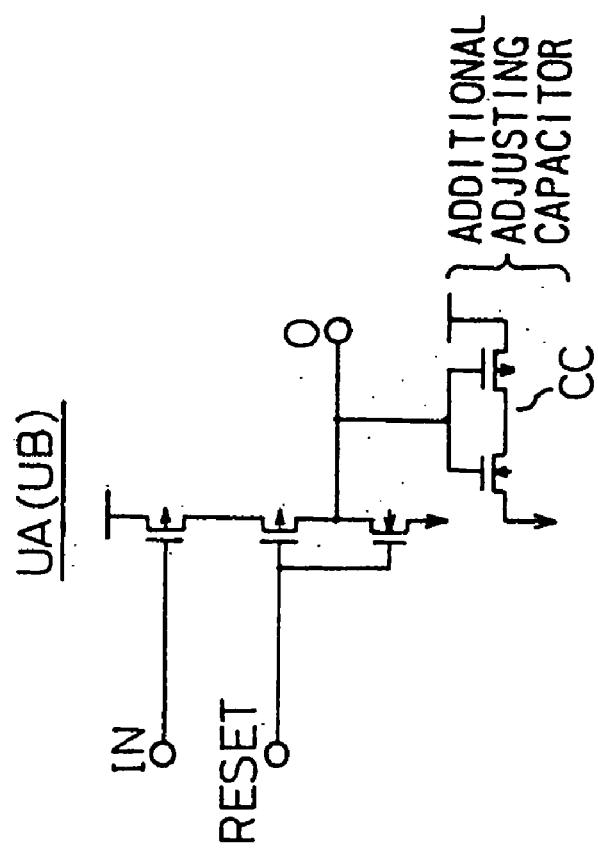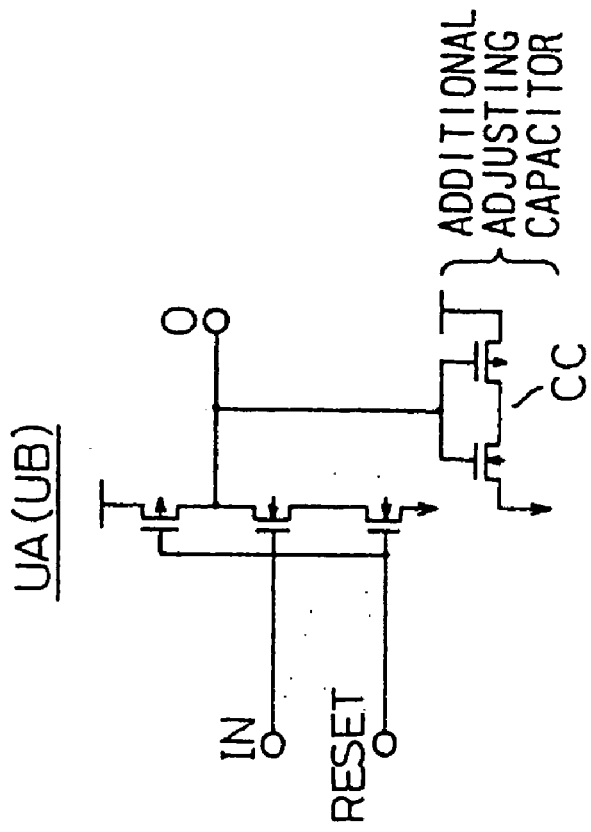

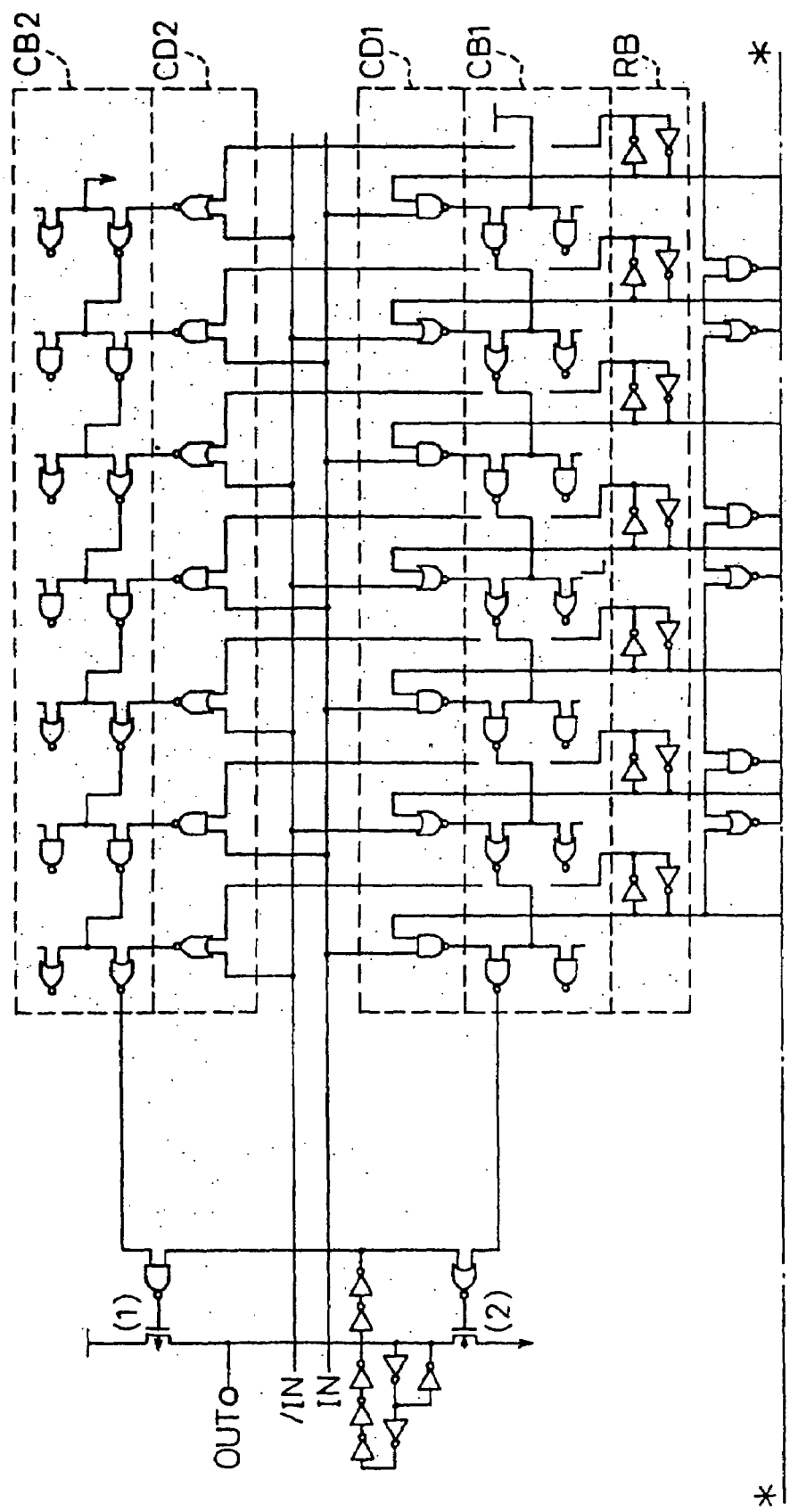

TIMING CONTROLLER AND CONTROLLED DELAY CIRCUIT FOR CONTROLLING TIMING OR DELAY TIME OF A SIGNAL BY CHANGING PHASE THEREOF

CROSS REFERENCE TO RELATED APPLICATIONS

This application is a divisional application of U.S. patent application Ser. No. 10/708,145, filed on Feb. 11, 2004, now U.S. Pat. No. 7,119,595 which application is a divisional application of U.S. patent application Ser. No. 10/158,141, filed on May 31, 2002, now abandoned which is a divisional application of Ser. No. 09/975,412 filed Oct. 12, 2001 U.S. Pat. No. 6,420,922, issued on Jul. 16, 2002; which is a divisional of Ser. No. 09/518,930 filed Mar. 3, 2000 U.S. Pat. No. 6,333,657, issued on Dec. 25, 2001; which is a divisional of Ser. No. 08/681,978 filed Jul. 30, 1996 U.S. Pat. No. 6,081,147, issued on Jun. 27, 2000; which is a continuation-in-part of U.S. patent application Ser. No. 08/534,650, filed on Sep. 27, 1995 now abandoned.

BACKGROUND OF THE INVENTION

1. Field of the Invention

The present invention relates to a timing controller and a delay circuit (controlled delay circuit), and more particularly, to a timing controller adopted for electronic circuits, for controlling the timing of a signal by changing the phase of the signal.

2. Description of the Related Art

Recent computers employ high-speed CPUs.(central processing units: MPUS) and electronic circuits. These high-speed devices require high-speed interfaces.

The access time of a synchronous memory (for example, synchronous dynamic random access memory: SDRAM) is basically determined by a delay time in an input buffer, a delay time in long wiring, and a delay time in an output buffer. These delay times are reducible only by reducing the chip size or by improving the transistor characteristics. It is very difficult, therefore, to provide high-speed synchronous memories.

LSI chips are becoming larger, and the delay time in the long wiring reaches one nanosecond or more. These are many LSIs that have an access time of five nanoseconds or longer. The long access time limits the rate of continuous access operations to about 100 MHz.

On the other hand, the signal frequency inside a chip can be increased by employing a pipeline structure and parallel-serial conversion. An output circuit of the chip, however, is incapable of following the internal speed of the chip. It is required, therefore, to provide a timing controller for properly controlling the timing of a control signal to the output circuit according to the period of the control signal. The problems of the prior art will be explained hereinafter in detail with reference to the accompanying drawings.

SUMMARY OF THE INVENTION

An object of the present invention is to provide a timing controller for properly controlling the timing of a control signal according to the period of the control signal. Further, another object of the present invention is to provide a controlled delay circuit for obtaining a signal including a required delay time or a required frequency by decreasing consumption power without receiving influence of noises caused by power voltage or temperature fluctuations. In addition, still another object of the present invention is to provide a controlled delay circuit (control signal generator) capable of correctly generating a high-speed clock signal without a quantization error or an offset, as well as providing a controlled delay circuit used for such a control signal generator.

According to the present invention, there is provided a controlled delay circuit comprising a first gate chain for measuring a time difference between a changeover point of a first control signal and a changeover point of a second control signal; and a second gate chain, receiving third signals which are generated in the first gate chain and represent the time difference, for providing an appropriate delay time from an input to an output depending on the time difference.

The third control signal may be stored in a memory or a register circuit to fix the third control signal. The data stored in the memory or register circuit may be renewed in accordance with specific clock cycles.

Further, according to the present invention, there is provided a controlled delay circuit comprising a first gate chain having gate circuits connected in series to transmit a signal in a first direction; a second gate chain having gate circuits connected in series to transmit a signal in a second direction opposite to the first direction; and a control circuit for activating and inactivating at least a part of the first gate chain according to a first control signal and at least a part of the second gate chain according to a second control signal, and at least one node in the first-gate chain being short-circuited to at least one node in the second gate chain, to invert an input signal to the first gate chain and provide an output signal from the second gate chain.

A number of the gate circuits in the first gate chain may be at least three and be equal to or greater than a number of the gate circuits in the second gate chain. The first and second control signals may be produced according to a common signal, which may be set to a first level to activate the first gate chain and inactivate the second gate chain and to a second level to inactivate the first gate chain and activate the second gate chain. The control circuit may produce the first and second control signals according to a clock signal and a general control signal for controlling the controlled delay circuit as a whole.

The control circuit may contain a frequency divider. The control circuit may divide a frequency of an input signal to the first gate chain by N (N being an integer equal to or greater than two), to produce control signals each having a period that is N times as long as a period of the input signal, supply the control signals to N sets of the first and second gate chains, and superpose outputs of the N sets, to provide an output signal having the same frequency as and a different phase from the input signal. The control circuit may halve the frequency of the input signal to the first gate chain, to produce complementary control signals each having a period twice as long as that of the input signal, supply the first control signal and second control signal to two sets of the first and second gate chains, and superpose outputs of the two sets, to provide an output signal having the same frequency as and a different phase from the input signal.

The first control signal and second control signal may be supplied to the gate circuits of the first gate chain and second gate chain through respective signal lines. The signal lines may be connected to the gate circuits of the first gate chain and second gate chain through buffers arranged for every predetermined number of the gate circuits. The buffers may be inverters through which the signal lines are alternately connected to the first and second gate chains.

Sizes of transistors forming the gate circuits of the first gate chain may be differentiate from sizes of transistors forming the gate circuits of the second gate chain, to temporally multiply the delay time generated in the first gate chain by a given value, which may correspond to a ratio of the transistor sizes, and invert the multiplied input signal. Each of the gate circuits of the first and second gate chains may be an inverter having a power source controlling transistor to be switched in response to a control signal, to activate one of the first and second gate chains.

Each of the gate circuits of the first and second gate chains may be an inverter, a level of a voltage applied to the inverters being changed to activate one of the first and second gate chains. Each common node in the first and second gate chains may be provided with a capacitor element to control signal propagation delay characteristics of the gate circuits. Capacitances of the capacitor element may be gradually increased from an input side of the first gate chain toward an output side thereof.

An output end of the first gate chain may be set to a high impedance state, an input end of the second gate chain may be fixed at first potential, an input signal of second potential supplied when the first gate chain is activated may be reversely transmitted when the second gate chain is activated, so that data of the first potential appears at an output end of the second gate chain, to thereby reproducing a time difference between a changeover point of the input signal to the first gate chain and a changeover point of the first control signal by a time difference between a changeover point of the second control signal and a changeover point of the output of the second gate chain.

An input end of the first gate chain may be provided with a one-way drive circuit for driving the first gate chain only to one of the first potential and second potential. An output end of the second gate chain may be provided with an output buffer for catching only a changeover point from first potential to second potential, or from the second potential to the first potential.

The controlled delay circuit may comprise pairs of the first and second gate chains, the first and second gate chains of each pair receiving different control signals, and a superposing output buffer for superposing outputs of the pairs of the first and second gate chains, to provide an output signal having the same frequency as and a different phase from the input signal. The outputs of the pairs of the first and second gate chains may be connected to one another through switch element each transmitting an output of first level of the corresponding pair when second gate chain of the corresponding pair is active, and the outputs of the pairs may be controlled by a common controller to a second level after a time when the superposed output of the pairs settles to the second level.

The controlled delay circuit may comprise a programmable controlled delay circuit whose delay time is programmed. The programmable controlled delay circuit may be programmed by laser after manufacturing.

According to the present invention, there is also provided a controlled delay circuit comprising a first gate chain having a plurality of first delay units connected in series of a first direction, wherein a first input signal being transferred in the first direction during a first enabled period instructed by a first control signal, and the first input signal being digitalized by a unit time-interval, and output; and a second gate chain having a plurality of second delay units connected in series of a second direction opposite to the first direction, wherein the digitalized first input signal being input to the second gate during a disable period instructed by a second control signal, and the digitalized first input signal being transferred in the second direction during a second enabled period enabled by the second control signal.

Further, according to the present invention, there is provided a timing controller comprising a first circuit having a first delay time; a second circuit having a second delay time; and a time difference expander for expanding a time difference between a changeover point of a first signal and a changeover point of a second signal a times (a being a value greater than one), to provide an output signal having a given time difference with respect to a control signal, the first signal being passed through the first circuit and the second circuit, and the second signal being passed through the first circuit.

The delay time of the second circuit may be substantially equal to the delay time of the first circuit. The first circuit may be an input buffer, and the second circuit is a delay circuit. The first signal may involve the first delay time plus the second delay time with respect to the control signal, the second signal may involve the first delay time with respect to the control signal, and the time difference may be an interval between a changeover point of the first signal and a one-cycle-behind changeover point of the second signal. The first signal may involve the first delay time plus the second delay time with respect to the control signal, the second signal may involve the first delay time with respect to the control signal and a period twice as long as that of the control signal, and the time difference may be an interval between a rise of the first signal and a fall of the second signal.

The time difference expander may double the time difference. The control signal may be a clock signal. The second circuit may comprise a first delay circuit and a second delay circuit, the first delay circuit involving a fourth delay time that is substantially equal to a third delay time of a signal transmitter for transmitting an output of the time difference expander to a circuit of the next stage, and the second delay circuit having a second delay time that is substantially equal to the first delay time. The time difference expander may expand a time difference between a changeover point of the first signal and a changeover point of the second signal N times (N being an integer equal to or greater than two), to provide an output signal that is inphase with the control signal; the first signal may be passed through the first circuit, the first delay circuit, and the second delay circuit; and the second signal may be passed through the first circuit.

The timing controller may provide an output signal before a rise or fall of the control signal and sustains the output signal for a given period around the rise or fall of the control signal.

In addition, according to the present invention, there is also provided a timing controller comprising an internal circuit, and a time difference expander for expanding a time difference between a changeover point of a first signal and a changeover point of a second signal N times (N being an integer equal to or greater than two), to provide a phase-controlled output signal, the first signal being passed through the internal circuit and produced by a cycle of a control signal, and the second signal being passed through a part of the internal circuit and produced by the next cycle of the control signal.

According to the present invention, there is provided an electric circuit comprising a clock buffer circuit, and a delay circuit for shifting a phase of an external first clock signal passing through the clock buffer circuit, wherein the delay circuit includes L (L≧1) groups of delay-time generation circuits for generating an appropriate phase difference suitable to the electric circuit between L groups of first control signals and L groups of second control signals; M (M≧1) groups of first array circuits having K (K≧1) number of types of unit-circuits, each type of unit-circuit being connected in series to the other type of unit-circuit in order to move data of each unit-circuit to the next unit-circuit in a first direction, and the unit-circuits of the first array circuits being enabled to start the propagations by the first control signals and being stopped by the second control signals; N (N≧1) groups of second array circuits having K (K≧1) number of types of unit-circuits, each type of unit-circuit being connected in series to the other type of unit-circuit in order to move data of each unit-circuit to the next unit-circuit in a second direction opposite to the first direction and to output the moved data through an output terminal, and the second array circuits being started when an input signal being supplied; and a data transfer circuit for transferring data from at least a part of the unit-circuit of the first array circuits to the unit-circuits of the second array circuits in order to determine data to be prefetched in the unit-circuit of the second array circuits before starting the propagations passing through the second array circuits.

The first array circuits and the second array circuits may include the same types of unit-circuits. The number of types of the unit-circuits may be one, and each of the unit-circuits may operate as an inverter circuit, when the unit-circuits are enabled by the first and second control signals. The number of types of the unit-circuits may be one, and each of the unit-circuits may operate as a driver circuit, when the unit-circuits are enabled by the first and second control signals. The number of types of the unit-circuits may be two, and one type of the unit-circuits may include a NAND gate circuit, and another type of the unit-circuits may include a NOR gate circuit.

The unit-circuits of the first array circuits may have the same configuration as that of the second array circuits, and a delay time of the first array circuits may be the same as that of the second array circuits during respective propagation period. The unit-circuits of the first array circuits and the unit-circuits of the second array circuits may be constituted by the same sizes of transistors. The unit-circuits of the first array circuits and the unit-circuits of the second array circuits may be constituted by the same layout patterns on a silicon chip.

Each of the first control signals and each of the second control signals may be transmitted through a common node, such that a propagation of the electric circuit is started when the common node is at a first level, and the propagation is stopped when the common node is at a second level. The data transfer circuit may include a data latch circuit for storing the data sent from the first array circuits. The first array circuits may include data reset circuit for initializing data of the unit-circuits of the first array circuits, before starting the propagations through the first array circuits.

The number of the unit-circuits in the first array circuits may be at least three and less than the number of the unit-circuits of the second array circuits. The electric circuit may further comprise an output synthesizing circuit for selectively outputting composite-data sent from one of the second array circuits. Each output of the second array circuits may be connected to a common output bus and a synthesizing circuit to toggle a common output bus in accordance with the outputs of the second array circuits.

The first array circuits, K (K≧1) number of the second array circuits, and a data transfer circuit may constitute one set of a first timing control circuit, and the data transfer circuit may transfer data from a part of the unit-circuit of the first array circuits to the unit-circuits of the second array circuits in the same set of the first timing control circuit in order to determine data to be prefetched in the unit-circuits of the second array circuits before starting the propagations passing through the second array circuits.

The electric circuit may comprise a first set of the first timing control circuit for controlling rising edges of an output signal, and a second set of the first timing control circuit for controlling falling edges of the output signal. The electric circuit may comprise a plurality sets of the first timing control circuits, and an output synthesizing circuit for outputting composite-data sent from one of the second array circuits. Each output of the sets of the first timing control circuits may be connected to a common output bus and a synthesizing circuit to toggle a common output bus in accordance with the outputs of the second array circuits. A set of the first timing control circuit may include K (K≧1) types of the second array circuits, each type thereof may receive a different type of data from the data transfer circuit included in the same set.

The first array circuits and the second array circuits may include the same types of unit-circuits. The number of types of the unit-circuits may be one, and each of the unit-circuits may operate as an inverter circuit, when the unit-circuits are enabled by the first and second control signals. The number of types of the unit-circuits may be one, and each of the unit-circuits may operate as a driver circuit, when the unit-circuits are enabled by the first and second control signals.

The number of types of the unit-circuits may be two, and one type of the unit-circuits may include a NAND gate circuit, and another type of the unit-circuits may include a NOR gate circuit. The unit-circuits of the first array circuits may have the same configuration as that of the second array circuits, and a delay time of the first array circuits may be the same as that of the second array circuits during respective propagation period.

The unit-circuits of the first array circuits and the unit-circuits of the second array circuits may be constituted by the same sizes of transistors. The unit-circuits of the first array circuits and the unit-circuits of the second array circuits may be constituted by the same layout patterns on a silicon chip.

Each of the first control signals and each of the second control signals may be transmitted through a common node, such that a propagation of the electric circuit is started when the common node is at a first level, and the propagation is stopped when the common node is at a second level. The data transfer circuit may include a data latch circuit for storing the data sent from the first array circuits. The first array circuits may include data reset circuit for initializing data of the unit-circuits of the first array circuits, before starting the propagations through the first array circuits.

The number of the unit-circuits in the first array circuits may be at least three and less than the number of the unit-circuits of the second array circuits. The first and second control signals may be generated from a first common source signal which has a first level to enable the propagation passing through the first array circuits and a second level to disable the propagation through the first array circuits.

The first level of the first common source signal may disable the propagation passing through the second array circuits, and the second level of the first common source signal may enable the propagation passing through the second array circuits. The number K of the second array circuits may be equal to a number J of the first array circuits.

The first common source signal and the input signal input into the second array circuits may be generated from a second common source signal. The electric circuit may further comprise a common-output synthesizing circuit.

Further, according to the present invention, there is also provided an electric circuit comprising a first clock buffer circuit receiving an external clock signal; a first clock delivery circuit; and a first clock timing control circuit, being supplied with an output of the first clock buffer circuit and an output of the first clock delivery circuit, for generating a preceding internal clock before the output of the first clock buffer circuit being output.

In addition, according to the present invention, there is provided an electric circuit comprising a first clock buffer circuit receiving an external clock signal; a first clock delivery circuit; a first delay circuit for duplicating delay time characteristics of the first clock buffer circuit; and a first clock timing control circuit, being supplied with an output of the first clock buffer circuit and an output of the first delay circuit, for generating a preceding internal clock before the output of the first clock buffer circuit being output.

The first delay circuit may duplicate delay time characteristics of the first clock buffer circuit and the first clock delivery circuit. The electric circuit may further comprise a first optional circuit, and the first delay circuit may duplicate delay time characteristics of the first clock buffer circuit, the first clock delivery circuit, and the first optional circuit.

The electric circuit may further comprise a first clock frequency control circuit for receiving an output of the clock buffer circuit, and an output of the first clock frequency control circuit may be also supplied to the first clock timing control circuit. The first clock timing control circuit may store capability information into a memory, and the capability information may relate to the input from the output of the first clock buffer circuit and the output of the first delay circuit.

According to the present invention, there is provided an electric circuit comprising a first clock buffer circuit receiving an external clock signal; a first clock delivery circuit; and a first clock timing control circuit, being supplied with an output of the first clock buffer circuit and an output of the first clock delivery circuit, for generating an output coincident with the external clock signal.

Further, according to the present invention, there is provided an electric circuit comprising a first clock buffer circuit receiving an external clock signal; a first clock delivery circuit; a first delay circuit for duplicating delay time characteristics of the first clock buffer circuit; and a first clock timing control circuit, being supplied with an output of the first clock buffer circuit and an output of the first delay circuit, for generating an output coincident with the external clock signal.

The first delay circuit may duplicate delay time characteristics of the first clock buffer circuit and the first clock delivery circuit. The electric circuit may further comprise a first optional circuit, and the first delay circuit may duplicate a delay time characteristics of the first clock buffer circuit, the first clock delivery circuit, and the first optional circuit. The electric circuit may further comprise a first clock frequency control circuit for receiving an output of the clock buffer circuit, an output of the first clock frequency control circuit may be also supplied to the first clock timing control circuit, and the first clock timing control circuit may generate an output coincident with a part of the external clock signal. The first clock timing control circuit may store capability information into a memory, the capability information may relate to the input from the output of the first clock buffer circuit and the output of the first delay circuit, and the first clock timing control circuit may generate an output coincident with a part of the external clock signal.

In addition, according to the present invention, there is provided an electric circuit comprising a delay circuit for changing a phase of an external first clock signal, to form a second clock signal, an optional circuit, and a buffer for providing an output according to an output of the optional circuit in synchronization with the second clock signal, wherein the delay circuit comprises a first gate chain for measuring a time difference between a changeover point of a first control signal and a changeover point of a second control signal; and a second gate chain, receiving a third control signal which is generated in the first circuit and represents the time difference, for providing an appropriate delay time from an input to an output depending on the time difference.

The third control signal may be stored in a memory or a register circuit to fix the third control signal. The data stored in the memory or register circuit may be renewed in accordance with specific clock cycles.

Further, according to the present invention, there is also provided an electric circuit comprising a delay circuit for changing a phase of an external first clock signal, to form a second clock signal, an optional circuit, and a buffer for providing an output according to an output of the optional circuit in synchronization with the second clock signal, wherein the delay circuit comprises a first gate chain having gate circuits connected in series to transmit a signal in a first direction; a second gate chain having gate circuits connected in series to transmit a signal in a second direction opposite to the first direction; and a control circuit for activating and inactivating at least a part of the first gate chain according to a first control signal and at least a part of the second gate chain according to a second control signal, and at least one node in the first gate chain being short-circuited to at least one node in the second gate chain, to invert an input signal to the first gate chain and provide an output signal from the second gate chain.

According to the present invention, there is provided a controlled delay circuit comprising a first converter circuit for converting a first time difference between a changeover point of a first input signal and a changeover point of a second input signal into first gate step information indicating the number of gates corresponding to the first time difference, and a second converter circuit for converting second gate step information indicating the number of gates determined according to the first gate step information into a second time difference, to delay a third input signal supplied to the second converter circuit by the second time difference and provide the delayed signal as an output signal; and the first converter circuit having an array of at least one first unit circuits regularly arranged to transmit the first input signal in a first direction; the second converter circuit having an array of at least one second unit circuits regularly arranged to transmit the third input signal in a second direction opposite to the first direction, the second unit circuit reproducing the delay time of the first unit circuit.

The first gate step information may be a set of data gathered from all or part of the first unit circuits, and the second gate step information may be a set of data supplied to all or part of the second unit circuits. Signals may synchronous to the bits of the first gate step information, respectively, may be supplied as the second gate step information directly to the second converter circuit. Signals that are in phase with the bits of the first gate step information may be supplied as the second gate step information directly to the second converter circuit. Signals that are opposite phase to the bits of the first gate step information may be supplied as the second gate step information directly to the second converter circuit.

The controlled delay circuit may further comprise a gate step information converter circuit disposed between the first converter circuit and the second converter circuit, for converting the first gate step information into the second gate step information. The gate step information converter circuit may directly supply data from the first unit circuits to the second unit circuits, respectively, to adjust the delay time of the second converter circuit to that of the first converter circuit.

The gate step information converter circuit may supply data from every "M"th of the first unit circuits to the second unit circuits, to set the delay time of the second converter circuit to 1/M of that of the first converter circuit. Data from every "M"th of the first unit circuits may be supplied to the second unit circuits through a required number of inverters. The gate step information converter circuit may supply data from one of the first unit circuits to M pieces of the second unit circuits, to set the delay time of the second converter circuit to M times as long as that of the first converter circuit.

The controlled delay circuit may further comprise a reset portion where input and output signals to and from the second unit circuits may be reset just before the third input signal is supplied to the second converter circuit. The controlled delay circuit may further comprise latch circuits provided for the first unit circuits, respectively, for storing data from the first unit circuits, respectively. The controlled delay circuit may further comprise latch circuits provided for the second unit circuits, respectively, for storing data to the second unit circuits, respectively.

The unit circuits may have inverting gate circuits at least having an inversion function, the delay time of each gate of the inverting gate circuits being used as a unit time for conversion. A period between a changeover point of the first input signal and a changeover point where the second input signal changes from a first level to a second level may be held as the first gate step information corresponding to the first time difference. Even ones of the unit circuits may be NAND gate circuits and odd ones thereof are NOR gate circuits. The first and second unit circuits may bias input thresholds of the first and second converter circuits, to hasten the delay time of those of the unit circuits that transmit signals dependent on the first input signal.

Even ones of the unit circuits may be NOR gate circuits and odd ones thereof are NAND gate circuits. The first and second unit circuits may bias input thresholds of the first and second converter circuits, to hasten the delay time of those of the unit circuits that transmit signals dependent on the first input signal. The unit circuits may have reset-signal input terminals to set outputs opposite to expected values just before the signals dependent on the first input signal are transmitted.

The unit circuits may have data fetch circuits for fetching data from the unit circuits at a changeover point of the second input signal. The unit circuits may have delay time adjusting capacitors each having capacitance corresponding to an input capacitance of the data fetch circuit, for equalizing the delay time of each of the unit circuits to that of one unit circuit of the first converter circuit. The second unit circuits may have reset-signal input terminals to set outputs opposite to expected values just before signals dependent on the third input signal are transmitted.

The controlled delay circuit may comprise two first converter circuits to separately set a delay time of a rise of the first input signal and a delay time of a fall of the first input signal in the first converter circuit. Even and odd unit circuits in the first converter circuits may be alternately NAND and NOR unit circuits, and even unit circuits for producing a delay time of a rise of a signal and odd unit circuits for producing a delay time of a fall of the signal in the second converter circuit may be alternately NAND and NOR unit circuits with the arrangement of the NAND and NOR unit circuits for the rise delay time being opposite to that of the NAND and NOR unit circuits for the fall delay time.

The controlled delay circuit may comprise a plurality of second converter circuits to separately provide pieces of delay time for a rise and fall of the second input signal, to change the oscillation frequency of the third input signal. The controlled delay circuit may comprise a plurality of second converter circuits to separately provide pieces of delay time for a rise and fall of the second input signal, to increase the oscillation frequency of the third input signal by a multiple.

A first converter circuit may convert a time difference between a rise of the first input signal and a changeover point of the second input signal into gate step information indicating the number of gates, another first converter circuit may convert a time difference between a fall of the first input signal and a changeover point of the second input signal into gate step information indicating the number of gates, and a delay time of a rise of the third input signal supplied to the second converter circuit and a delay time of a fall of the third input signal may be separately determined according to the two pieces of gate step information. A first converter circuit may convert a time difference between a rise of the first input signal and a changeover point of the second input signal into gate step information indicating the number of gates, and another first converter circuit may convert a time difference between a fall of the first input signal and a changeover point of the second input signal into gate step information indicating the number of gates, to separately provide pieces of delay time for a rise and fall of the second input signal with respect to the second converter circuit according to the two pieces of gate step information and change the oscillation frequency of the third input signal.

The first input signal may be supplied to the first one of the first unit circuits. The first input signal may be supplied as a reset signal to the first unit circuits, to put a delay forming gate in each of the first unit circuits in a reset state or an inverted state. An input to the first one of the first unit circuits may be set to a fixed level, and when the first input signal specifies the inverted state, the first converter circuit may start signal transmission. The controlled delay circuit may comprise a plurality of second converter circuits, the first one of the unit circuits in at least one of the second converter circuits may include a NAND delay circuit, the first one of the unit circuits in at least one of the second converter circuits including a NOR delay circuit, and an input level to the first one of the unit circuits may be fixed to form an inverter delay circuit. Only the first one of the second unit circuits may include an inverter delay circuit.

The first one of the second unit circuits may clamp an input to invert the second gate step information if the time difference is longer than the delay time of the first converter circuit. The first one of the second unit circuits may clamp an input so that the delay circuit in the first one of the second unit circuits serves as an inverter.

The first and second input signals may be periodically supplied to the first converter circuit at intervals of M changeover points, to reproduce the second gate step information. The reproduced second gate step information may be reset when the second converter circuit does not transmit the third input signal. A change between new and old values of the second gate step information may be set below a given value, to gradually change the delay time. The controlled delay circuit may comprise two second converter circuits to separately form delays for a rise and fall of an input signal, an output in each of the second converter circuits being connected to a synthesized output node through a bus, and an output section in each of the second converter circuits being provided with a circuit for providing given data within a predetermined period after an output is changed from one to another, to sufficiently increase output impedance in the remaining period.

The controlled delay circuit may comprise a plurality of pairs of second converter circuits, one of the second converter circuits of each pair delaying the timing of a rise of an output, the other of the second converter circuits of each pair delaying the timing of a fall of the output, the output changeover timing of opposite output being determined by another output changeover timing means, an output in each of the second converter circuits and the output of the output changeover timing means being connected to a synthesis output node through buses. The controlled delay circuit may comprise 2M second converter circuits, to provide an output signal whose frequency is M times as large as that of the third input signal. Each of the second converter circuits may be provided with a delay time fine adjustment circuit, so that each of the second converter circuits may provide an output signal whose timing frequency is synchronous to the third input signal.

The second converter circuit may have a delay circuit for electrically controlling the delay time of the second converter circuit. The controlled delay circuit may comprise an odd number of second converter circuits, the inputs and outputs of the second converter circuits are connected to one another to form a ring oscillator to provide a signal whose period is L/M times (L and M being integers) the time difference set by the first converter circuit.

The controlled delay circuit may comprise an even number of second converter circuits and an odd number of inverter gates, the inputs and outputs of the second converter circuits may be connected to one another through inverter gates, to form a ring oscillator to provide a signal whose period is L/M times (L and M being integers) the time difference set by the first converter circuit. The second converter circuits may have delay circuits for electrically controlling a delay time, the delay circuits may be controlled to synchronize the changeover timing of the output of any one of the second converter circuits with the changeover timing of an external clock signal, to provide a signal whose period is L/M times (L and M being integers) the time difference set by the first converter circuit. The second converter circuits may comprise delay circuits having a fixed delay time that is determined in consideration of manufacturing fluctuations, the delay circuits may be controlled to synchronize the changeover timing of the output of any one of the second converter circuits with the changeover timing of an external clock signal, to provide an internal clock signal that changes more quickly than the external clock signal by the fixed time.

According to the present invention, there is provided a controlled delay circuit for adding a given delay to an input signal and providing a delayed output signal, comprising a gate array having cascaded gate units to provide the output signal; and a gate specifying circuit for specifying, according to stored data, one of the gate units to start delaying the input signal.

Each of the gate units may receive the output of the preceding gate unit, the input signal, and the output of a corresponding unit circuit of the gate specifying circuit. The controlled delay circuit may further comprise an input switching circuit for supplying the input signal to one of the gate units according to data stored in the gate specifying circuit. Each of the gate units may receive the output of the preceding gate unit and the output of a corresponding switching unit of the switching circuit. Each of the switching units may be switched according to the output of a corresponding unit circuit of the gate specifying circuit.

The gate specifying circuit may be a register circuit that receives a write signal and an address signal to specify one of the gate units that starts to delay the input signal. The register circuit may be reset in response to a reset signal.

The gate specifying circuit may be a shift register circuit that receives a shift signal to specify one of the gate units that starts to delay the input signal. The shift register circuit may be reset in response to a reset signal.

The controlled delay circuit may further comprise a comparator for comparing the output signal of the gate array with a reference signal; and a controller for feedback controlling, in response to the output of the comparator, signals supplied to the gate specifying circuit to specify one of the gate units that starts to delay the input signal.

Further, according to the present invention, there is also provided a control signal generator for generating a control signal whose period is determined according to the period of an input signal, comprising a first gate array having cascaded gate units to receive the input signal; a second gate array having cascaded gate units to receive the output of the first gate array; a comparator for comparing the output of the second gate array with the input signal; and a gate specifying circuit for specifying, according to the output of the comparator, one of the first gate units that starts to delay the input signal as well as one of the second gate units that starts to delay the output of the first gate array.

The control signal generator may provide an output signal whose frequency is twice as large as that of the input signal. The control signal generator may further comprise an output logic circuit for providing a result of logical operation of the output of the first gate array and the output of the second gate array. The control signal generator may further comprise an output logic circuit for providing a result of logical operation of the input signal and the output of the first gate array.

BRIEF DESCRIPTION OF THE DRAWINGS

The present invention will be more clearly understood from the description of the preferred embodiments as set forth below with reference to the accompanying drawings, wherein:

FIG. 18 is a diagram for explaining a timing controller according to a fourteenth embodiment of the present invention;

FIG. 19 is a diagram for explaining a circuit employing a timing controller according to the present invention;

FIGS. 20A, 20B, and 20C are diagrams showing a clock generator employing a timing controller according to the present invention;

FIG. 22 is a block diagram showing an example of a controlled delay circuit according to a prior art;

FIGS. 34A and 34B are circuit diagrams showing still another unit circuits of the controlled delay circuit according to the present invention;

FIGS. 35A and 35B are circuit diagrams showing still another unit circuits of the controlled delay circuit according to the present invention;

FIGS. 50A and 50B are circuit diagrams showing an eighth embodiment of a controlled delay circuit according to the present invention;

DESCRIPTION OF THE PREFERRED EMBODIMENTS

For a better understanding of the preferred embodiments of the present invention, the problems of the prior arts will be explained.

Figure 1:
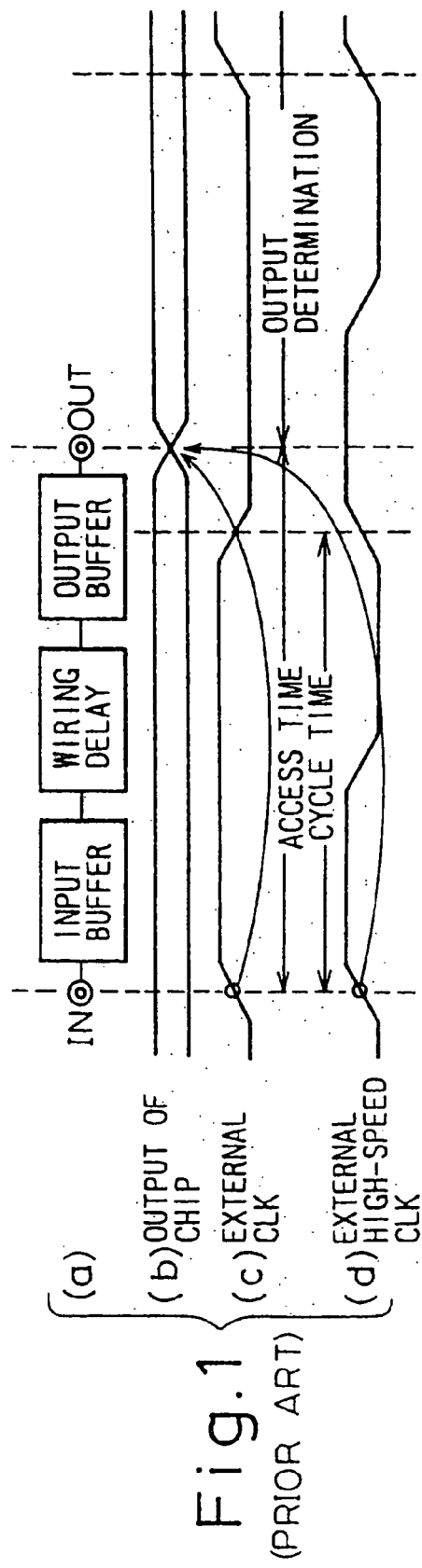
FIG. 1 is a diagram for explaining a timing controller according to a prior art.

FIG. 1 explains a timing controller according to the prior art. An access time is determined by a delay time in an input buffer, a delay time in wiring, and a delay time in an output buffer as indicated by (a) in FIG. 1. In the case of a synchronous memory, an external clock signal CLK rises at an input terminal IN as indicated by (c) and (d), and an output terminal OUT provides data after the access time as indicated by (b).

The clock signal (c) has a conventional speed, and the clock signal (d) has a high speed. When the high-speed clock signal (d) is employed, an output is determined only after a cycle of the clock signal.

Figure 2:
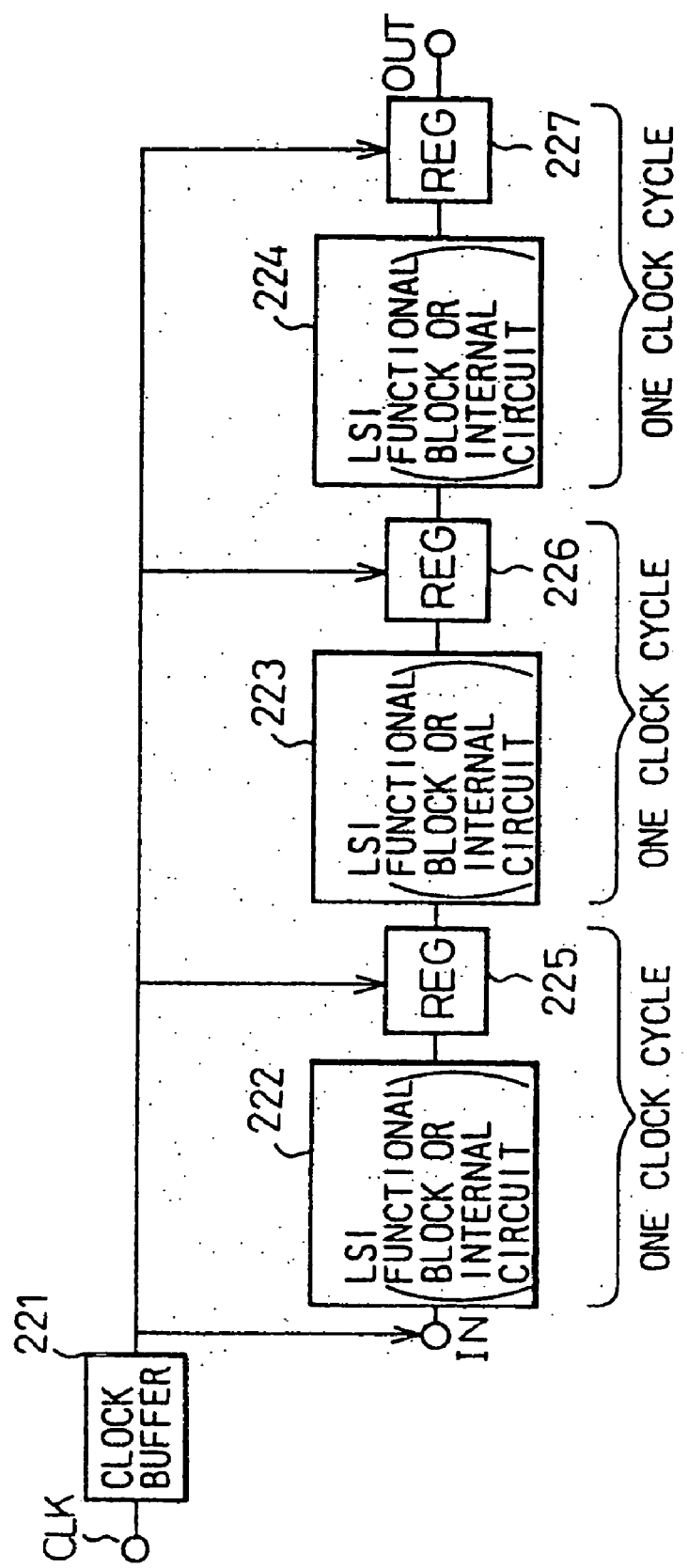
FIG. 2 is a block diagram schematically showing an example of a circuit employing a timing controller.

FIG. 2 is a block diagram showing a circuit employing a timing controller according to the prior art. This circuit includes a clock buffer 221, LSIs 222, 223, and 224 serving as functional blocks or internal circuits, and registers 225, 226, and 227.

The registers 225 to 227 are connected to output terminals of the LSIs 222 to 224, respectively. The clock buffer 221 supplies a clock signal CLK to the registers 225 to 227. Each of the LSIs 222 to 224 provides processed data in a separate cycle of the clock signal. Namely, the clock signal is supplied to an input terminal IN of the LSI 222, and an output terminal OUT provides processed data after three cycles of the clock signal. The LSIs 222 to 224 may be fabricated on a single chip. The timing controller may be arranged in the clock buffer 221, or in each of the LSIs 222, 223, and 224.

Timing controllers are adopted for various electronic circuits having LSIs, or are installed in chips accommodating functional blocks or internal circuits.

Figure 3:
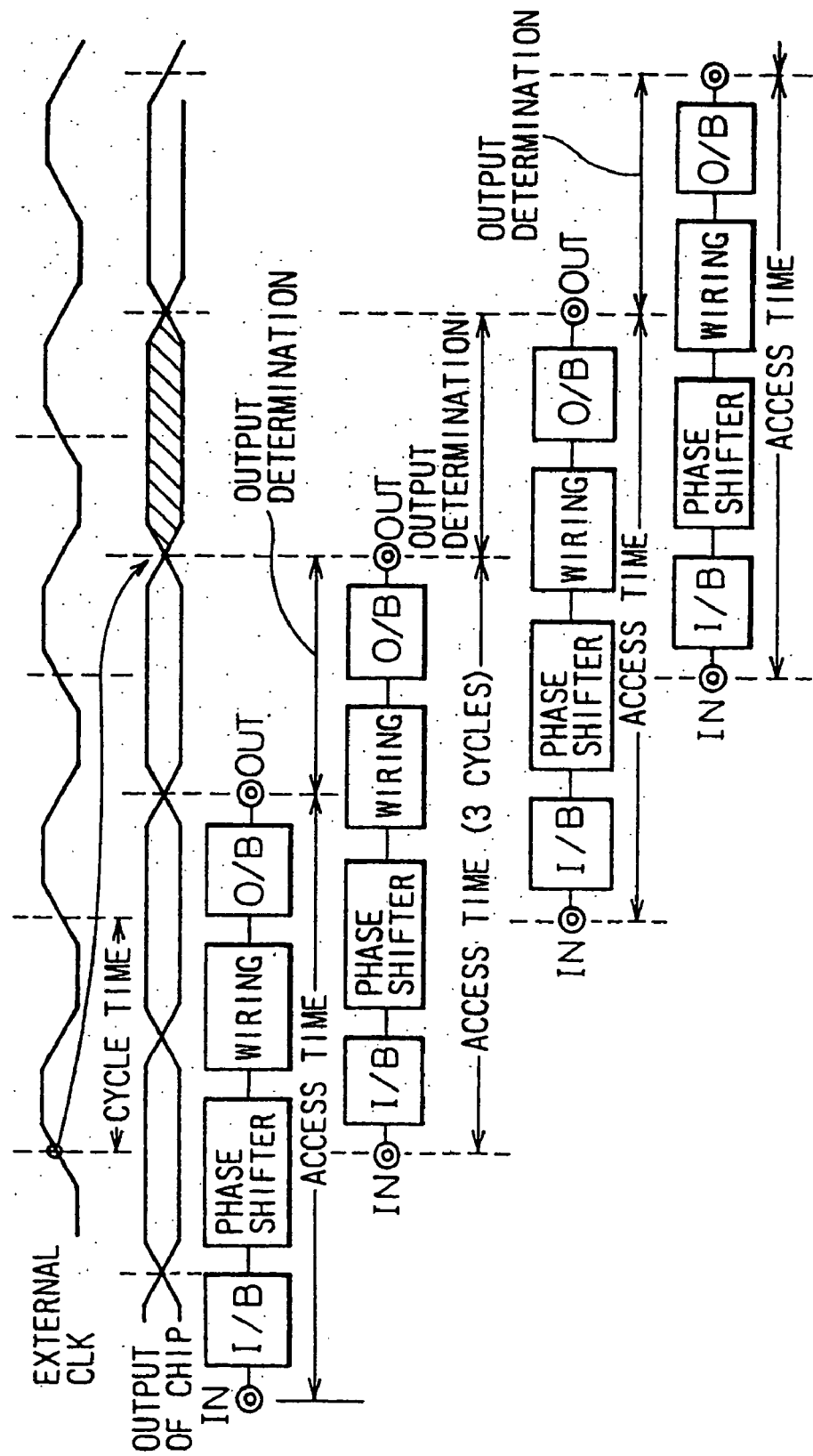
FIG. 3 is a diagram for explaining a timing controller according to another prior art.

FIG. 3 explains a timing controller according to another prior art for pipeline processes.

Each pipeline process is accessed three cycles before, to absorb a delay time in an input buffer, a delay time in wiring, and a delay time in an output buffer. Namely, an access time is synchronized with three clock cycles, to insert a sufficient margin in an internal transmission time.

When a pipeline process is accessed three cycles before a clock signal CLK, the output of the pipeline process will not be determined if the frequency of the clock signal CLK is changed. Usually, an output signal must be sustained for a given interval around a rise of an external clock signal. If the frequency of the clock signal CLK is changed, the timing of determining an output will not be synchronized with the clock signal, to cause a malfunction.

It is necessary, therefore, to employ a delay circuit or a timing controller to vary the delay time depending on the period of a clock signal, or a circuit for shifting the phase of a clock signal by {(clock cycle time).times.2−(access time)−½ output sustain time}. A delay circuit consisting of a simple gate chain (gate array) is incapable of producing such a delay time. A PLL (phase-locked loop) circuit may produce this delay time. The PLL, however, is an analog circuit vulnerable to noise in a power source. In addition, the PLL is a large circuit which consumes a lot of power.

Figure 4:
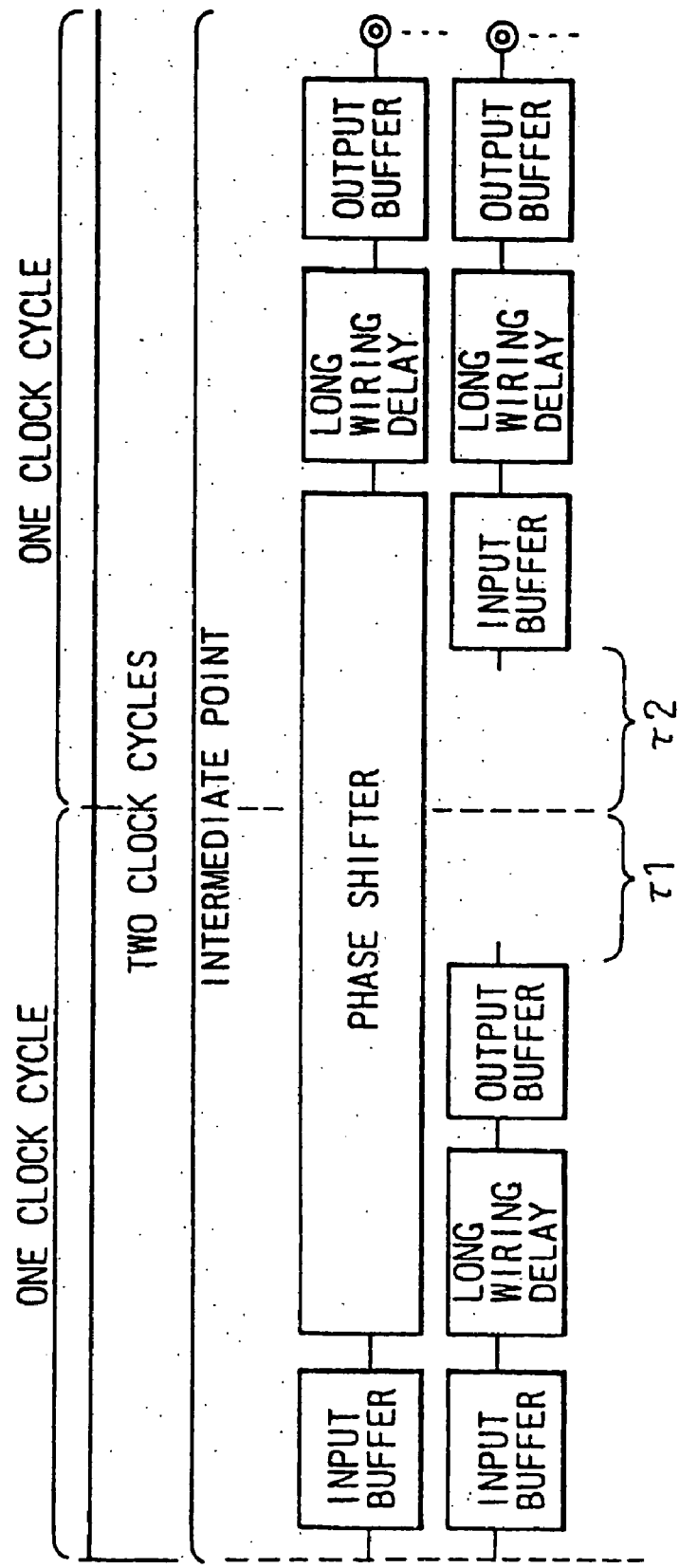
FIG. 4 is a diagram showing a principle of a timing controller according to the present invention.

FIG. 4 shows a principle of a timing controller according to the present invention.

As explained above, a simple gate chain is incapable of setting a delay time of {(clock cycle time).times.2−(access time)−½ output sustain time}.

The present invention reproduces a time 2 from a time difference τ1 between changeover points of first and second signals as shown in FIG. 4. For the sake of simplicity of explanation, an output is provided at a rise of a clock signal in the following explanation.

To secure an output determination time, an output in FIG. 4 must be changed earlier than the second clock cycle. If a delay time in a second input buffer is omitted, a changeover point of the output will be earlier by the delay time. Alternatively, a delay time in a first output buffer may be increased to achieve the same effect.

In this way, the present invention provides a circuit for reproducing a time difference between changeover points of two signals. This circuit realizes a timing controller without a PLL that is vulnerable to noise and consumes a lot of power. The timing controller according to the present invention is capable of properly controlling the timing of a control signal according to the period of the control signal.

The timing controller of the present invention is also capable of providing an output according to a clock signal of optional frequency even if the frequency is changed thereafter. The present invention, therefore, is effective to increase an operation frequency.

Next, preferred embodiments of the present invention will be explained with reference to the drawings.

Figure 5:
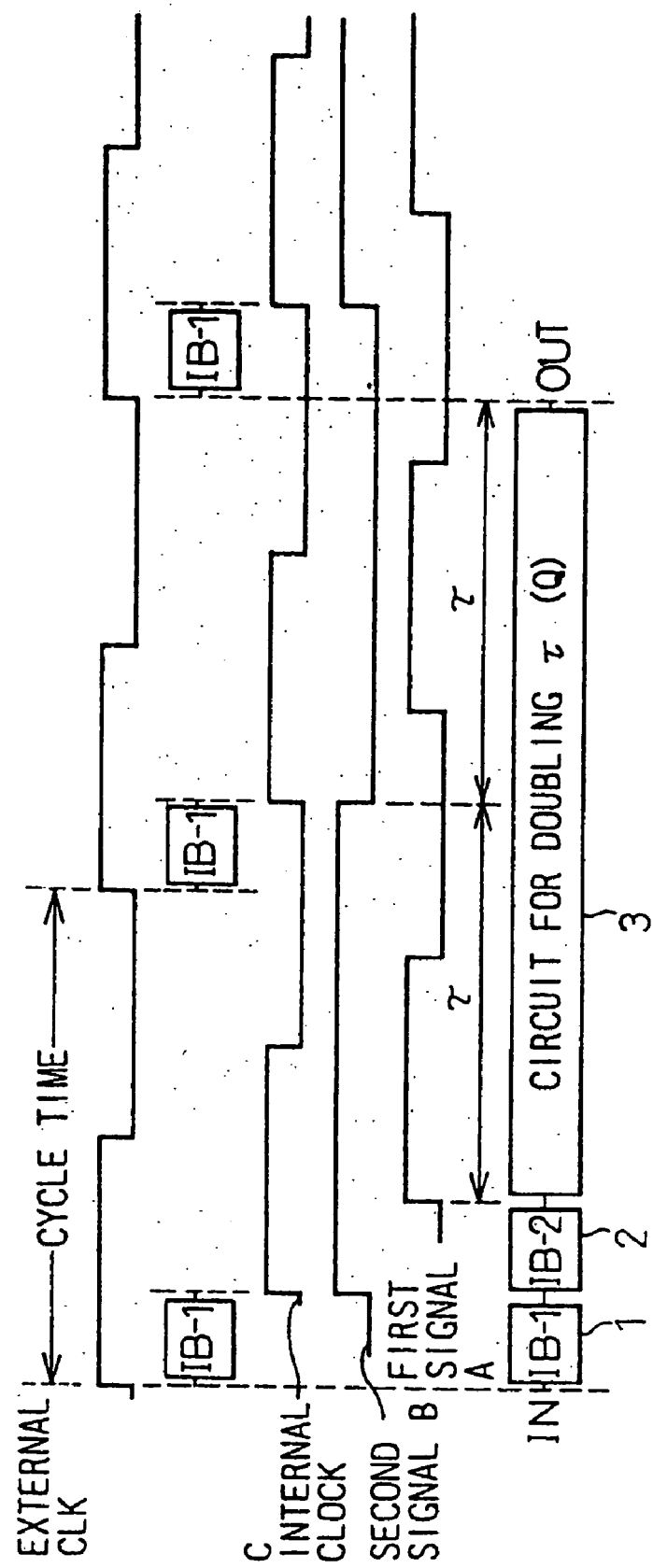
FIG. 5 is a diagram for explaining a timing controller according to a first embodiment of the present invention.

FIG. 5 explains a timing controller according to the first embodiment of the present invention. This embodiment includes an input buffer 1 involving a delay time IB-1, a delay circuit 2 involving a delay time IB-2, and a time difference expander 3 involving a delay time Q. The expander 3 doubles the time difference T between changeover points of two signals.

The input buffer 1 receives a control signal (clock signal) CLK. The delay time of the input buffer 1 is substantially equal to the delay time of the delay circuit 2. The input buffer 1 and delay circuit 2 collectively produce a first signal A having a delay time of IB-1 plus IB-2 according to the control signal CLK. The input buffer 1 produces an internal clock signal C having a delay time IB-1 according to the control signal CLK. A second signal B is produced by doubling the period of the internal clock signal C.

The delay time Q of the expander 3 is two times a time difference τ between a rise of the first signal A and a fall of the second signal B, or between a rise of the first signal A and a one-cycle-behind rise of the internal clock signal C. The expander 3 provides a phase-controlled output signal OUT. The output signal OUT has the same phase as the control signal CLK supplied to an input terminal IN.

The expander 3 may multiply the time difference τ not only by 2 but also by N (N being an integer equal to or greater than 2). Namely, the expander 3 produces a delay time that is N times as long as the time difference τ and provides an output signal having the same phase as the external control signal CLK.

The present invention digitally sets the delay time of a circuit according to a change in a cycle time of a control signal (clock signal). The delay circuit or timing controller according to the present invention accurately digitally multiplies a time difference between two signals, which change in response to a clock signal, by N (N being an integer equal to or larger than 2). For the sake of simplicity of explanation, some of the embodiments of the present invention provide an output signal at a rise of a clock signal. In practice, however, the output signal is provided with a required delay.

Figure 6:
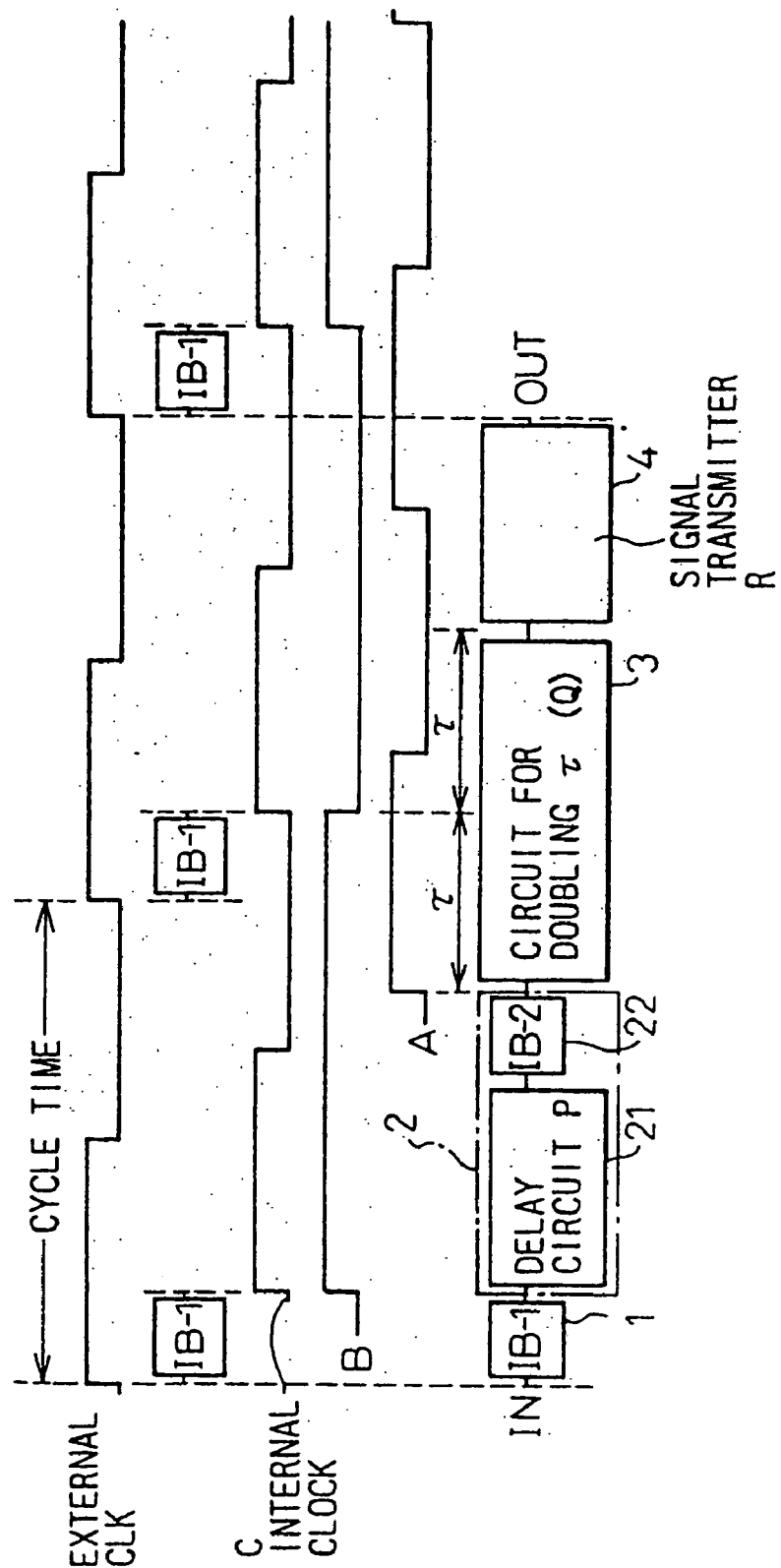
FIG. 6 is a diagram for explaining a timing controller according to a second embodiment of the present invention.

FIG. 6 explains a timing controller according to the second embodiment of the present invention. The second embodiment includes a second circuit 2 consisting of two delay circuits 21 and 22. The first delay circuit 21 includes long wiring and involves a delay time P, which is substantially equal to a delay time R of a signal transmitter 4. The delay time R is an interval in which a phase-controlled clock signal is transferred from a time difference expander 3 to a circuit of the next stage. The second delay circuit 22 involves a delay time IB-2, which is substantially equal to a delay time IB-1 of an input buffer 1. The second delay circuit 22 may be dummy wiring like the signal transmitter 4.

An external control signal (clock signal) CLK is passed through the input buffer 1, first delay circuit 21, and second delay circuit 22, to produce a first signal A. The control signal CLK is passed through the input buffer 1, to produce a second signal B (C). The expander 3 doubles, or multiplies by N, the time difference τ between changeover points of the two signals A and B, to provide an output signal that is inphase with the control signal CLK.

Figure 7:
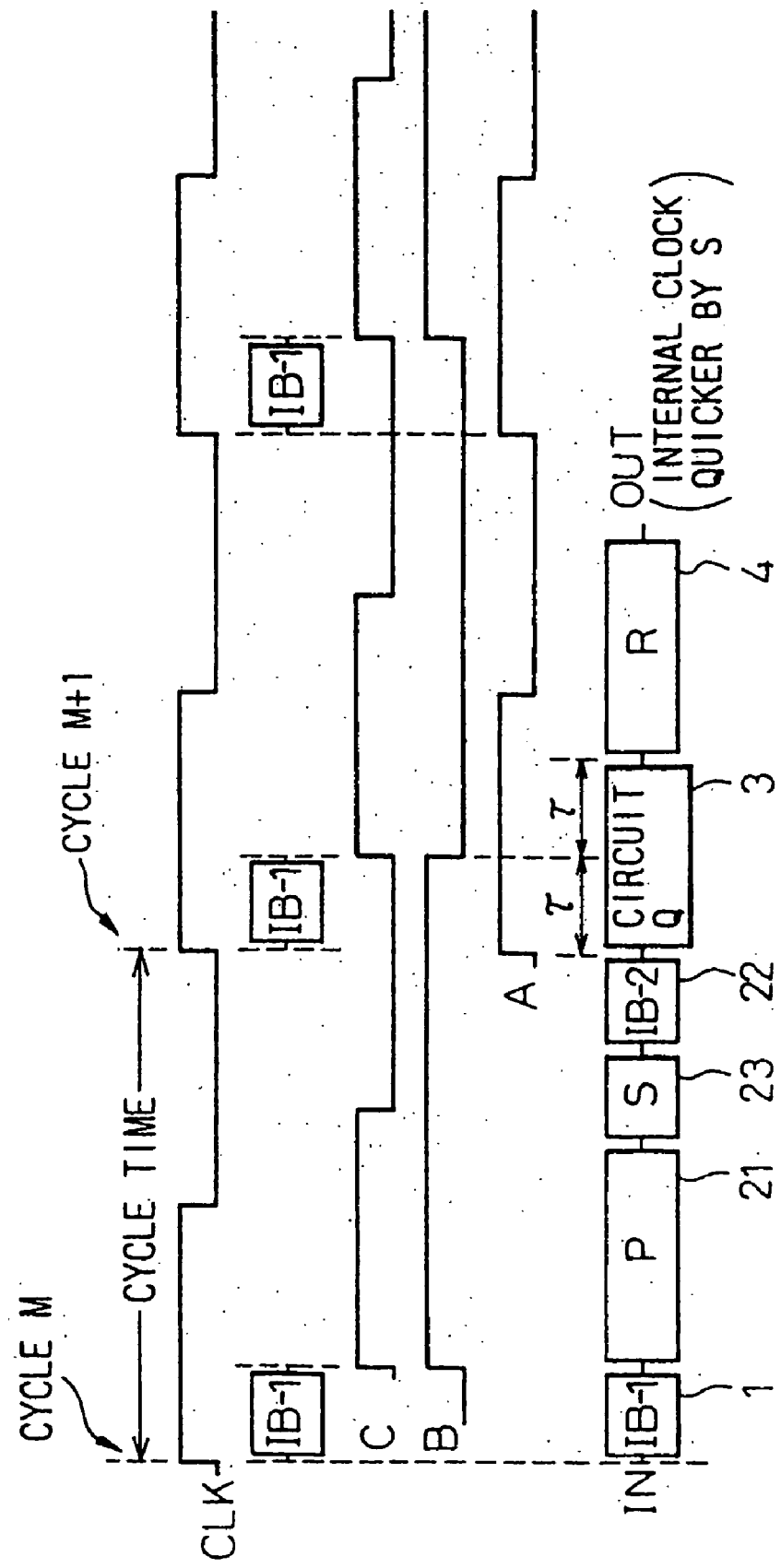
FIG. 7 is a diagram for explaining a timing controller according to a third embodiment of the present invention.

FIG. 7 explains a timing controller according to the third embodiment of the present invention. The third embodiment includes an internal circuit including an input buffer 1, a long wiring delay circuit 21, an output buffer 23, and a delay circuit 22.

A cycle M of an external control signal (clock signal) CLK is passed through the input buffer 1, delay circuit 21, output buffer 23, and delay circuit 22, to produce a first signal A. A cycle M+1 of the control signal CLK is passed through the input buffer 1, to produce a second signal B. A time difference expander 3 doubles, or multiplies by N, the time difference τ between changeover points of the two signals A and B as in the first embodiment.

A signal transmitter 4 adds a delay time R to the output of the expander 3. The delay time R is substantially equal to a delay time P of the delay circuit 21. The transmitter 4 provides an output signal OUT that changes earlier than the control signal CLK by the delay time of the output buffer 23.

Figure 8:
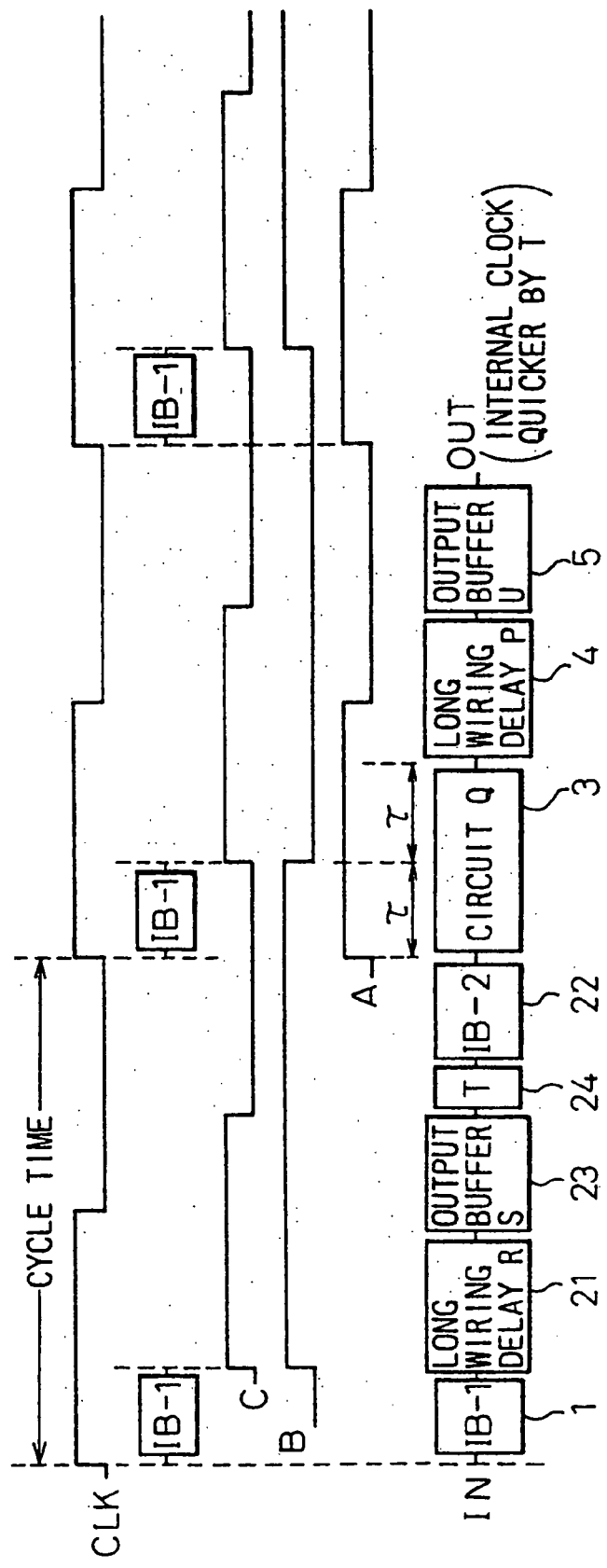
FIG. 8 is a diagram for explaining a timing controller according to a fourth embodiment of the present invention.

FIG. 8 explains a timing controller according to the fourth embodiment of the present invention. This embodiment includes an internal circuit including an input buffer 1, a long wiring delay circuit 21, an output buffer 23, and delay circuits 24 and 22. A signal from a time difference expander 3 is passed through a long wiring delay circuit (signal transmitter) 4 and an output buffer 5. The first delay circuit 21 has a delay time P, which is substantially equal to a delay time R of the transmitter 4. The output buffer 23 has a delay time S, which is substantially equal to a delay time U of the output buffer 5.

A cycle M of a control signal (clock signal) CLK is passed through the input buffer 1, delay circuit 21, output buffer 23, and delay circuits 24 and 22, to produce a first signal A. A cycle M+1 of the control signal CLK is passed through the input buffer 1, to produce a second signal B. The difference between the first and second signals A and B is supplied to the expander 3. The output of the expander 3 is passed through a second internal circuit including the delay circuit 4 and output buffer 5, to provide a phase-controlled output signal OUT.

The output signal OUT of this embodiment changes earlier than the control signal CLK by the delay time T of the delay circuit 24.

Figure 9:
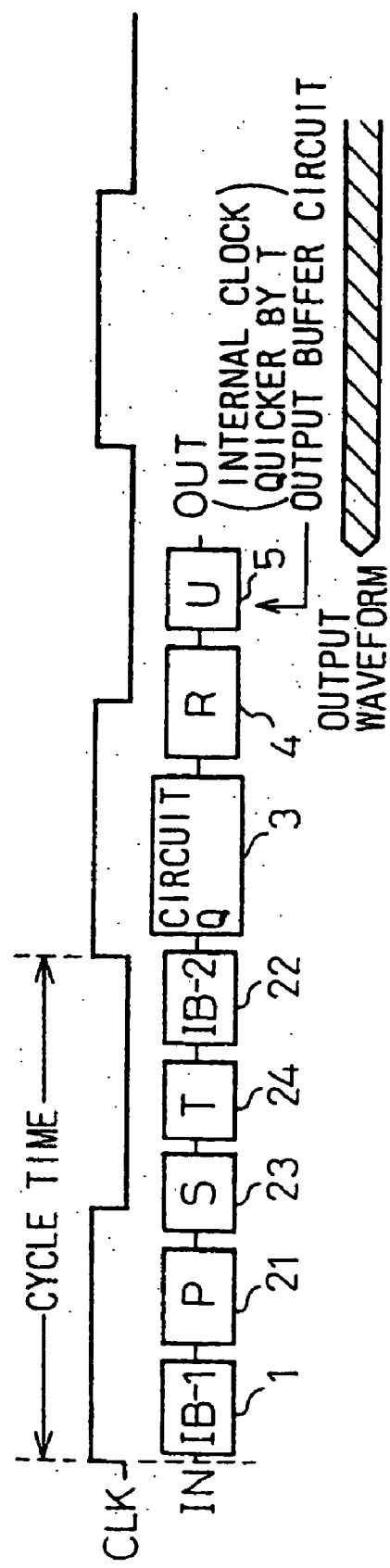
FIG. 9 is a diagram for explaining a timing controller according to a fifth embodiment of the present invention.

FIG. 9 explains a timing controller according to the fifth embodiment of the present invention. This embodiment is based on the fourth embodiment.

The fifth embodiment employs a delay circuit 24 having a delay time T to determine the timing of an output signal OUT. Namely, the output signal OUT changes earlier than a control signal (clock signal) CLK by the delay time T of the delay circuit 24. More precisely, the output signal OUT changes before a rise or a fall of the control signal CLK and is sustained for a given interval around the rise or fall of the control signal CLK, thereby securing a correct operation.

Figure 10:
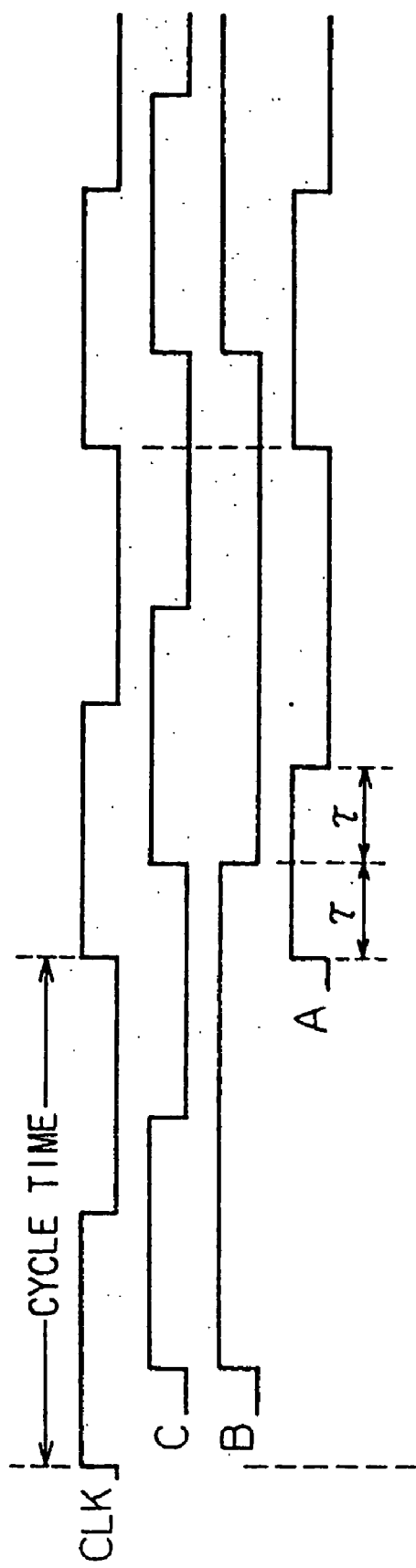
FIG. 10 is a diagram for explaining a timing controller according to a sixth embodiment of the present invention.

FIG. 10 shows signals generated in a timing controller according to the sixth embodiment of the present invention.

A time difference expander 3 doubles, or multiplies by N, the time difference τ between changeover points of two signals A and B. A control signal (clock signal) CLK is passed through an input buffer 1 and a delay circuit 2, to generate the first signal A involving a delay time of IB-1 plus IB-2. The control signal CLK is passed through the input buffer 1, to generate the second signal B involving a delay time IB-1. The time difference τ between changeover points of the first and second signals A and B is doubled by the expander 3. The period of the second signal B is twice as long as the control signal CLK. An internal clock signal C may be used instead of the signal B, to define the time difference τ.

The time difference τ is an interval between a rise of the first signal A and a fall of the signal B, or between a rise of the first signal A and a one-cycle-behind rise of the internal clock C. The expander 3 doubles the time difference τ, to produce a delay time Q. The expander 3 provides a phase-controlled output signal OUT, which is in phase with the control signal CLK supplied to an input terminal IN.

FIGS. 11 to 19 explain timing controllers according to the seventh to 15th embodiments of the present invention, respectively. In particular, these figures show the details of time difference expanders (delay circuits) 3 for doubling, or multiplying by N, a time difference τ.

Figure 11:
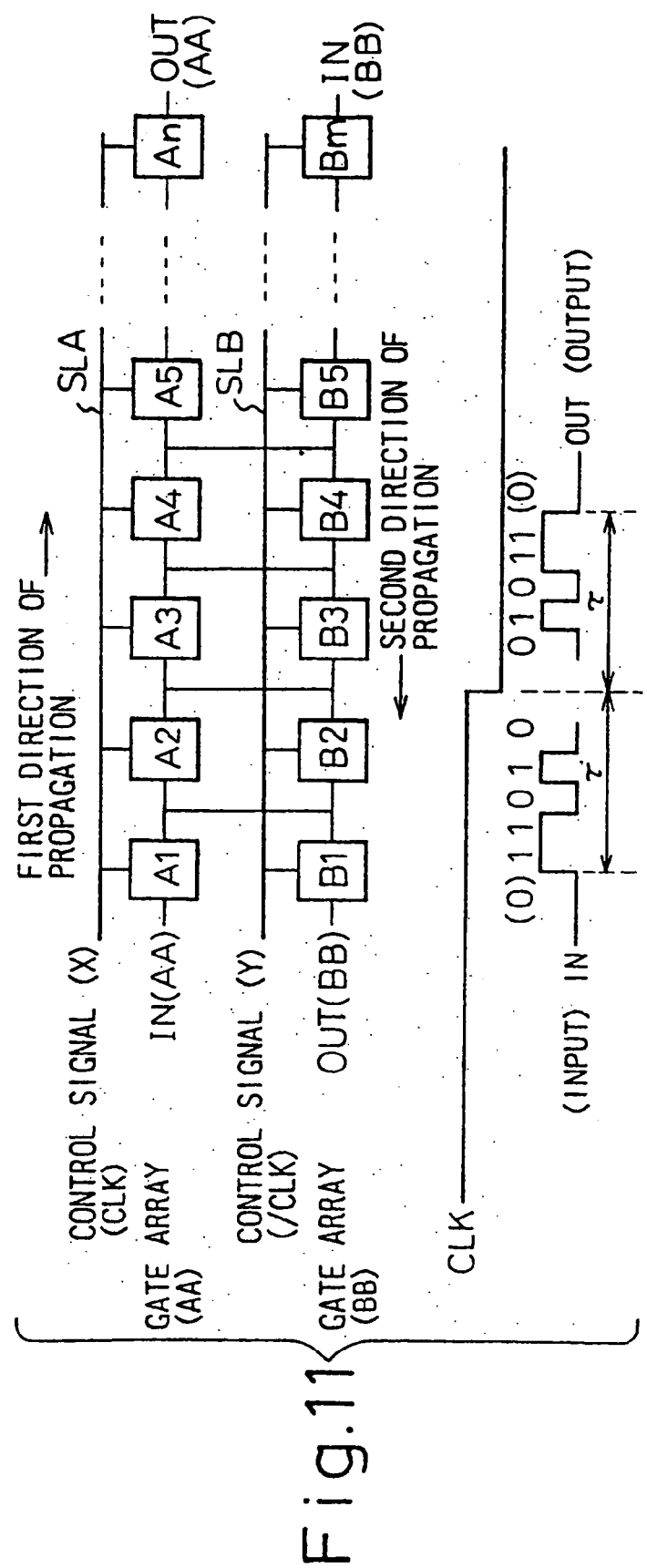
FIG. 11 is a diagram for explaining a timing controller according to a seventh embodiment of the present invention.

FIG. 11 shows a delay circuit (time difference expander) according to the seventh embodiment of the present invention. The delay circuit includes a first gate chain AA containing gate circuits A1 to An, a second gate chain BB containing gate circuits B1 to Bm, a first control signal X, and a second control signal Y.

The gate circuits A1 to An of the first gate chain AA are connected in series to transmit a signal in a first direction from the gate circuit A1 toward the gate circuit An. The first control signal X activates at least a part of the first gate chain AA. The gate circuits B1 to Bm of the second gate chain BB are connected in series to transmit a signal in a second direction, which is opposite to the first direction, from the gate circuit Bm toward the gate circuit B1. The second control signal Y activates at least a part of the second gate chain BB.

The first control signal X is supplied to the gate circuits A1 to An of the first gate chain AA through a signal line SLA. The second control signal Y is supplied to the gate circuits B1 to Bm of the second gate chain BB through a signal line SLB.

The outputs of the gate circuits A1 to An-1 of the first gate chain AA are connected to input terminals of the gate circuits B1 to Bm-1 of the second gate chain BB, respectively. The input and output terminals of the gate circuits of the first and second gate chains AA and BB are not required to be entirely short-circuited. In the embodiment of FIG. 11, the number of the gate circuits A1 to An of the first gate chain AA is equal to the number of the gate circuits B1 to Bm of the second gate chain BB. Namely, n=m. The number of the gate circuits of each gate chain is at least three.

The first and second control signals X and Y are produced from a common signal (base signal: clock signal) CLK. The first control signal X corresponds to the common signal CLK, and the second control signal Y corresponds to an inversion of the common signal CLK. When the common signal CLK is high, the first gate chain AA is activated and the second gate chain BB is inactivated. When the common signal CLK is low, the first gate chain AA is inactivated and the second gate chain BB is activated.

When the common signal CLK is high to activate the first gate chain AA and inactivate the second gate chain BB during an interval τ, the first gate chain AA provides data of "11010", for example. When the common signal CLK becomes low to activate the second gate chain BB and inactivate the first gate chain AA, the second gate chain BB provides inverted data of "01011" in an interval τ.

Figure 12:
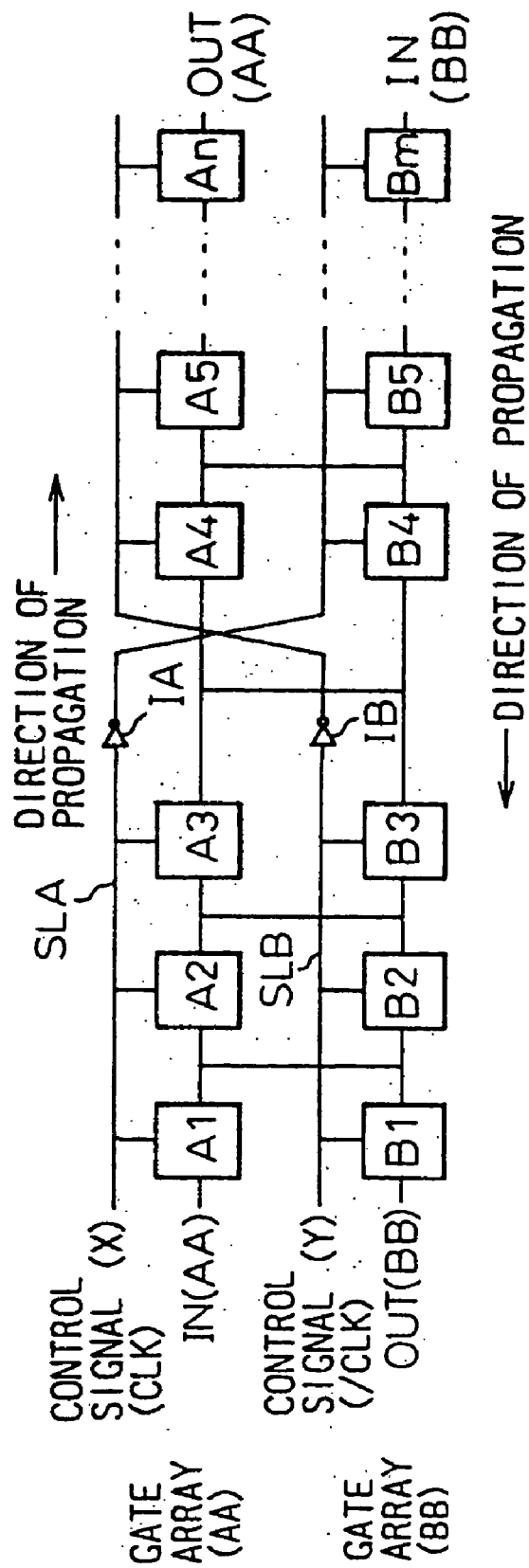
FIG. 12 is a diagram for explaining a timing controller according to an eighth embodiment of the present invention.

FIG. 12 shows a delay circuit according to the eighth embodiment of the present invention. Inverters (buffers) IA and IB are provided for every given number of gate circuits. The inverters are arranged in signal lines SLA and SLB and serve as buffers. The signal lines SLA and SLB are alternately connected to gate chains AA and BB through the inverters IA and IB. The inverters IA and IB may be replaced with buffers that provide positive logic signals. In this case, it is not necessary to alternately connect the signal lines SLA and SLB to the gate chains AA and BB.

Figure 13:
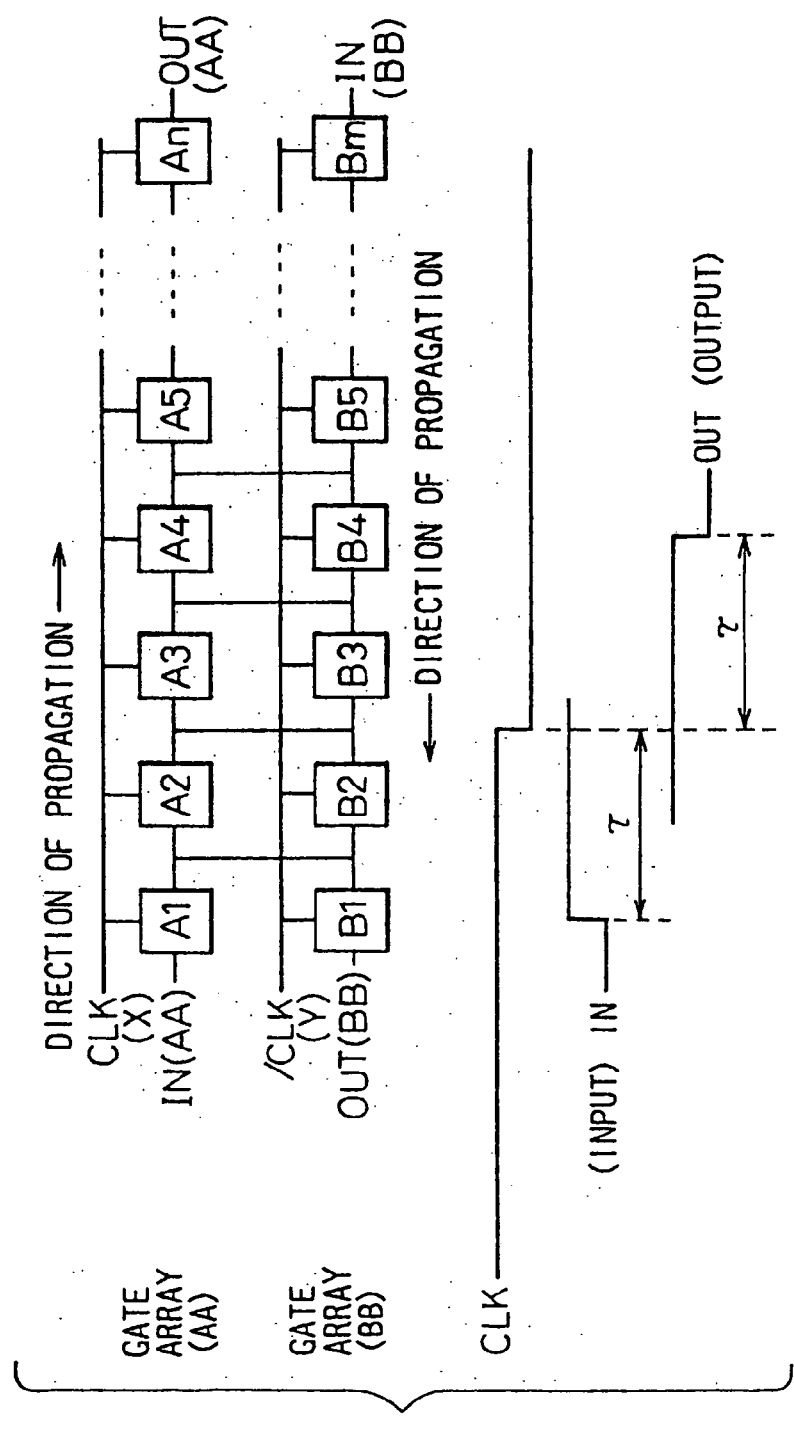
FIG. 13 is a diagram for explaining a timing controller according to a ninth embodiment of the present invention.

FIG. 13 shows a delay circuit according to the ninth embodiment of the present invention. An output end OUT (AA) of a first gate chain AA is set to a high impedance state, and an input end IN(BB) of a second gate chain BB is fixed to low potential (first potential). A control signal (clock signal) CLK of high level activates the first gate chain AA. At this time, the first gate chain AA provides a signal of high potential (second potential). When the second gate chain BB is activated, the high potential signal is passed through the second gate chain BB in a reverse direction. Then, an output end OUT(BB) of the second gate chain BB provides data of low level. Consequently, a time difference τ between changeover points of an input signal to the first gate chain AA and a first control signal X (CLK) is reproduced according to a time difference τ between changeover points of a second control signal Y (/CLK) and the output signal of the second gate chain BB. This delay circuit of the ninth embodiment corresponds to the time difference expander 3 of any one of the embodiments of FIGS. 5 to 9 for doubling a time difference T between changeover points of two signals.

Figure 14:
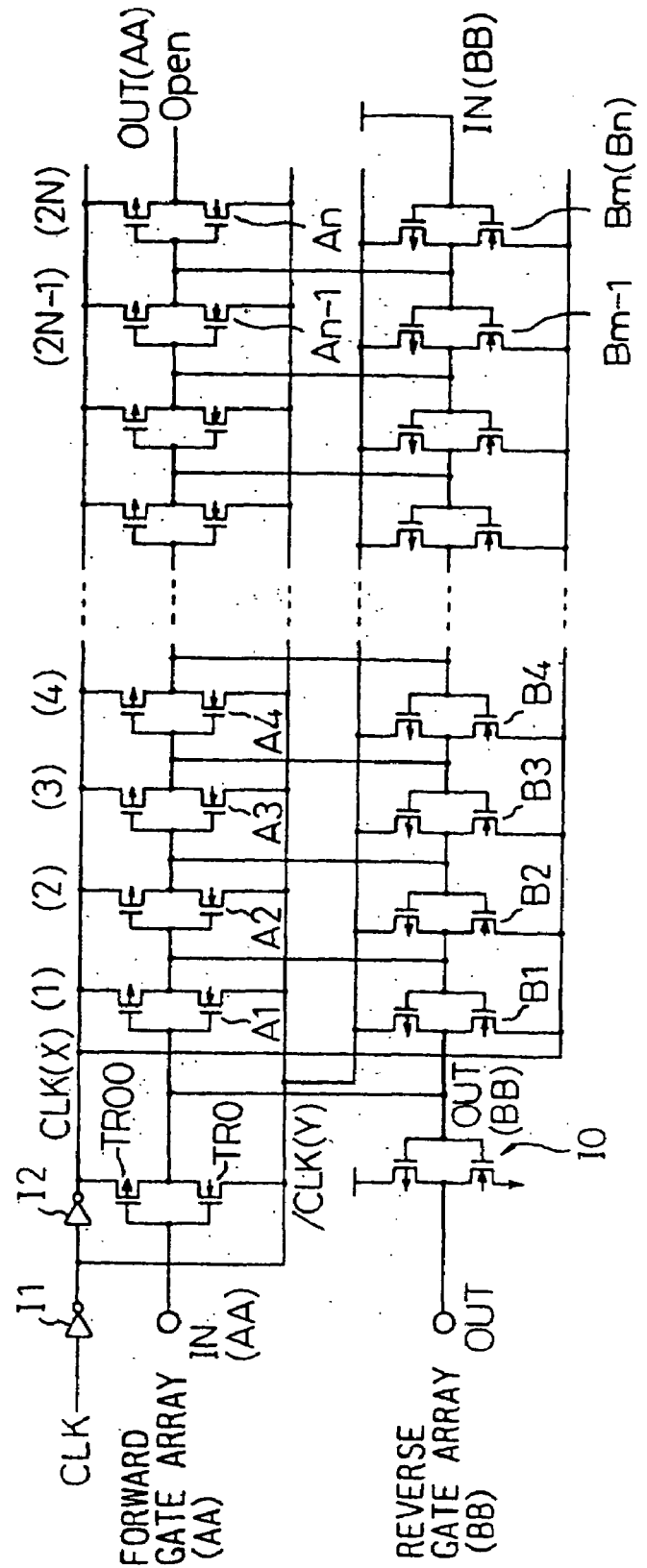
FIG. 14 is a diagram for explaining a timing controller according to a tenth embodiment of the present invention.

FIG. 14 shows a delay circuit according to the 10th embodiment of the present invention. Gate circuits A1 to An of a first gate chain AA and gate circuit B1 to Bm of a second gate chain BB are inverters. The numbers of the gate circuits in the gate chains AA and BB are equal to each other and are each an even number 2N. The size of each transistor of the gate circuits A1 to An of the first gate chain AA is different from the size of each transistor of the gate circuits B1 to Bm of the second gate chain BB. Accordingly, an input signal to the first gate chain AA is temporally multiplied by a value determined by the ratio of the transistor sizes and is inverted. Namely, a time difference τ between changeover points of two signals is adjustable by changing the ratio of the sizes of the transistors of the gate chains AA and BB. The ratio may be, for example, 1.5. This delay circuit is capable of sustaining an output level for a given interval around a rise of a control signal irrespective of the period of the control signal.

The 10th embodiment of FIG. 14 generates a first control signal X by passing a clock signal CLK through inverters I1 and I2, and a second control signal Y by passing the clock signal CLK through the inverter I1. An input end IN(AA) of the first gate chain AA is connected to an inverter consisting of an N-channel MOS transistor TR0 and a P-channel MOS transistor TR00. More precisely, the input end IN(AA) is connected to the gates of the transistors TR0 and TR00, and the output of these transistors is supplied to the gate circuit A1.

An output end OUT(AA) of the first gate chain AA is set to a high impedance state (open), and an input terminal IN(BB) of the second gate chain BB is fixed at high level. An output end OUT(BB) of the second gate chain BB is connected to an inverter I0, which is connected to an output terminal OUT of the delay circuit to provide a stable output signal.

Figure 15:
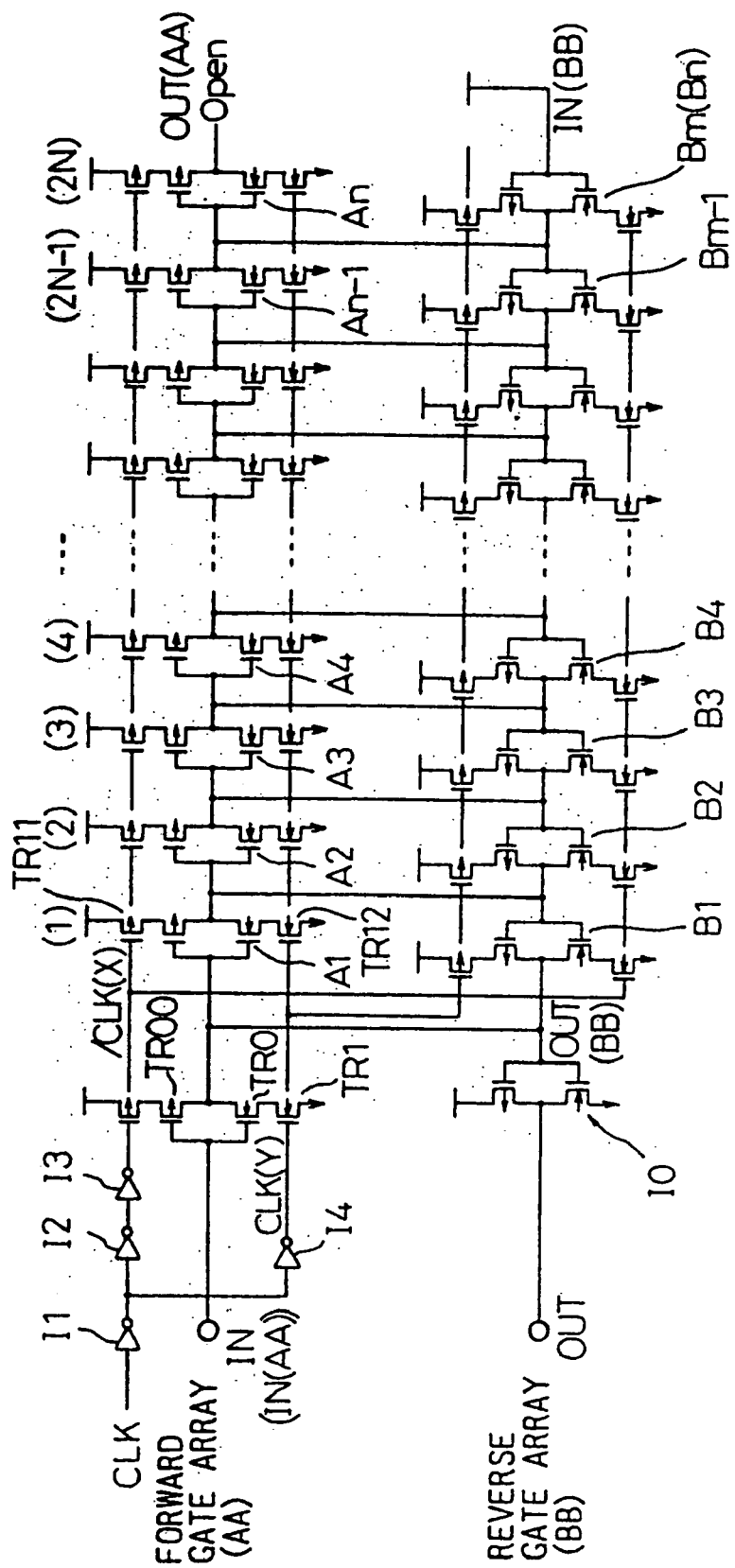
FIG. 15 is a diagram for explaining a timing controller according to an eleventh embodiment of the present invention.

FIG. 15 shows a delay circuit according to the 11th embodiment of the present invention. Gate circuits A1 to An and B1 to Bm of gate chains AA and BB are inverters having power source controlling transistors. For example, the inverter A1 of the gate chain AA has a P-channel MOS transistor TR11 controlled by a control signal X (/CLK) and an N-channel MOS transistor TR12 controlled by a control signal Y (CLK). These transistors are activated and inactivated according to the level of a clock signal CLK.

An input end IN(AA) of the gate chain AA is connected to an inverter consisting of transistors TR0 and TR00. The source of the transistor TR0 is connected to a transistor TRI controlled by the control signal Y. The control signal X is produced by passing the clock signal CLK through inverters I1, I2, and I3. The control signal Y is produced by passing the clock signal CLK through the inverter I1 and an inverter I4. In this way, each of the gate circuit A1 to An and B1 to Bm is provided with the power source controlling transistors TR11 and TR12 that uniformly bear power supplying load.

Figure 16:
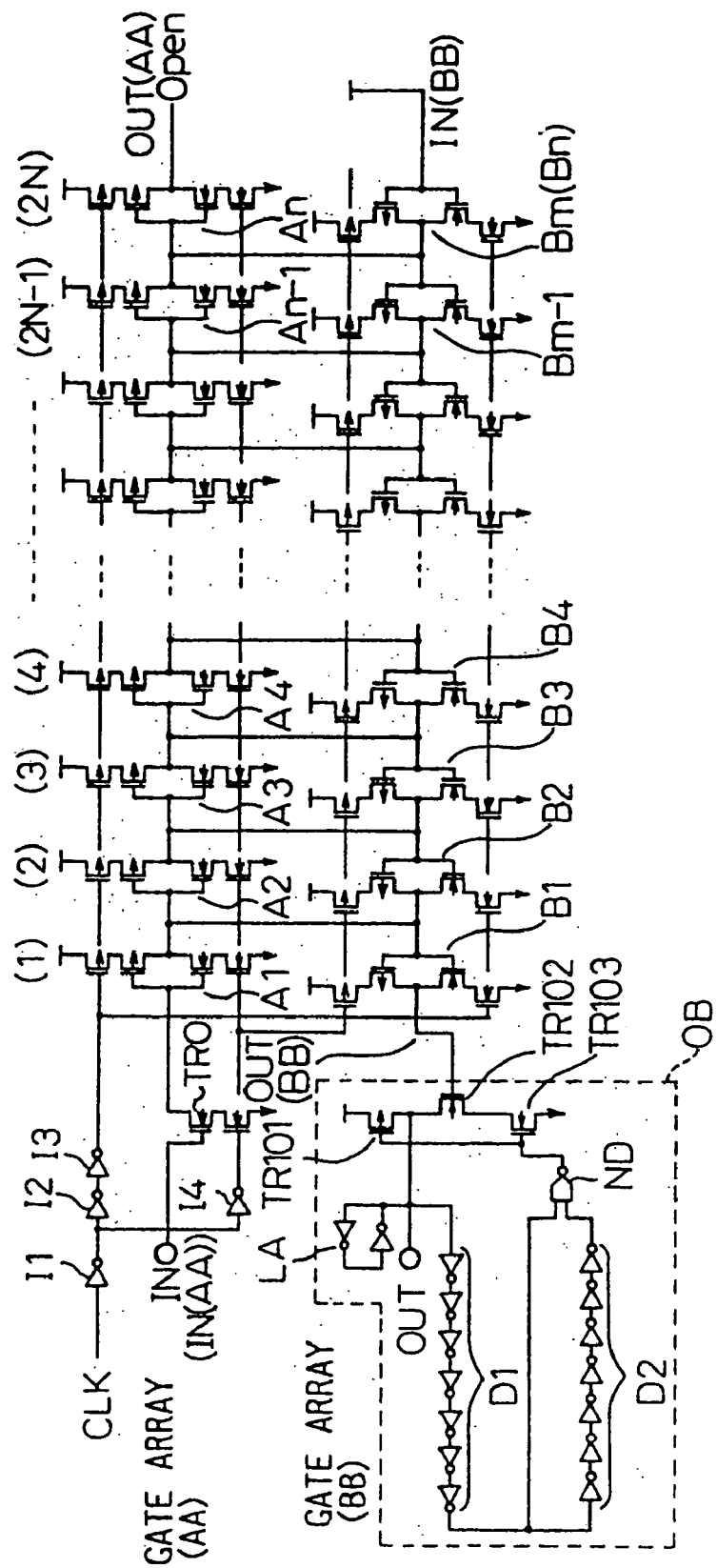
FIG. 16 is a diagram for explaining a timing controller according to a twelfth embodiment of the present invention.

FIG. 16 shows a delay circuit according to the 12th embodiment of the present invention. An output end OUT (BB) of a gate chain BB has an output buffer OB instead of the inverter I0 of the 11th embodiment of FIG. 15.

The output buffer OB has delay units D1 and D2 each consisting of an odd number of inverters, a latch LA for removing an undetermined output state, a NAND gate ND, and transistors TR101, TR102, and TR103. Only when a signal supplied to an input end IN(AA) of a first gate chain AA is high, a signal is supplied to a gate circuit A1 of the gate chain AA. The output buffer OB catches only a changeover point where the level of the output end OUT(BB) of the second gate chain BB changes from low to high, or from high to low, and provides an output signal.

The input end IN(AA) of the first gate chain AA is connected to a one-way driver, i.e., an N-channel MOS transistor TR0 responding to low potential (first potential) or high potential (second potential). More precisely, the input end IN(AA) is connected to the gate of the transistor TR0, to provide a signal having no unnecessary changeover points.

Figure 17:
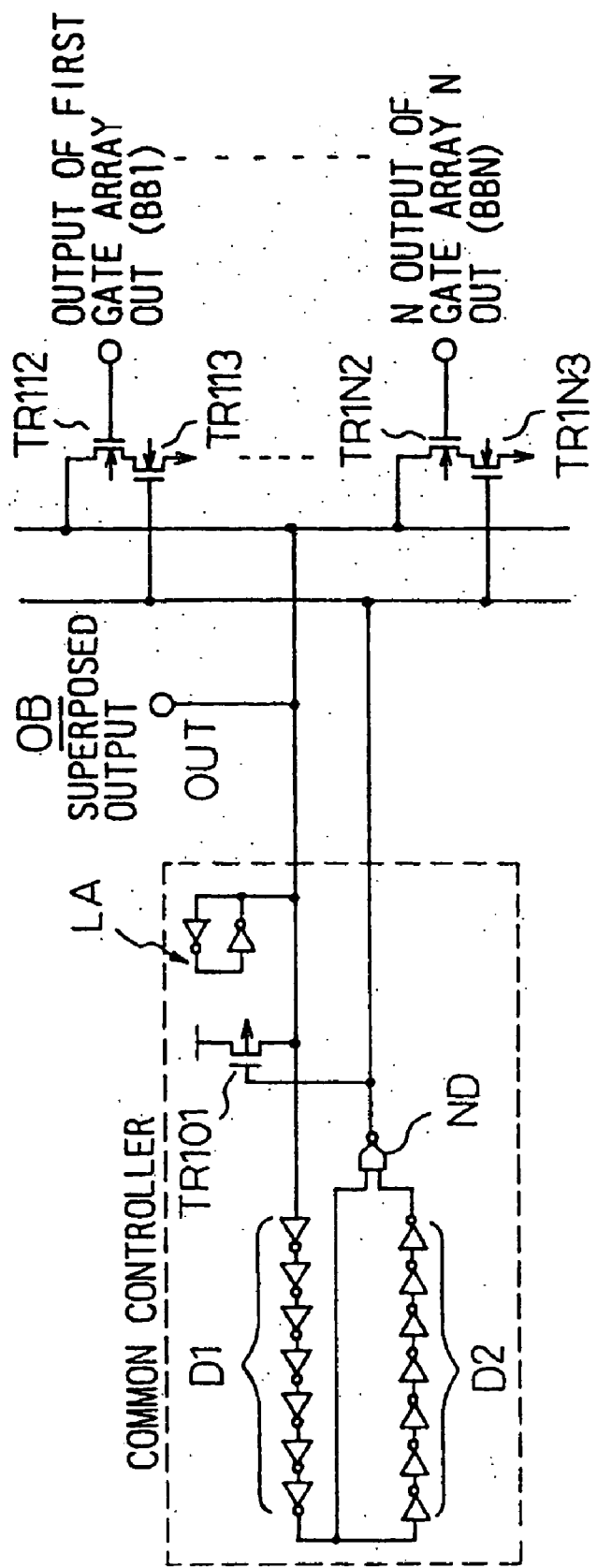
FIG. 17 is a diagram for explaining a timing controller according to a thirteenth embodiment of the present invention.

FIG. 17 shows a delay circuit according to the 13th embodiment of the present invention. This embodiment divides the frequency of an input clock signal by N (N being an integer equal to or greater than 2), to produce control signals each having a period that is N times longer than that of the clock signal. (An example shown in FIGS. 20A to 20C halves the frequency of an input clock signal.) The 13th embodiment, therefore, employs N pairs of first and second gate chains AA and BB. FIG. 17 particularly shows a superposing output buffer OB' of the 13th embodiment, for superposing the outputs OUT(BB1) to OUT(BBN) of the second gate chains BB1 to BBN of the N pairs. The output buffer OB' corresponds to the output buffer OB of FIG. 16.

The outputs OUT(BB1) to OUT(BBN) are connected to switching transistors TR112 and TR113 to TR1N2 and TR1N3, respectively. These switching transistors correspond to the transistors TR102 and TR103 of FIG. 16. The drains of the transistors TR112 to TR1N2 are connected to one another, to provide a superposed output OUT. The superposed output OUT has the same frequency, as and a different phase, from the clock signal CLK. It is possible to employ a controller to reset the outputs OUT(BB1) to OUT(BBN) to a given level.

FIG. 18 explains a timing controller according to the 14th embodiment of the present invention. This embodiment is based on the 13th embodiment and divides the frequency of an input clock signal CLK by 3, to produce three control signals 1 to 3 each having a period that is three times longer than that of the clock signal CLK.

The three control signals 1 to 3 are supplied to three pairs of first and second gate chains. The three pairs provide output signals 1 to 3, respectively. These output signals 1 to 3 are superposed by a superposing output buffer OB' similar to that of FIG. 17, to provide a superposed output signal OUT that is independent of the frequency of the clock signal CLK. The superposed output signal OUT has the same frequency, as and a different phase, from the clock signal CLK.

FIG. 19 explains an application of the present invention. This application-involves a timing controller 61 according to the present invention, an optional circuit 62, and an output buffer 63.

The timing controller 61 produces an internal clock signal (a second clock signal) by changing the phase of an external input clock signal (a first clock signal) CLK. The internal clock signal is supplied to the output buffer 63 that receives the output of the optional circuit 62. The output buffer 63 provides an output in synchronization with the internal clock signal.

Any timing controller or delay circuit according to the present invention is applicable not only to the arrangement of FIG. 19 but also to a variety of arrangements.

Figure 20A:
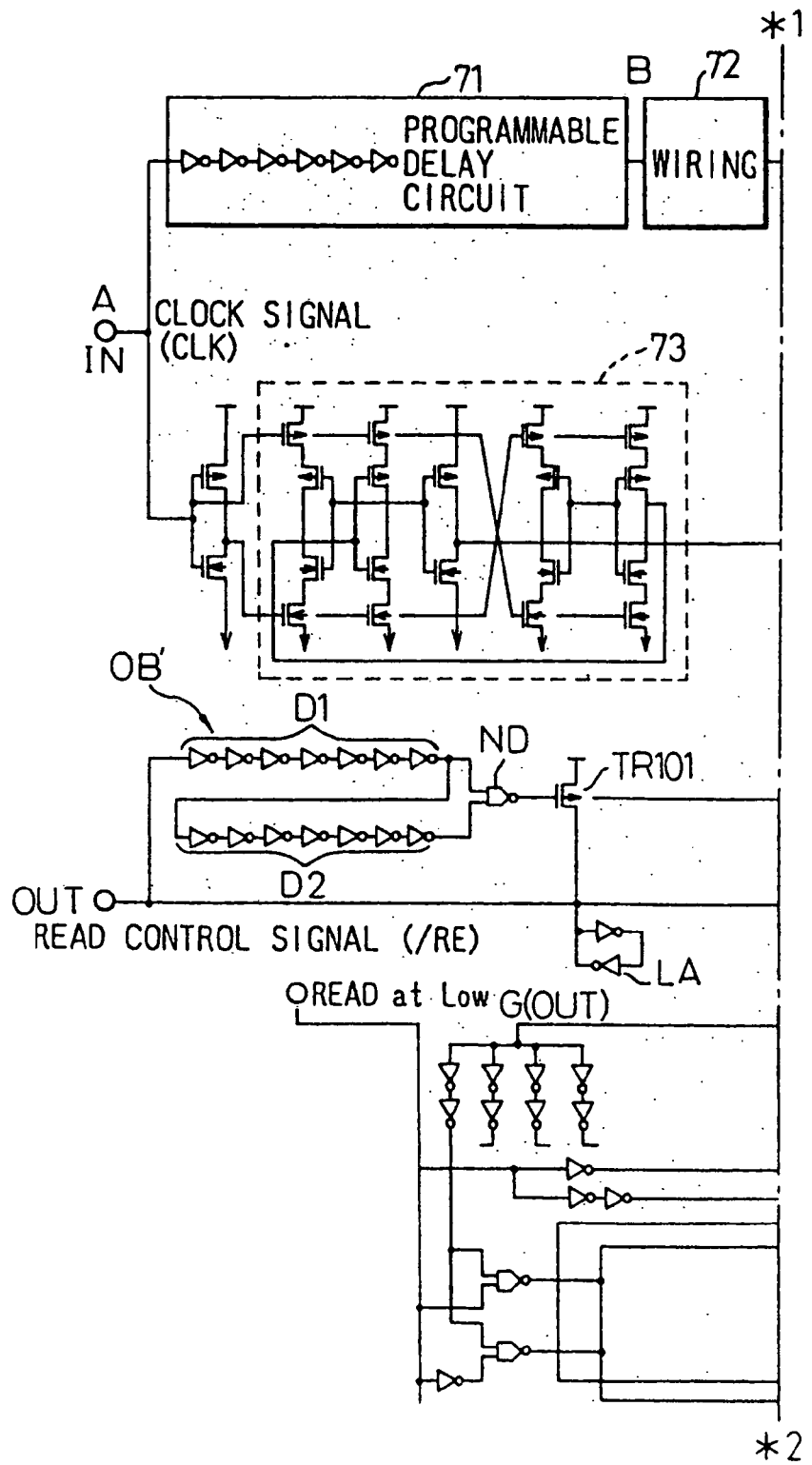
Figure 20C:
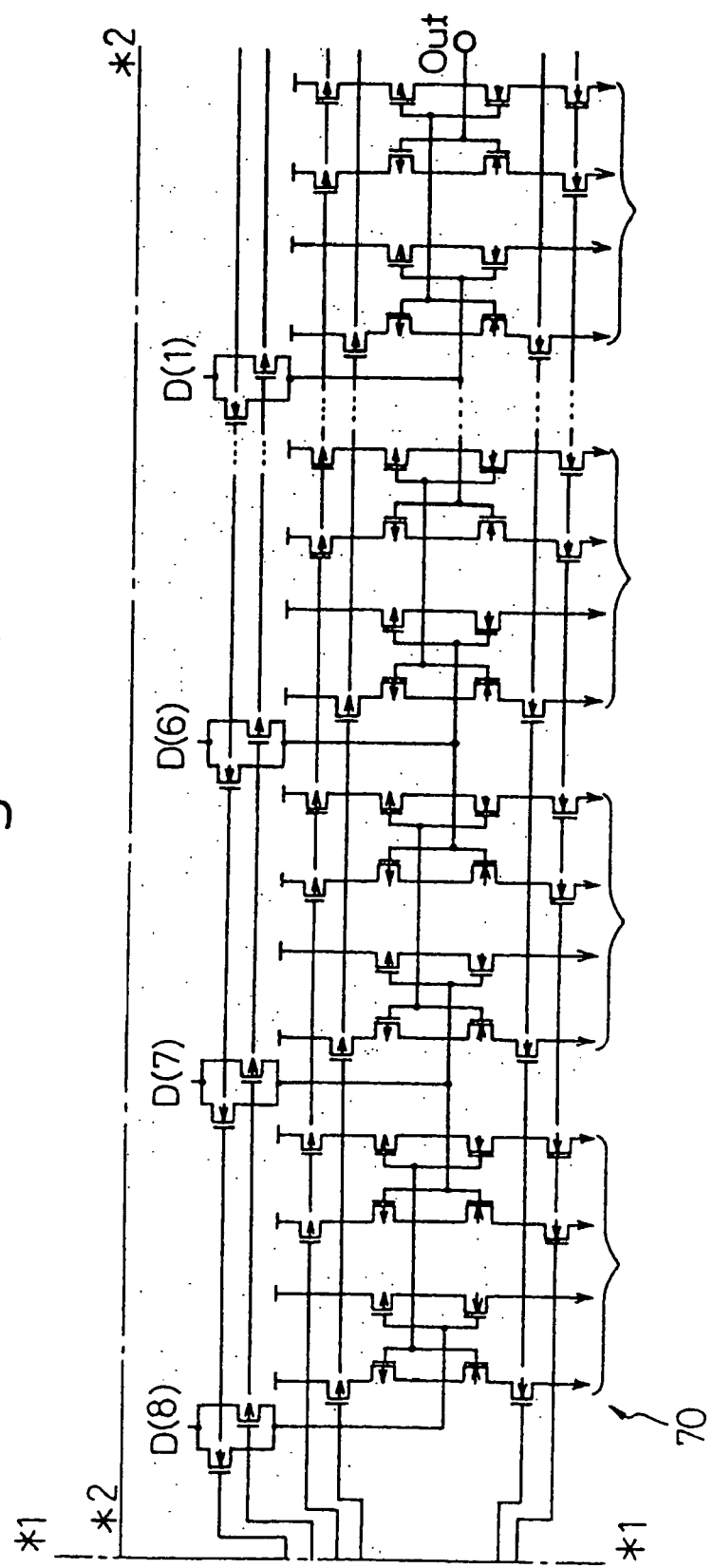

FIGS. 20A to 20C show a clock generator employing a timing controller according to the present invention. The clock generator includes a programmable delay circuit 71, a dummy wiring delay circuit 72, and a ½-frequency divider 73.

Figure 21A:
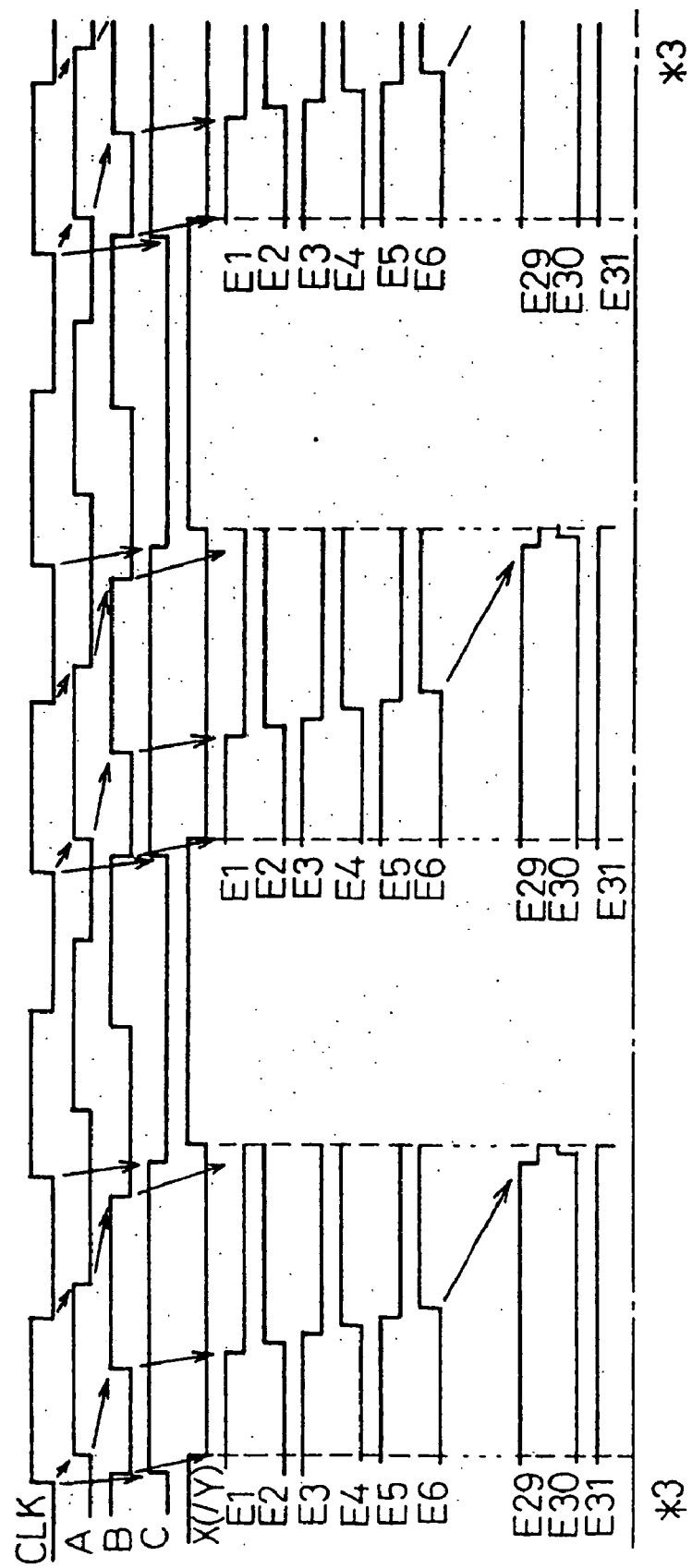
FIGS. 21A and 21B are timing charts showing signals in the clock generator of FIGS. 20A to 20C.
Figure 21B:
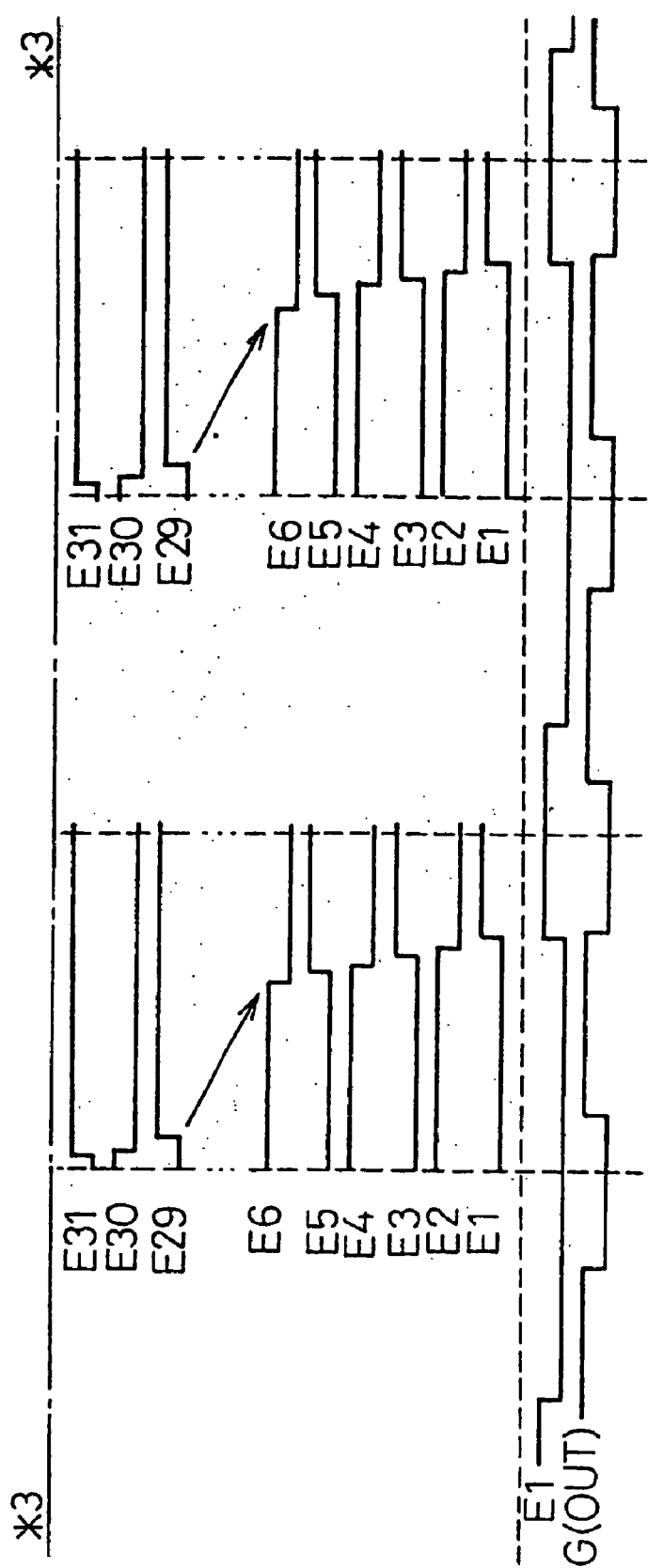

FIGS. 21A and 21B are timing charts showing signals in the clock generator of FIGS. 20A to 20C. The clock generator involves a clock signal CLK, a control signal X, a control signal Y that is an inversion (/X) of the control signal X, internal signals A, B, and C, and output signals E1 to E31 of gate circuits (inverters) of gate chains incorporated in the clock generator.

The frequency divider 73 halves the frequency of the clock signal CLK, to provide the control signals X and Y each having a period twice as long as the clock signal CLK. The control signals X and Y are supplied to two circuits 74 and 75. The circuit 74 includes first and second gate chains AA1 and BB1, and the circuit 75 includes first and second gate chains AA2 and BB2. An output buffer OB' superposes the outputs OUT(BB1) and OUT(BB2) of the circuits 74 and 75, as explained with reference to FIGS. 16 and 17, to provide a superposed output OUT(G). This output OUT(G) is supplied as an output control clock signal to-a read controller 70, which calculates a logic of the signal OUT(G) and a read control signal/RE, to read data D(1) to D(8).

Each of common nodes of the first and second gate chains AA1 (AA2) and BB1 (BB2) is connected to a capacitor CL to elongate the signal propagation characteristics of the gate circuits. Capacitance values of the capacitors CL gradually increase from the input side IN(AA1) (IN(AA2)) toward the output side OUT(AA1) (OUT(AA2)) of the first gate chain AA1 (AA2), to gradually increase delay time provided by gate circuits (inverters). More precisely, first part on the input side IN(AA1) (IN(AA2)) of the first gate chain AA1 (AA2) has no capacitors, to provide a short delay time. For example, the capacitance of the 41st capacitor CL is four times larger than the capacitance CIN of the first part on the input side, and the capacitance of the 51st capacitor CL is 12 times larger than the capacitance CIN.

In signal lines for transmitting the control signals X and Y, inverters (buffers) IA and I3 are arranged for every 10 gate circuits. Through these inverters, the signal lines alternately serve for the opposite gate chains. The structure of the superposing output buffer OB', the levels of the output ends OUT(AA1) and OUT(AA2) of the first gate chains AA1 and AA2, and the levels of the input ends IN(BB1) and IN(BB2) of the second gate chains BB1 and BB2 are the same as those of the preceding embodiments, and therefore, they are not explained again.

In this way, the clock generator superposes the outputs of the two circuits 74 and 75 having the first and second gate chains AA1 and BB1 and AA2 and BB2, to provide the superposed output OUT(G) that has the same frequency as and a different phase from the input clock signal CLK. The clock generator is capable of sustaining the output for a given interval around a rise of the clock signal CLK irrespective of the frequency of the clock signal CLK.

As explained above in detail, the present invention provides a timing controller having a time difference expander to expand a time difference τ between changeover points of first and second signals N times (N being an integer equal to or greater than 2), to properly control the timing of a control signal according to the period of the control signal.

Below, embodiments of a controlled delay circuit according to the present invention will be explained by comparing the prior art.

FIG. 22 shows an example of a controlled delay circuit according to a prior art. In FIG. 22, reference numeral 300 denotes a unit delay circuit (UD), 301 denotes a multiplexer (MUX), 302 denotes a phase detector (phase comparator), and 303 and 304 denote RC-delay circuits.

In the controlled delay circuit shown in FIG. 22, a plurality of outputs of a delay line constituted by a plurality of unit delay circuits 300, or outputs of the unit delay circuits 300 are selected by the multiplexer 301, and an output clock signal CLK' including a specific delay time is output. Namely, the phase detector 302 compares an output signal fed back through the RC-delay circuit 304 with an input clock signal CLK, and the multiplexer 301 is controlled by control signals (UP and DOWN) output from the phase detector 302, so that the output clock signal CLK' is delayed by the specific delay time from the input clock signal CLK. Note that, each of the RC-delay circuits 303 and 304 is a delay circuit constituted by resistors (R) and capacitors (C), and the output signal (output clock signal) CLK' is output through the RC-delay circuit 303.

Therefore, in the controlled delay circuit of FIG. 22, the delay line having a plurality of unit delay circuits 300 must be provided, and a power consumption becomes large.

Figure 23:
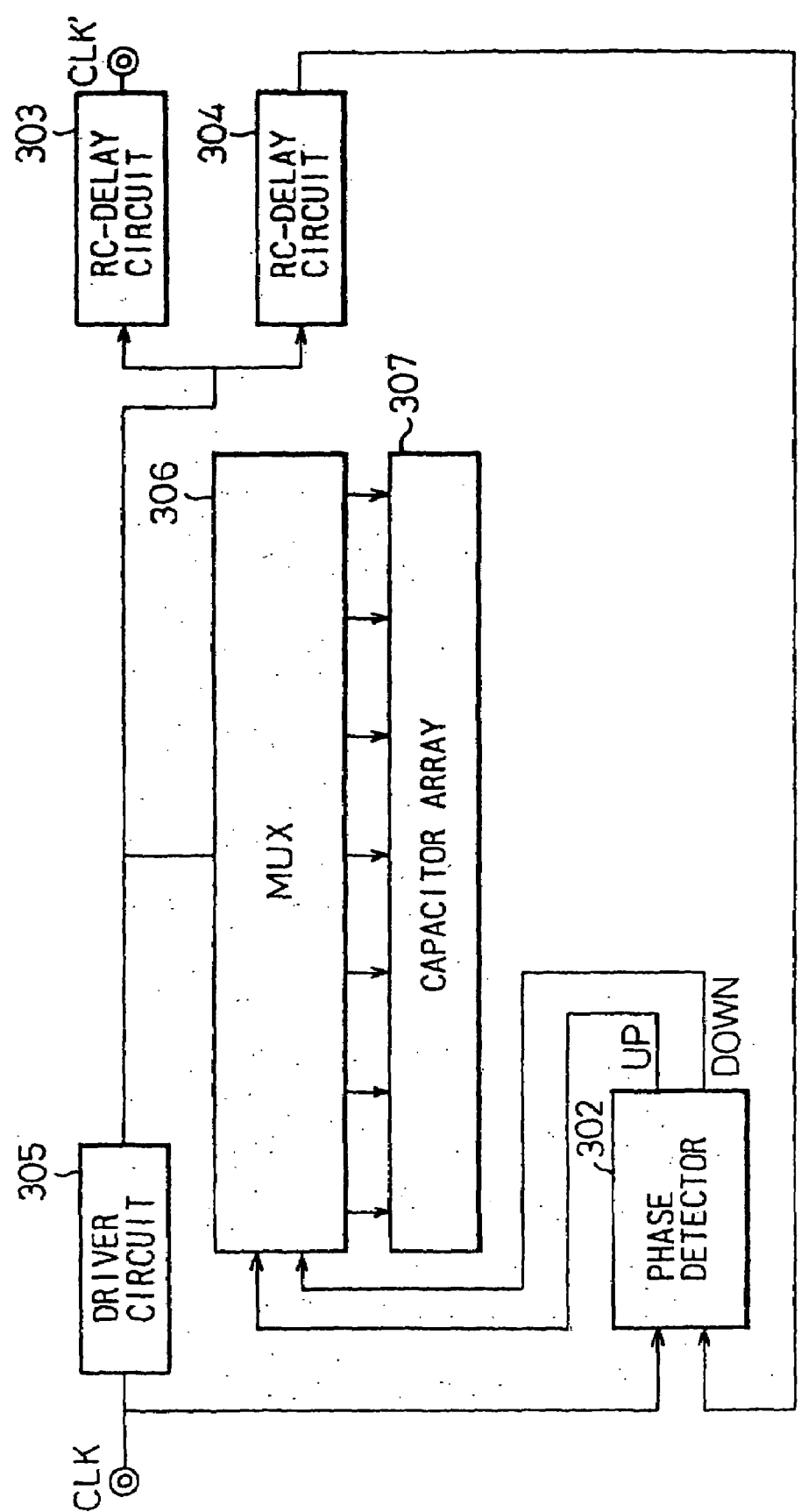
FIG. 23 is a block diagram showing another example of a controlled delay circuit according to a prior art.

FIG. 23 shows another example of a controlled delay circuit according to a prior art. In FIG. 23, reference numeral 305 denotes a driver circuit, 306 denotes a multiplexer (MUX), and 307 denotes a capacitor array circuit.

In the controlled delay circuit shown in FIG. 23, the phase detector 302 compares an output signal fed back through the RC-delay circuit 304 with the input clock signal CLK, an output load capacitance (capacitance value set by the capacitor array circuit 307) is selected by the multiplexer 306 in accordance with control signals (UP and DOWN) output from the phase detector 302, and thereby a rising time and a falling time are controlled. Namely, an output clock signal CLK' is delayed by a specific delay time from an input clock signal CLK, by using the bluntness of the input clock signal CLK. Note that, each of the RC-delay circuits 303 and 304 is a delay circuit constituted by resistors (R) and capacitors (C), and the output signal (output clock signal) CLK' is output through the RC-delay circuit 303, similar to that shown in FIG. 22.

Therefore, in the controlled delay circuit of FIG. 23, the delay time is determined by the bluntness of a signal (input clock signal CLK) in accordance with the load capacitance, and an accuracy of the delay time (output clock signal CLK') becomes reduced and the delay time may be fluctuated by a noise, and the like.

Figure 24:
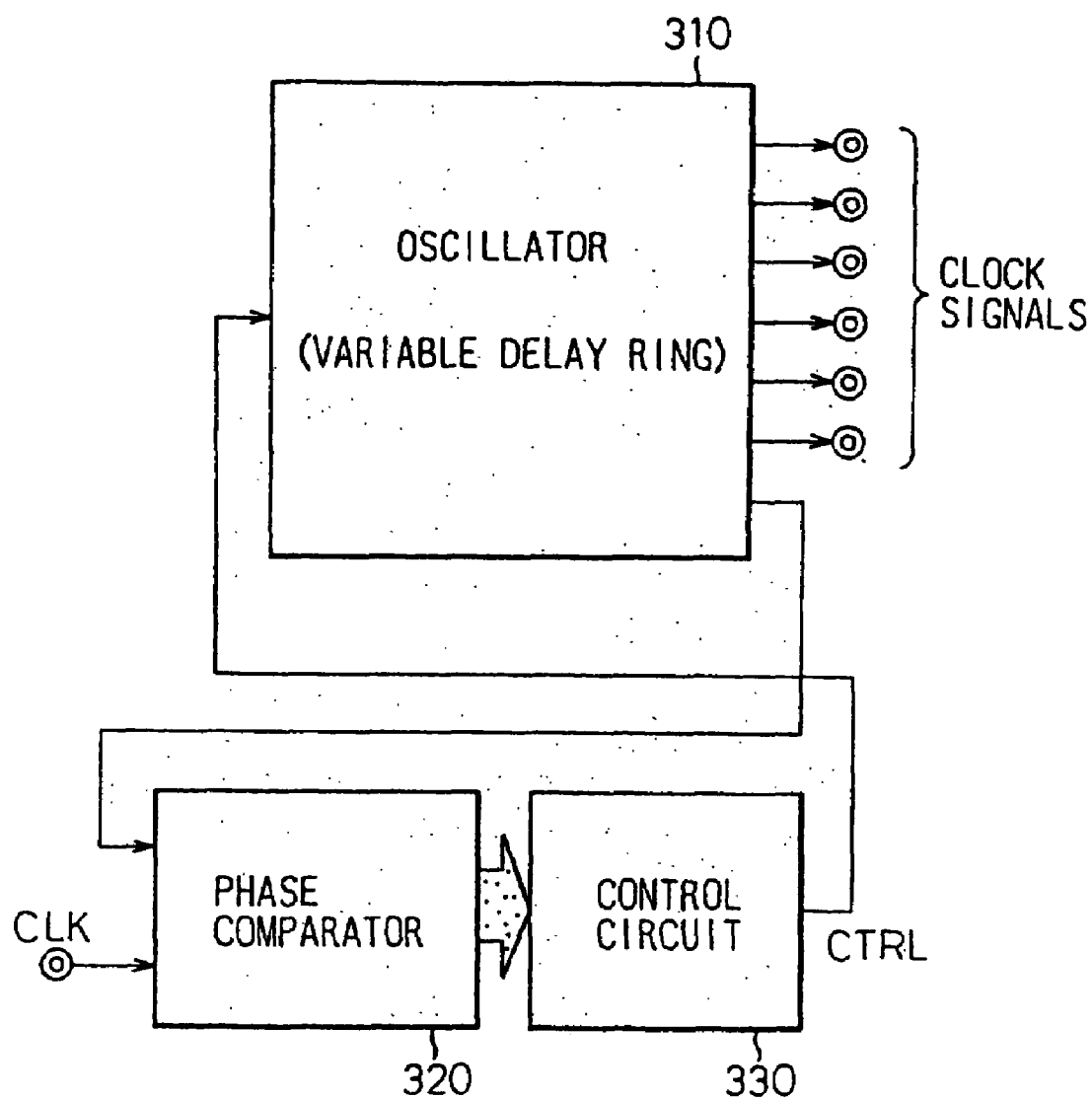
FIG. 24 is a block diagram schematically showing an example of a phase-locked-loop (PLL) circuit according to a prior art.

FIG. 24 schematically shows an example of a phase-locked loop (PLL) circuit according to a prior art. In FIG. 24, reference numeral 310 denotes an oscillator, 320 denotes a phase comparator, and 330 denotes a control circuit.

Generally, it is called a PLL (Phase-Locked Loop) circuit that a circuit including an oscillator whose phase is controlled by a control signal (CTRL). This PLL circuit mainly includes a ring oscillator having a plurality of gate circuits (odd number of gate circuits) where a delay time of the gate circuits is controlled by the applied voltage, and thus the PLL circuit is generally constituted by an analogue circuit. Note that, when the delay time is controlled by a load value of the gates, transistor size, or the number of the gates, the circuit may be called as a digital PLL circuit.

As shown in FIG. 24, various clock signals having various phase (30, 90, or 120 degree) can be output by taking up signals output from various gates of the oscillator 310, and thus two times cycle, three times cycle, and the like can be obtained.

However, the PLL circuit basically comprises the oscillator 310, the phase comparator 320, and the control circuit 330, and the control operations for the phase comparison or the delay time definition are, for example, fluctuated due to a power supply voltage or a circumference temperature. Further, in the PLL circuit, the oscillator 310 is constituted as a ring oscillator, and thus a power consumption becomes large.

By the way, as described above, the PLL circuit includes a ring oscillator, and a circuit including an open type gate array is called a DLL (Delay-Line-Lock) circuit. The controlled delay circuits of the present invention, which will be explained below, are mainly applied to the DLL circuit. This DLL circuit can reduce a consumption power (standby current), and increase a stable operation against a noise. Further, the controlled delay circuit of the present invention can be applied to a clock signal generator for generating a clock signal of a high speed DRAM device.

Figure 25:
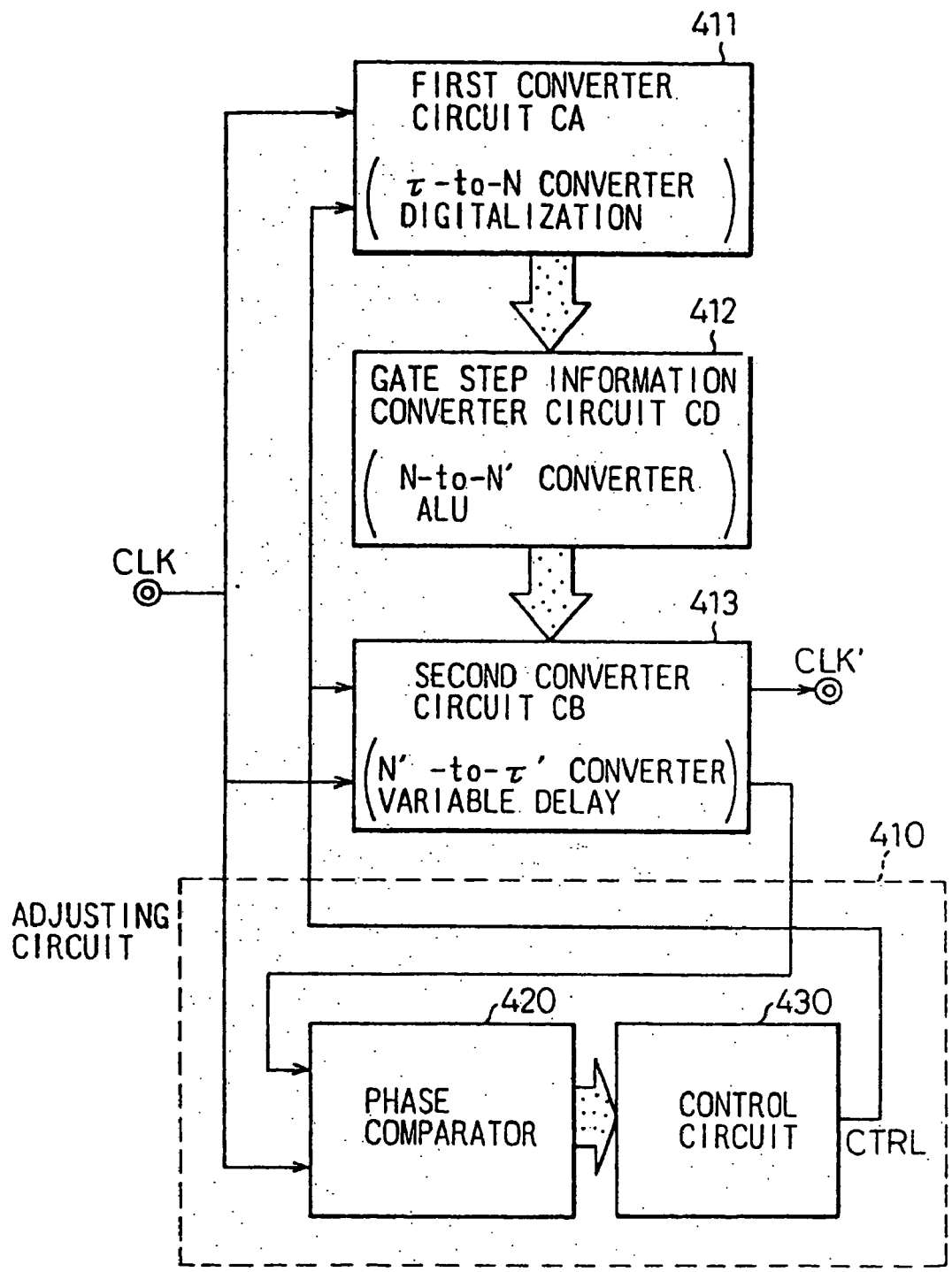
FIG. 25 is a block diagram showing a principle configuration of a delay-line-lock (DLL) circuit employing a controlled delay circuit according to the present invention.

FIG. 25 shows a principle configuration of a DLL circuit employing a controlled delay circuit according to the present invention. In FIG. 25, reference numeral 411 denotes a first converter circuit (CA), 412 denotes a gate step information converter circuit (CD), 413 denotes a second converter circuit (CB), and 410 denotes an adjusting circuit having a phase comparator 420 and a control circuit 430.

Figure 26A:
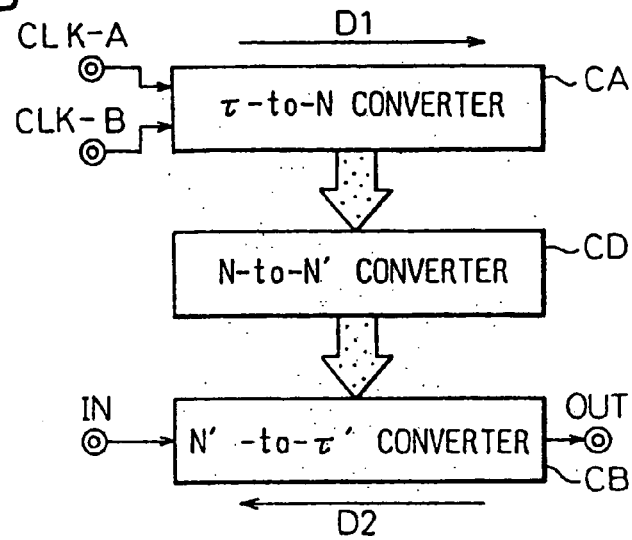
FIGS. 26A and 26B are diagrams showing a principle configuration of a controlled delay circuit employing the present invention.
Figure 26B:
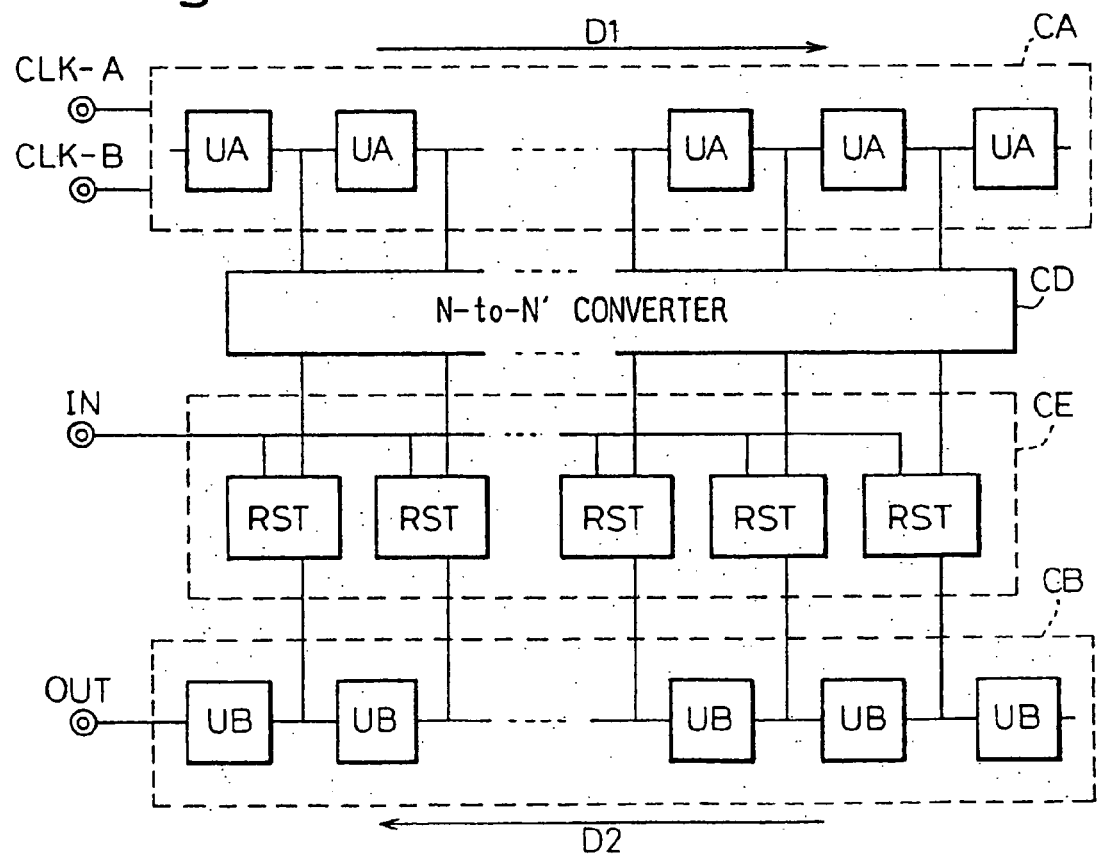

FIGS. 26A and 26B show a principle configuration of a controlled delay circuit employing the present invention. In FIGS. 26A and 26B, reference CA denotes a first converter circuit ($\tau$ to N converter), CB denotes a second converter circuit (N' to $\tau$' converter), CD denotes a gate step information converter circuit (N to N' converter), and CE denotes a reset circuit portion.

As shown in FIGS. 26A and 26B, a first converter circuit CA comprises a plurality of first unit circuits UA which are arranged to transmit a first input signal CLK-A in a right direction D1, and a second converter circuit CB comprises a plurality of second unit circuits UB which are arranged to transmit a third input signal IN in a left direction D2.

The first converter circuit CA is used to convert a first time difference ($\tau$) between a changeover point of the first input signal CLK-A and a changeover point of a second input signal CLK-B into first gate step information (N-bit) indicating the number of gates corresponding to the first time difference. The second converter circuit CB is used to convert second gate step information (N'-bit) indicating the number of gates determined according to the first gate step information (N-bit) into a second time difference ($\tau$'), to delay the third input signal IN supplied to the second converter circuit CB by the second time difference ($\tau$') and provide the delayed signal as an output signal (OUT).

Note that the second unit circuit UB of the second converter circuit CB is used to reproduce the delay time of the first unit circuit UA of the first converter circuit CA. Further, the reset circuit portion CE includes a plurality of reset circuits RST which reset input and output signals to and from the second unit circuits UB just before the third input signal IN is supplied to the second converter circuit CB.

Namely, the first converter circuit CA has an array of at least one first unit circuits UA regularly arranged to transmit the first input signal CLK-A in a first direction D1, and the second converter circuit CB has an array of at least one second unit circuits UB regularly arranged to transmit the third input signal IN in a second direction D2 opposite to the first direction D1.

Figure 27A:
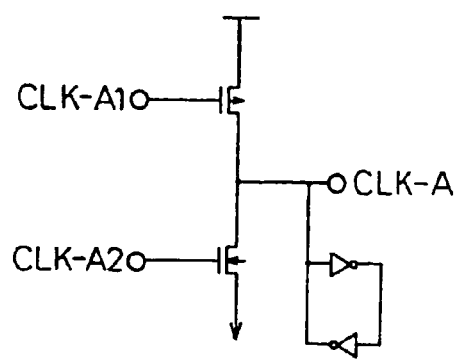
FIGS. 27A and 27B are diagrams showing clock signal generation circuits.
Figure 27B:
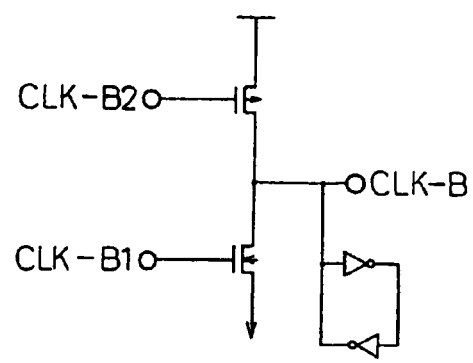
Figure 27C:
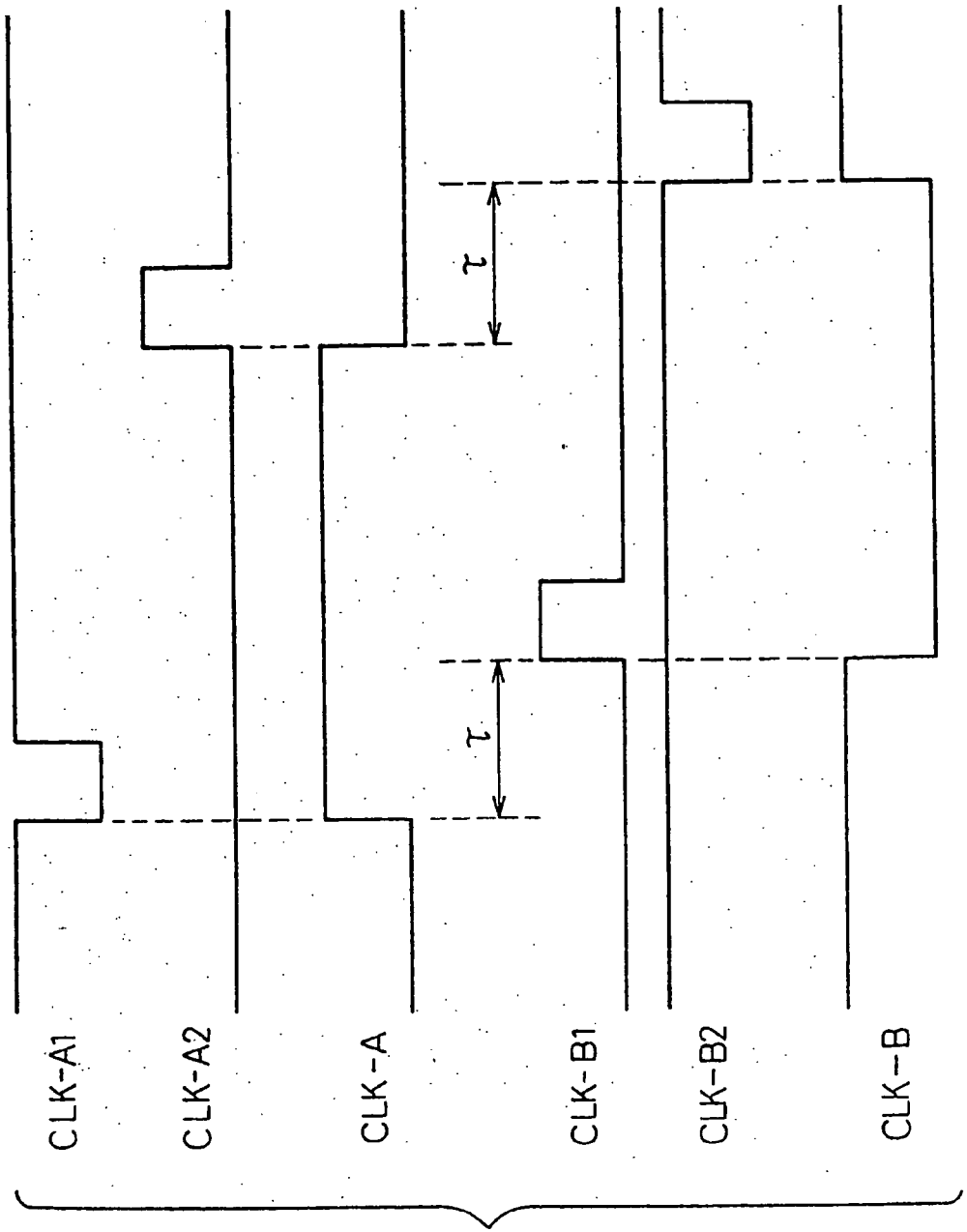
FIG. 27C is a timing chart for explaining operations of the clock signal generation circuits of FIGS. 27A and 27B.

FIGS. 27A and 27B show clock signal generation circuits, and FIG. 27C is a timing chart for explaining operations of the clock signal generation circuits of FIGS. 27A and 27B. Namely, FIG. 27A shows a first clock signal (CLK-A) generation circuit, and FIG. 27B shows a second clock signal (CLK-B) generation circuit.

As shown in FIGS. 27A and 27B, the first and second clock signal generation circuits have the same configuration, and the clock signal generation circuit includes a P-channel and an N-channel MOS transistors and a latch circuit constituted by two inverter circuits. The first clock signal (first input signal CLK-A) is generated by using two control signals (CLK-A1 and CLK-A2), and the second clock signal (second input signal CLK-B) is generated by using two control signals (CLK-B1 and CLK-B2). Namely, these clock signals (CLK-A and CLK-B) are not only supplied from an external as themselves, but also these clock signals are generated by using specific signals (CLK-A1, CLK-A2; CLK-B11, CLK-B2).

As shown in FIG. 27C, a time difference $\tau$ is determined by a period from the first input signal CLK-A rising to the second input signal CLK-B falling and by a period from the first input signal CLK-A falling to the second input signal CLK-B raising. Namely, the time difference $\tau$ is determined by a time between a changeover point of a first input signal CLK-A and a changeover point of a second input signal CLK-B.

Figure 28:
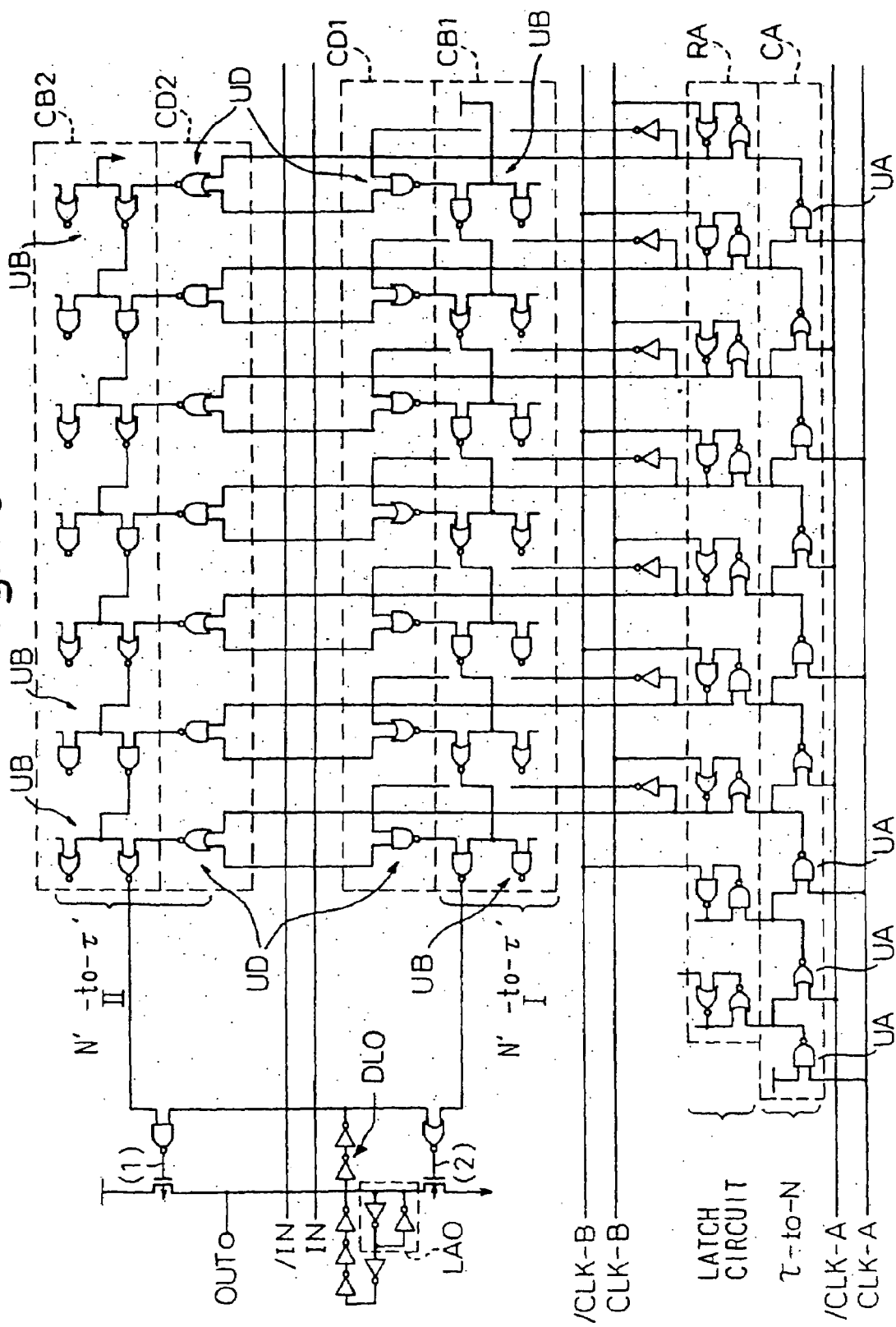
FIG. 28 is a circuit diagram showing a first embodiment of a controlled delay circuit according to the present invention.
Figure 29:
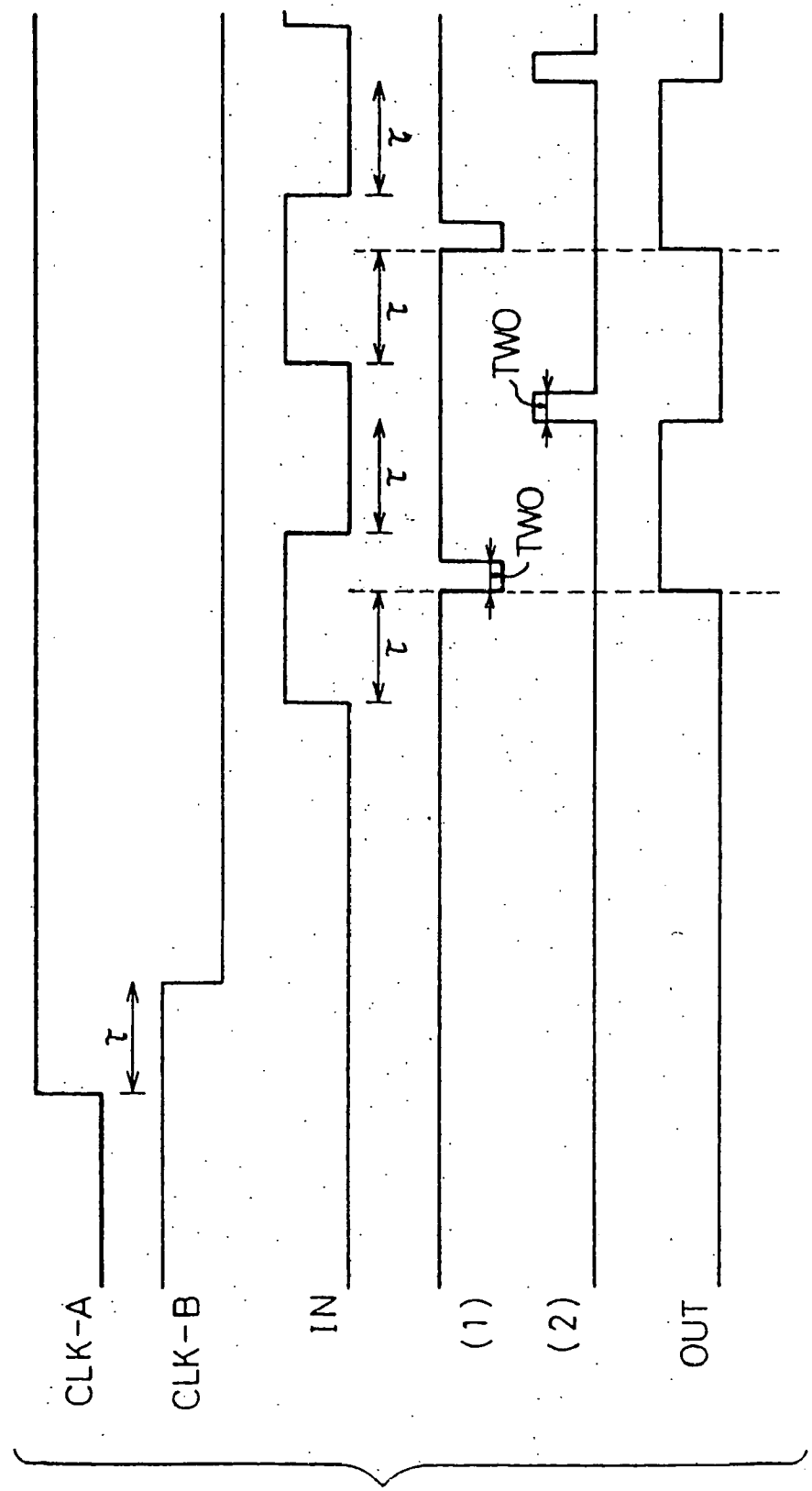
FIG. 29 is a timing chart for explaining operations of the controlled delay circuit of FIG. 28.

FIG. 28 shows a first embodiment of a controlled delay circuit according to the present invention, and FIG. 29 is a timing chart for explaining operations of the controlled delay circuit of FIG. 28. In FIG. 28, reference CA denotes a first converter circuit, CB1 and CB2 denote second converter circuits, CD1 and CD2 denote gate step information converter circuits, and RA denotes a latch circuit.

As shown in FIG. 28, the controlled delay circuit of the first embodiment comprises one first converter circuit ($\tau$ to N converter) CA, two second converter circuits (N' to $\tau$ converter) CB1 and CB2, two gate step information converter circuits (N to N' converter) CD1 and CD2, and one latch circuit RA. The first converter circuit CA includes a plurality of unit circuits (first unit circuits) UA, and each of the second converter circuits CB1 and CB2 includes a plurality of unit circuits (second unit circuits) UB.

In the first converter circuit CA, each first unit circuit UA is constituted by a NOR or NAND gate circuit. Concretely, in the first converter circuit CA, even ones (even steps) of the first unit circuits UA are NOR gate circuits and odd ones thereof are NAND gate circuits. Namely, the first unit circuits UA have inverting gate circuits at least having an inversion function, and the delay time of each gate of the inverting gate circuits is used as a unit time for conversion. Note that, in the above first embodiment, even ones (even steps) of the first unit circuits UA can be constituted by NAND gate circuits and odd ones thereof can be constituted by NAND gate circuits, and further various logic circuit configurations can be applied.

Similarly, in the second converter circuit CB1 and CB2, each second unit circuit UB is constituted by two NOR or NAND gate circuits. Concretely, in the second converter circuit (one of the two second converter circuits) CB1, even ones (even steps) of the second unit circuits UB are NOR gate circuits and odd ones thereof are NAND gate circuits. Further, in the second converter circuit (the other of the two second converter circuits) CB2, even ones (even steps) of the second unit circuits UB are NAND gate circuits and odd ones thereof are NOR gate circuits. Namely, the second unit circuits UB have inverting gate circuits at least having an inversion function, and the delay time of each gate of the inverting gate circuits is used as a unit time for conversion. Note that each second unit circuit is constituted by two NAND or NOR gate circuits and one of them is not substantially operated, in order to exactly define the time (unit time) of each second unit circuit by maintaining a symmetrical circuit.

Each unit circuit of the latch circuit RA is constituted by two NOR or NAND gate circuits, and this latch circuit RA latches (stores) data output from the first unit circuits UA of the first converter circuit CA and supplied to the latched data to the second converter circuit CB1 and CB2 through the gate step information converter circuits CD1 and CD2.

In the first embodiment of the controlled delay circuit according to the present invention, the first converter circuit CA converts a first time difference ($\tau$) between a changeover point of the first input signal CLK-A and a changeover point of a second input signal CLK-B into first gate step information (N-bit) indicating the number of gates corresponding to the first time difference. Namely, in the first converter circuit CA, a signal change is transferred to N-bit first unit circuit UA corresponding to the time difference T, and this signal change is stored (latched) in the latch circuit RA. The data (output of the specific first unit gate UA next to the first unit gate receiving the transferred signal) stored in the latch circuit RA are supplied to the second converter circuits CB1 and CB2 through the gate step information converter circuits CD 1 and CD2. Further, in these second converter circuit CB1 and CB2, the data (corresponding to the output of the specific first unit gate) are transferred to the output terminal (OUT).

Note that, in the above first embodiment, the gate step information converter circuits CD1 and CD2 are constituted to directly supply data from the first unit circuits UA of the first converter circuit CA to the second unit circuits UB of the second converter circuits CB1 and CB2, respectively, to adjust the delay time of the second converter circuits CB1 and CB2 to that of the first converter circuit CA. Namely, the step information converter circuits CD1 and CD2 carry out an N-bit to N-bit conversion.

Therefore, as shown in FIG. 29, the delay times of nodes (1) and (2) are determined to $\tau$, so that an output signal OUT having a delay time $\tau$ (delayed input signal IN by $\tau$) is obtained. Note that pulse widths (TWO) of the signals appeared at the nodes (1) and (2) are determined by a latch circuit LA0 and a delay line DL0 having a plurality of inverter circuits which are provided at the output terminal (OUT), as shown in FIG. 28. Namely, the signal of the node (1) is maintained at a high level "H" without outputting the pulse (TWO), where an output P-channel MOS transistor is switched OFF; and the signal of the node (2) is maintained at a low level "L" without outputting the pulse (TWO), where an output N-channel MOS transistor is switched OFF, so that the output terminal (OUT) is maintained at a high impedance state without outputting the pulse (TWO) of the signals of the nodes (1) and (2).

Note that the first gate step information (N-bit) is a set of data gathered from all or part of the first unit circuits (UA), and the second gate step information (N'-bit) is a set of data supplied to all or part of the second unit circuits (UB). In the above first embodiment, the first gate step information (N-bit) is a set of data gathered from all of the first unit circuits (UA), and thus the second gate step information is the same as the first gate step information. Further, signals synchronous to the bits of the first gate step information, respectively, are supplied as the second gate step information directly to the second converter circuit.

Figure 30A:
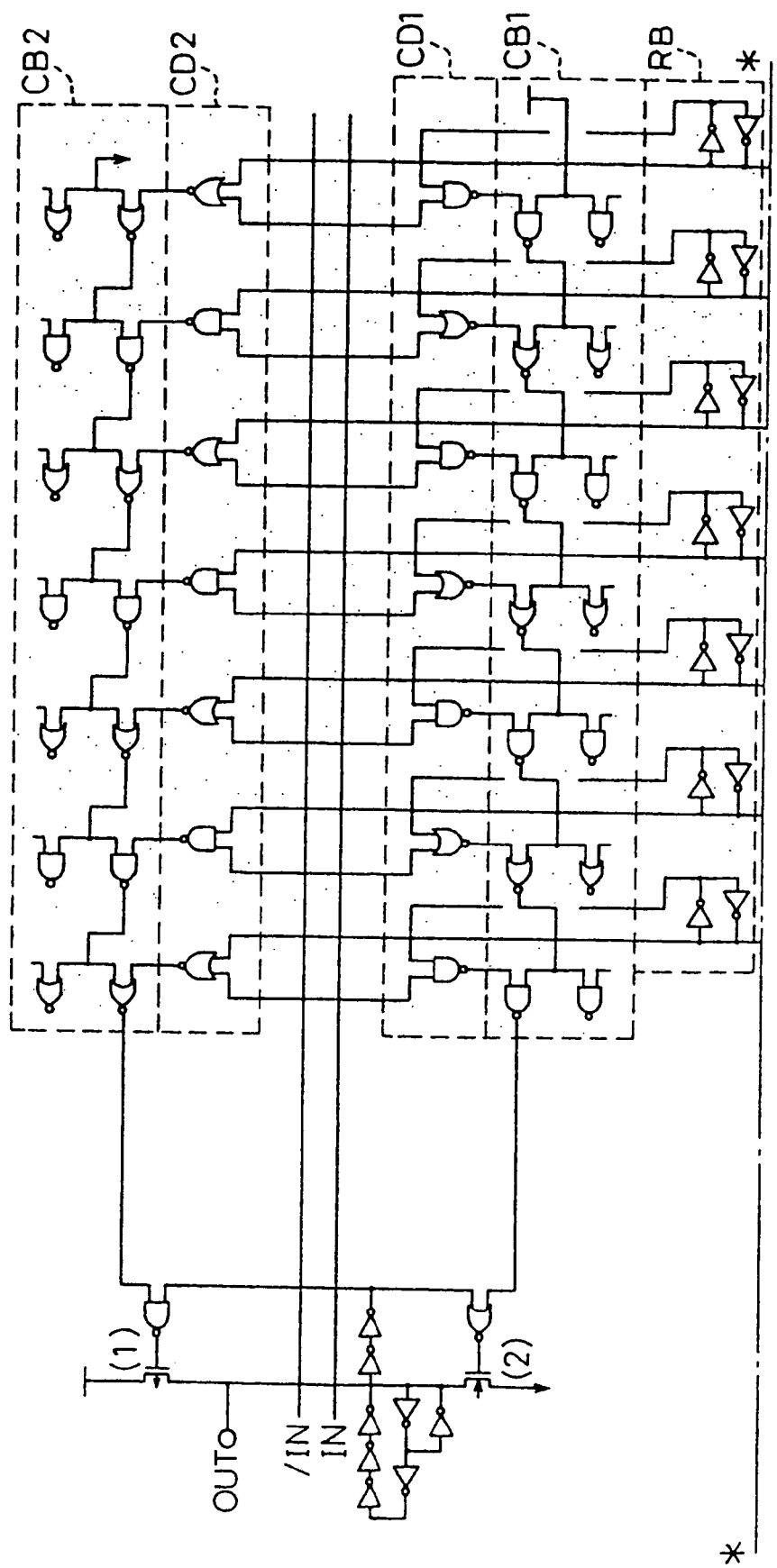
FIGS. 30A and 30B are circuit diagrams showing a second embodiment of a controlled delay circuit according to the present invention.
Figure 30B:
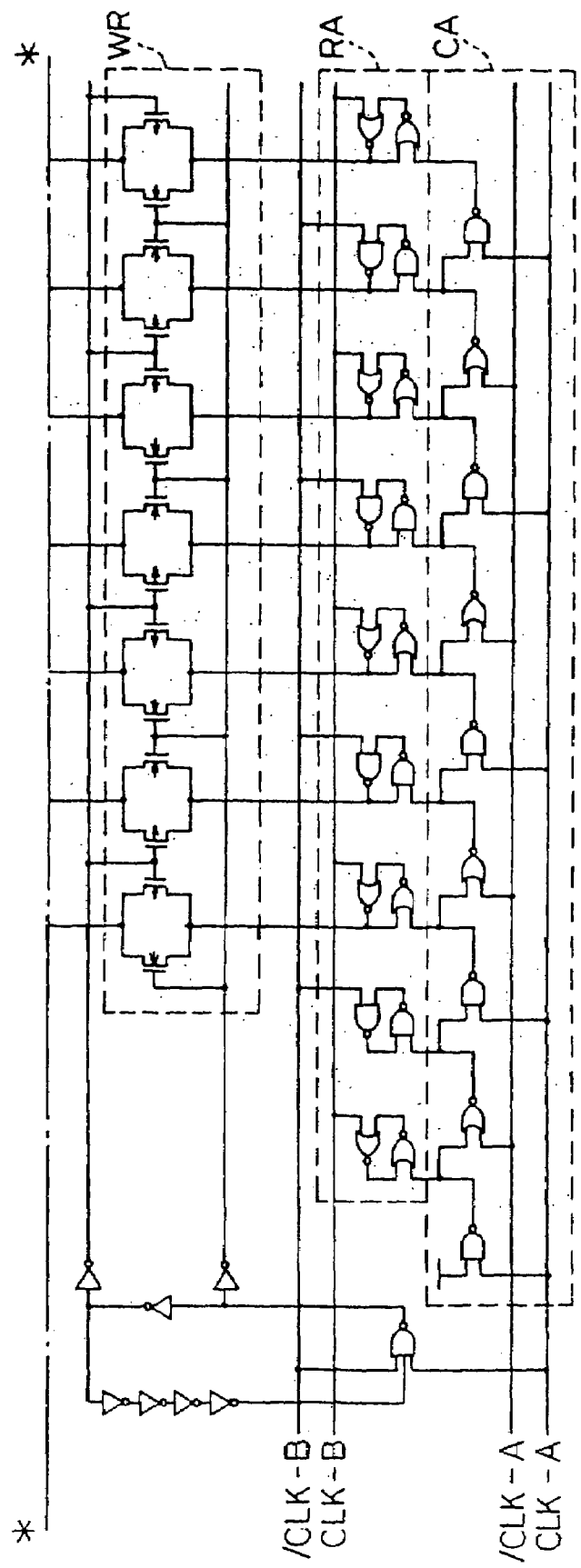
Figure 31:
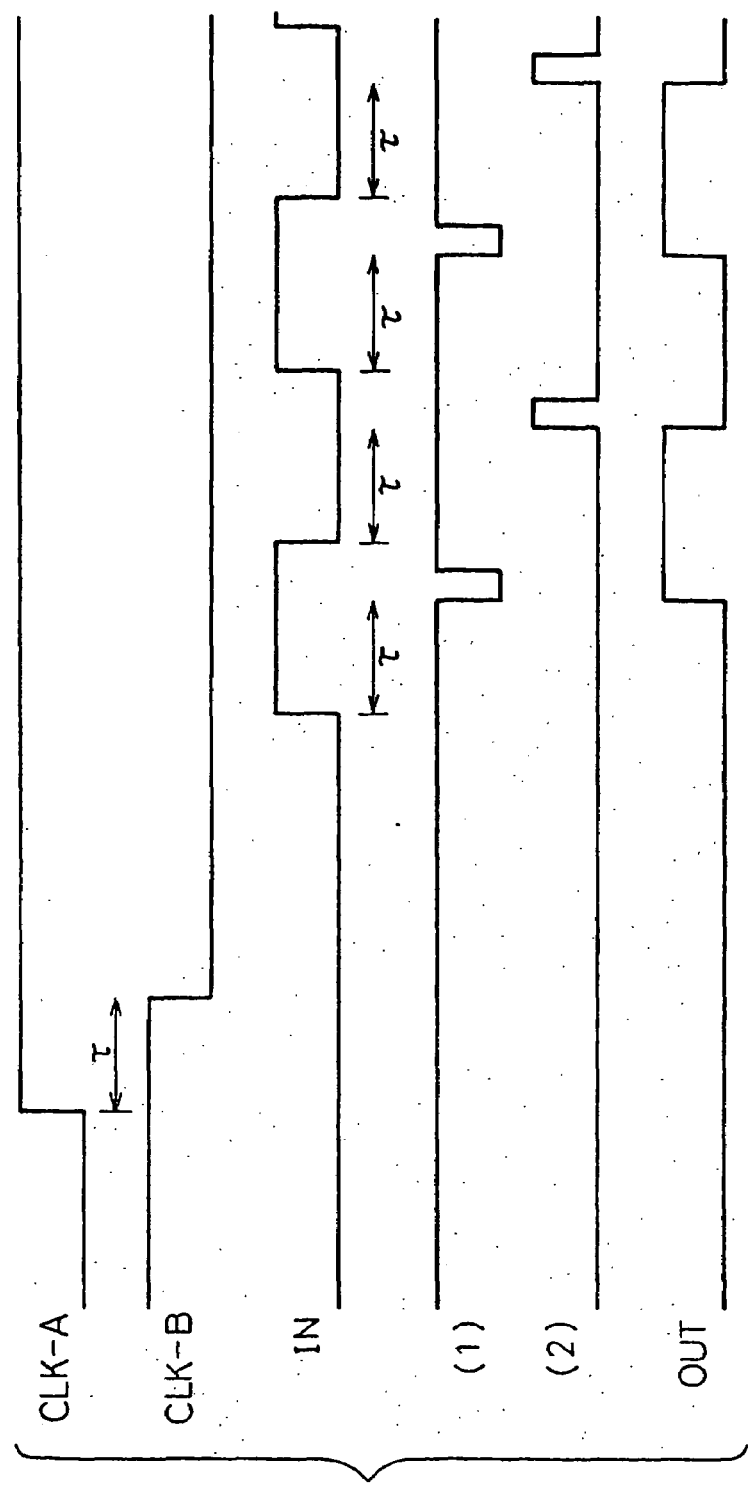
FIG. 31 is a timing chart for explaining operations of the controlled delay circuit of FIGS. 30A and 30B.

FIGS. 30A and 30B show a second embodiment of a controlled delay circuit according to the present invention, and FIG. 31 is a timing chart for explaining operations of the controlled delay circuit of FIGS. 30A and 30B.

As shown in FIGS. 30A and 30B, in this second embodiment of the controlled delay circuit according to the present invention, a latch circuit (second latch circuit) RB is also provided in addition to the latch circuit (first latch circuit) RA described in the above first embodiment. The latch circuit RB, which is provided due to the second unit circuits UB of the second converter circuits CB1 and CB2 (CB), is used to store (latch) data supplied to the second unit circuits UB, and thereby stable signals (first gate step information) are supplied to the second converter circuits CB1 and CB2 (second unit circuits UB).

Note that, in FIGS. 30A and 30B, a reference WR denotes write control circuit, and this write control circuit WR is used to write the data stored in the first latch circuit RA into the second latch circuit RB in accordance with a logical output signal of the first and second input signals CLK-A and CLK-B. Further, the timing chart of FIG. 31 corresponds to that of FIG. 29, and thus whole operation of the second embodiment is the same as that of the second embodiment.

Figure 32A:
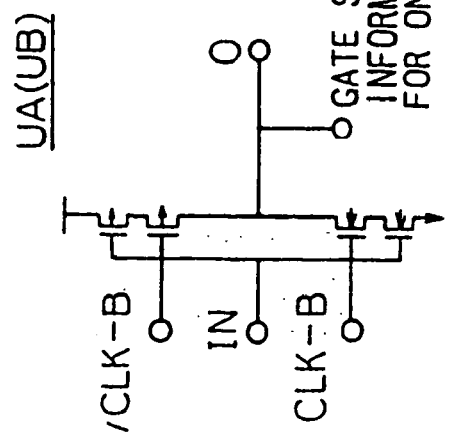
FIGS. 32A and 32B are circuit diagrams showing unit circuits of the controlled delay circuit according to the present invention.
Figure 32B:
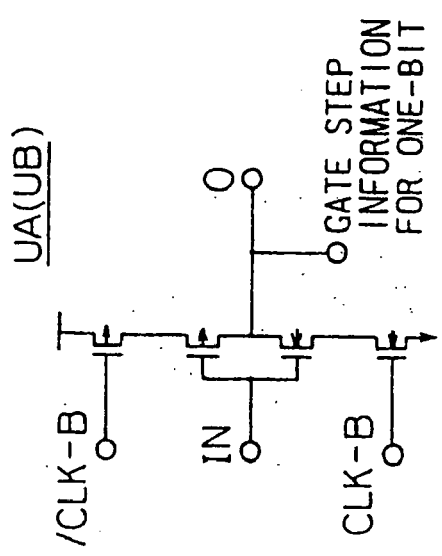
Figure 32C:
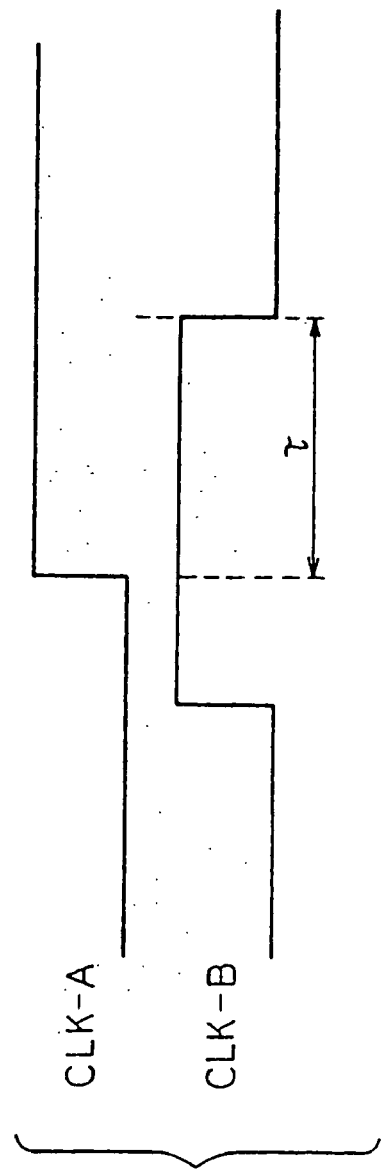
FIG. 32C is a timing chart for explaining operations of the unit circuits of FIGS. 32A and 32B.

FIGS. 32A and 32B show unit circuits of the controlled delay circuit according to the present invention, and FIG. 32C is a timing chart for explaining operations of the unit circuits of FIGS. 32A and 32B.

As shown in FIGS. 32A and 32B, each unit circuit (UA, UB) has an inverter circuit (inverting gate circuits at least having an inversion function), and the delay time of each inverter circuit is used as a unit time for conversion. Namely, in the first converter circuit CA, the time difference $\tau$ is converted into the first gate step information (N-bit) based on the unit time of the first unit circuit UA, and in the second converter circuit CB, the second gate step information (N'-bit) is converted into the second time difference $\tau'$ based on the unit time of the second unit circuit UB.

As shown in FIG. 32C, in the unit circuits of FIGS. 32A and 32B, a period between a changeover point of the first input signal CLK-A and a changeover point where the second input signal CLK-B changes from a high level "H" to a low level "L" is held as the first gate step information (N-bit) corresponding to the first time difference $\tau$.

Figure 33A:
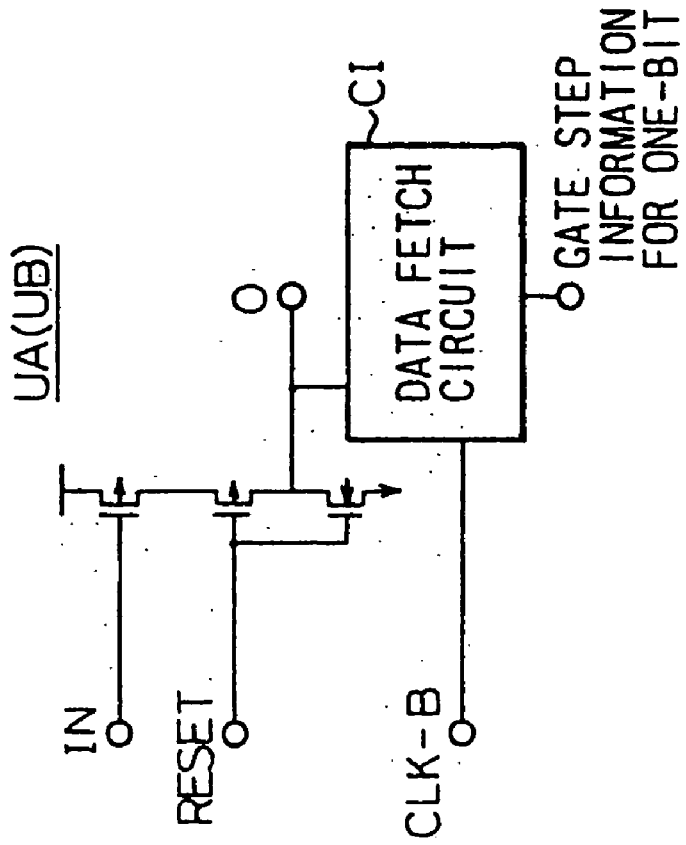
FIGS. 33A and 33B are circuit diagrams showing another unit circuits of the controlled delay circuit according to the present invention.
Figure 33B:
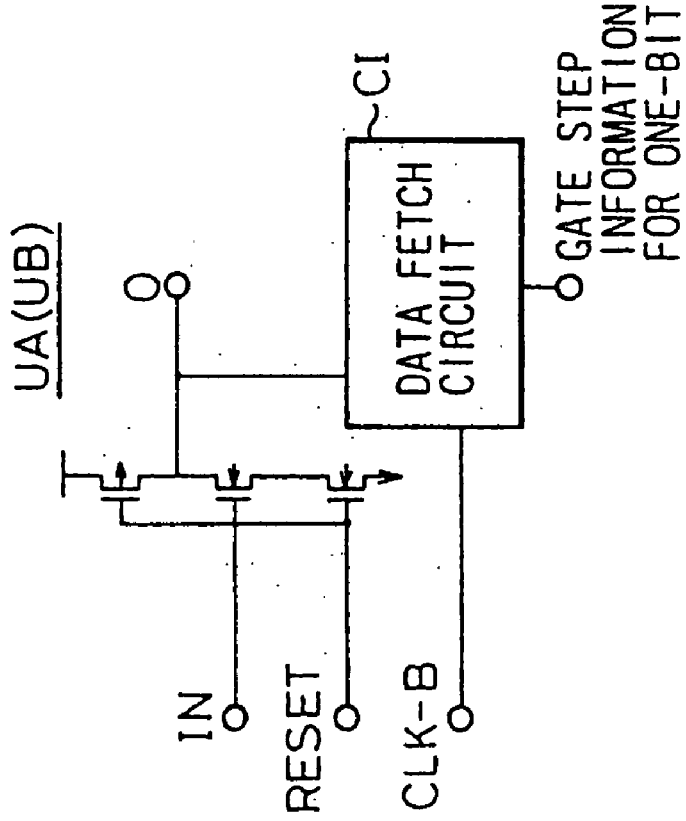

FIGS. 33A and 33B show another unit circuits of the controlled delay circuit according to the present invention.

As shown in FIGS. 33A and 33B, each unit circuit (UA, UB) comprises a reset-signal input terminal (RESET) to set output (O) opposite to expected value just before the signal dependent on the first input signal CLK-A are transmitted. Further, each unit circuit (UA, UB) comprises a data fetch circuit CI for fetching data from the unit circuit at a changeover point of the second input signal CLK-B.

FIGS. 34A and 34B show still another unit circuits of the controlled delay circuit according to the present invention.

As shown in FIGS. 34A and 34B, the first and second unit circuits (UA, UB) bias input thresholds of the first and second converter circuits (CA, CB), to hasten the delay time of those of the unit circuits that transmit signals dependent on the first input signal CLK-A. Namely, in the unit circuit (NAND type unit circuit) of FIG. 34A, a size (transistor size) of each P-channel type MOS transistors is manufactured larger than that of each N-channel type MOS transistors. Further, in the unit circuit (NOR type unit circuit) of FIG. 34B, a size of each P-channel type MOS transistors is manufactured smaller than that of each N-channel type MOS transistors. Therefore, the unit delay time (quantized delay time) of each unit circuit (UA, UB) can be shortened, and the delay time included in the output signal (OUT) can be controlled in higher accuracy.

FIGS. 35A and 35B show still another unit circuits of the controlled delay circuit according to the present invention.

As shown in FIGS. 35A and 35B, each unit circuit (UA, UB) has a delay time adjusting capacitor CC whose capacitance value corresponds to the input capacitance value of the above described data fetch circuit (CI), in order to equalize the delay time of each unit circuit to that of one unit circuit of the first converter circuit CA. Note that, in the unit circuits of FIGS. 35A and 35B, the delay time adjusting capacitor CC is constituted by a P-channel and an N-channel MOS transistors, but the delay time adjusting capacitor CC can be constituted by a various capacitor means. In addition, each of the unit circuits also comprises a reset-signal input terminal (RESET) to set output (O) opposite to expected value just before the signal dependent on the third input signal IN are transmitted.

Figure 36:
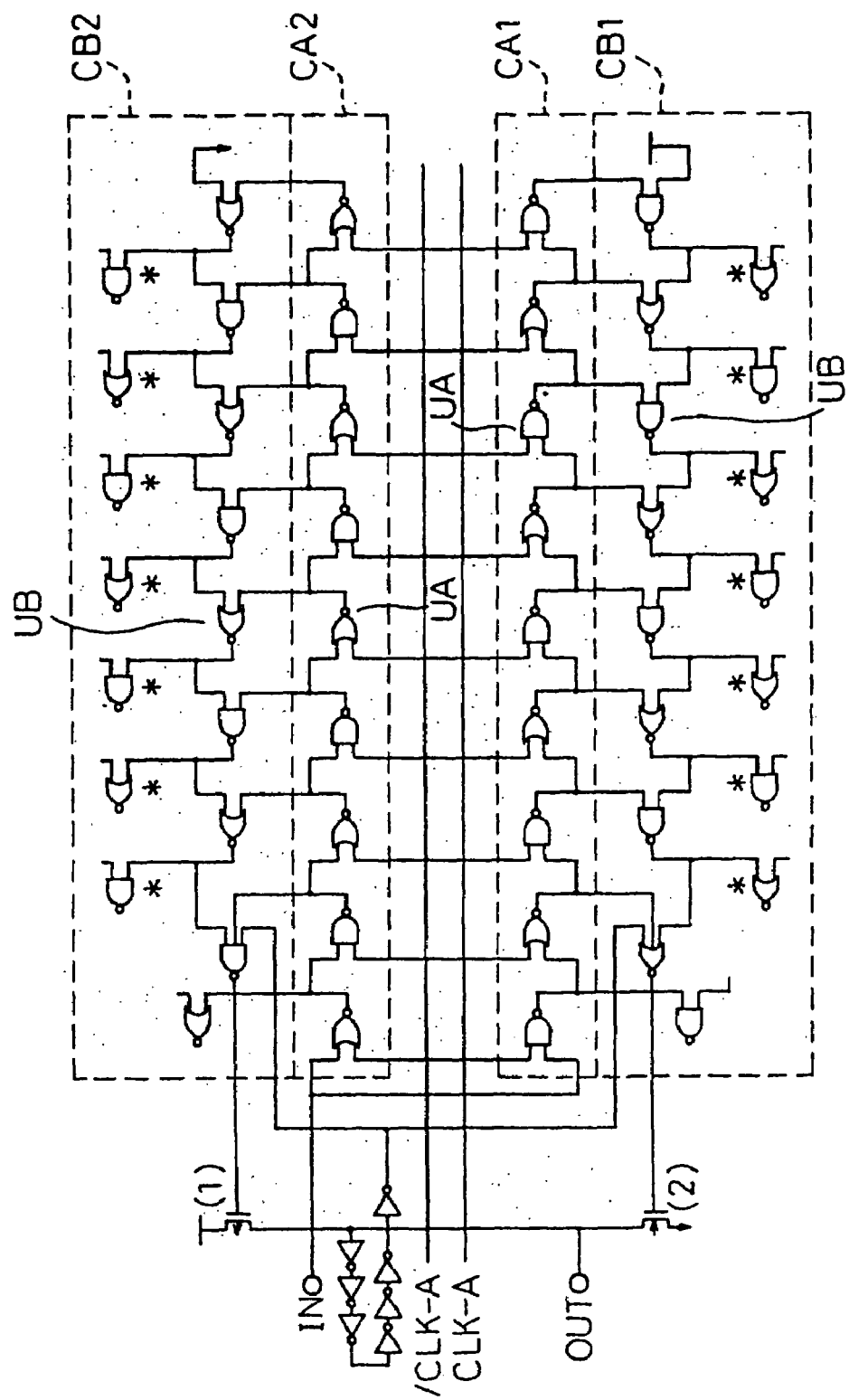
FIG. 36 is a circuit diagram showing a third embodiment of a controlled delay circuit according to the present invention.
Figure 37:
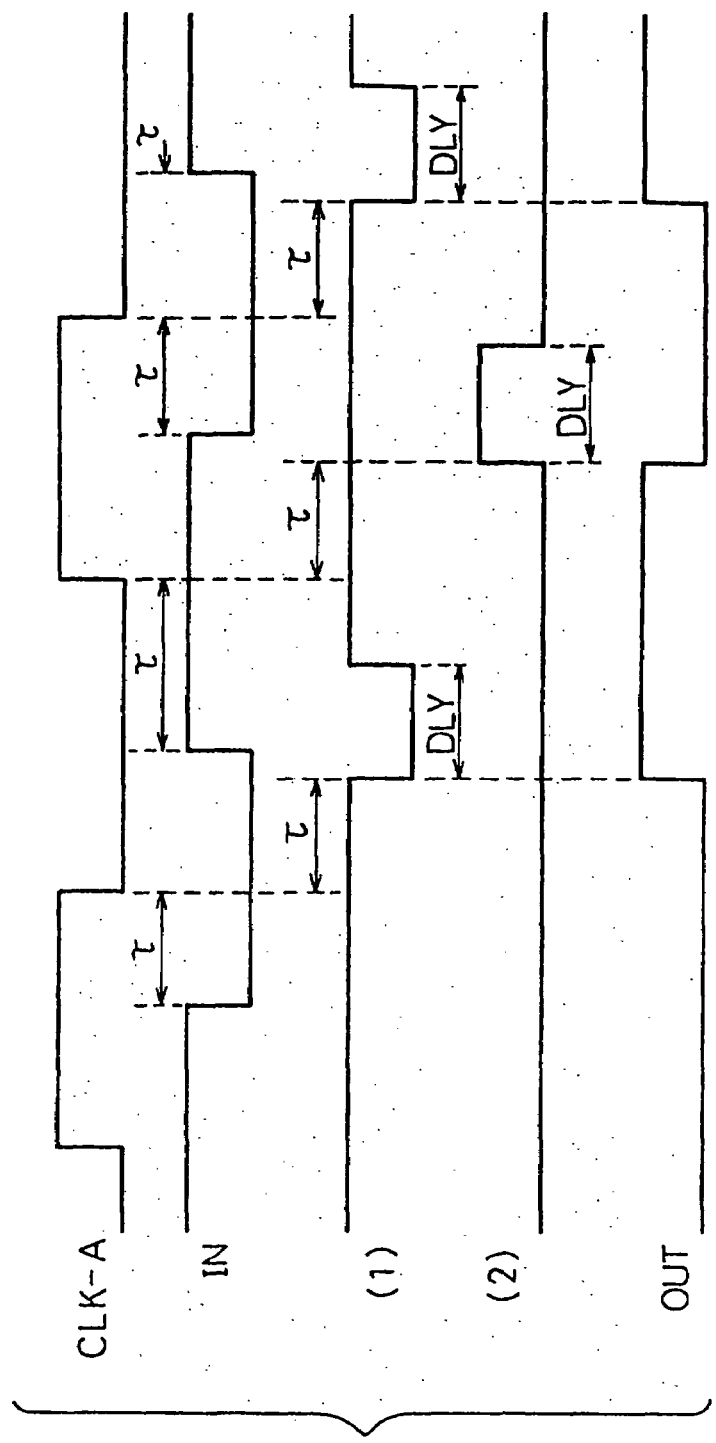
FIG. 37 is a timing chart for explaining operations of the controlled delay circuit of FIG. 36.

FIG. 36 shows a third embodiment of a controlled delay circuit according to the present invention, and FIG. 37 is a timing chart for explaining operations of the controlled delay circuit of FIG. 36.

As shown in FIG. 36, the controlled delay circuit of the third embodiment comprises two first converter circuits CA1 and CA2, and two second converter circuits CB1 and CB2. The first gate step information (N-bit) of the first unit circuits UA of each first converter circuit CA1 (CA2) is directly supplied to the second unit circuits UB of each second converter circuit CB1 (CB2), and the delay time of the second converter circuit CB1 (CB2) is adjusted to that of the first converter circuit CA1 (CA2).

Note that, in the second converter circuit (one of the two second converter circuits) CB1, a first stage (first step) of the unit circuits UB is NOR type unit circuit, conversely, in the second converter circuit (another of the two second converter circuits) CB2, a first stage of the unit circuits UB is NAND type unit circuit. Further, as shown in FIG. 37, the controlled delay circuit of the third embodiment outputs an output signal (OUT) having a delay time $2\tau$ (two times the first time difference $\tau$).

Figure 38A:
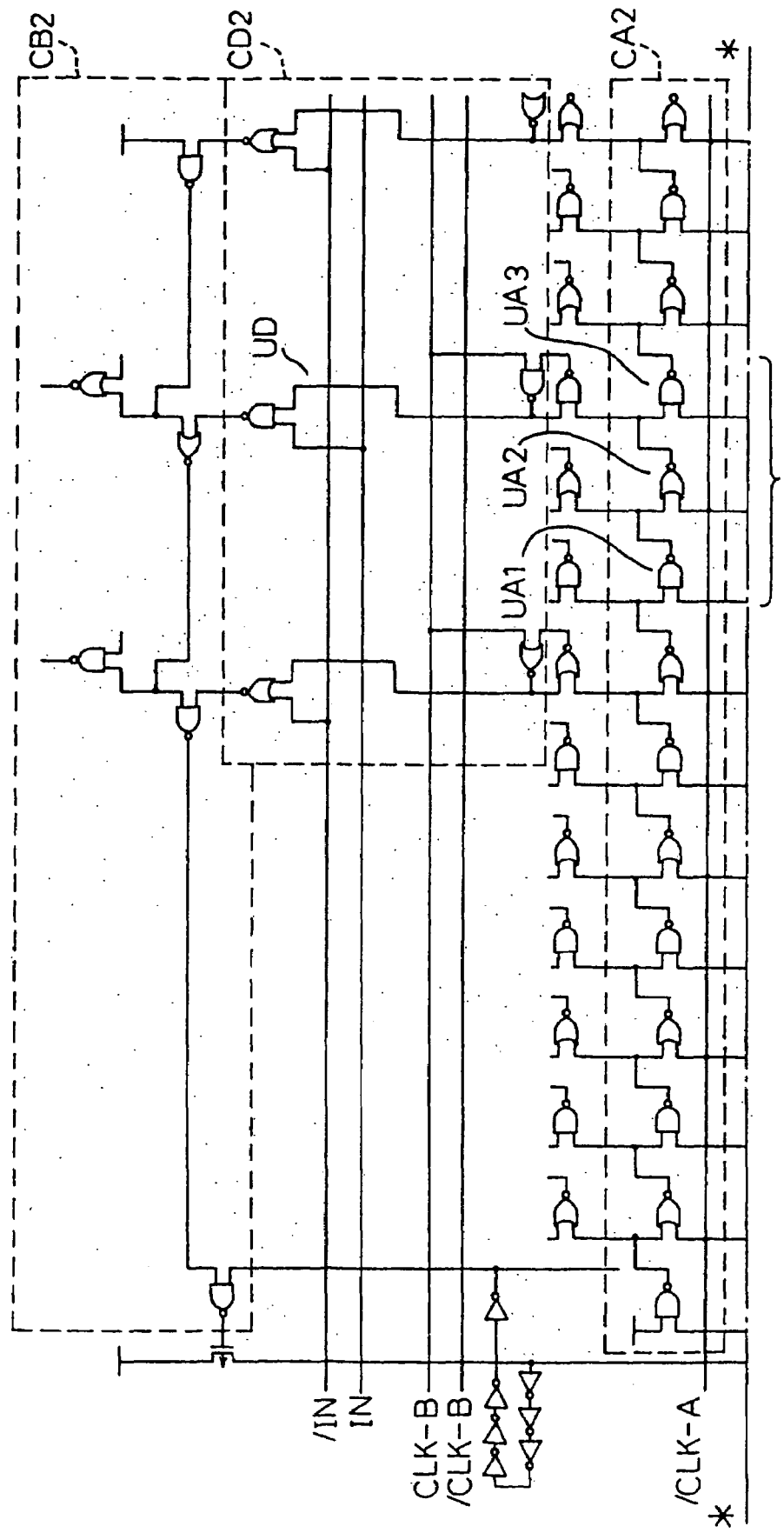
FIGS. 38A and 38B are circuit diagrams showing a fourth embodiment of a controlled delay circuit according to the present invention.
Figure 38B:
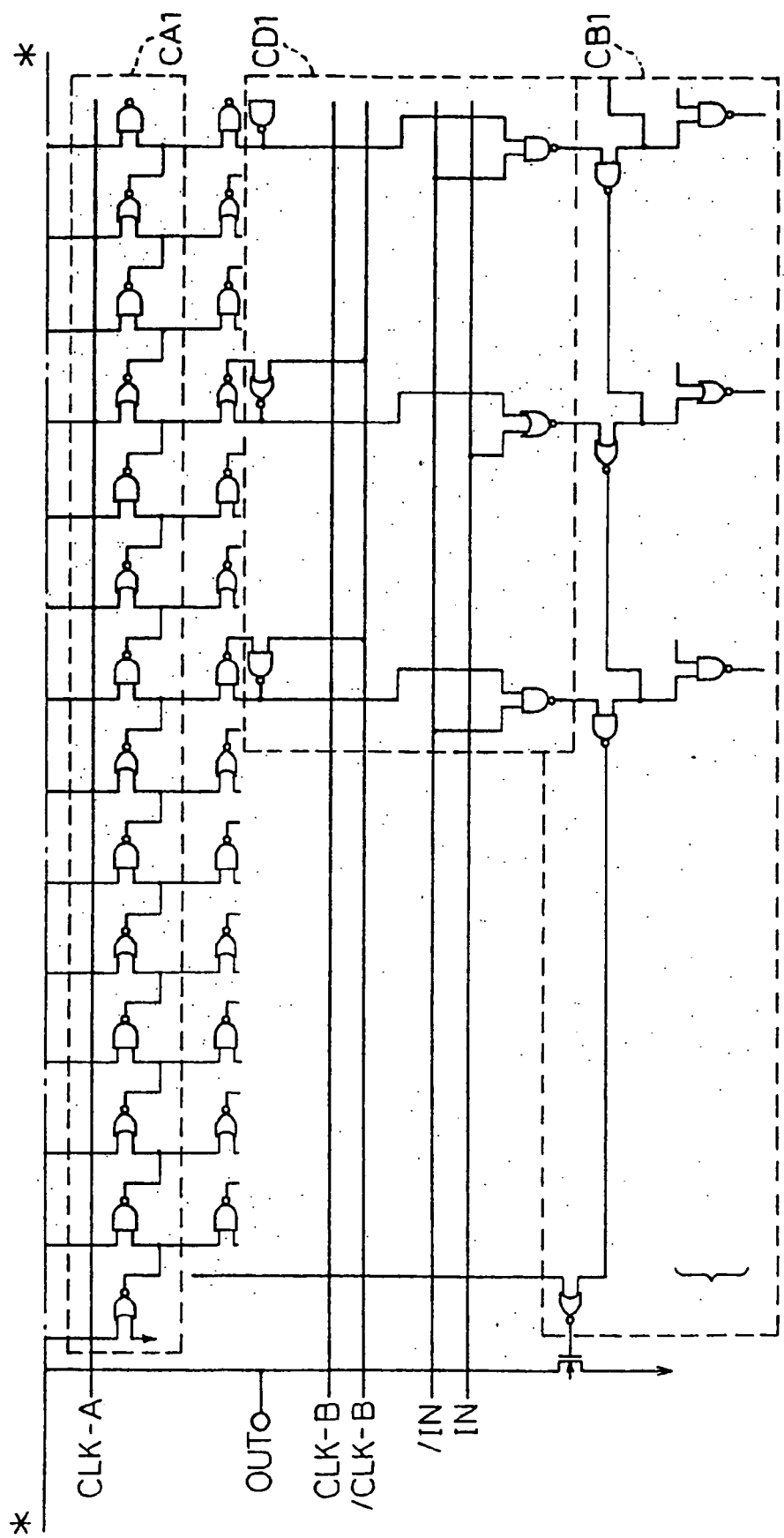
Figure 39:
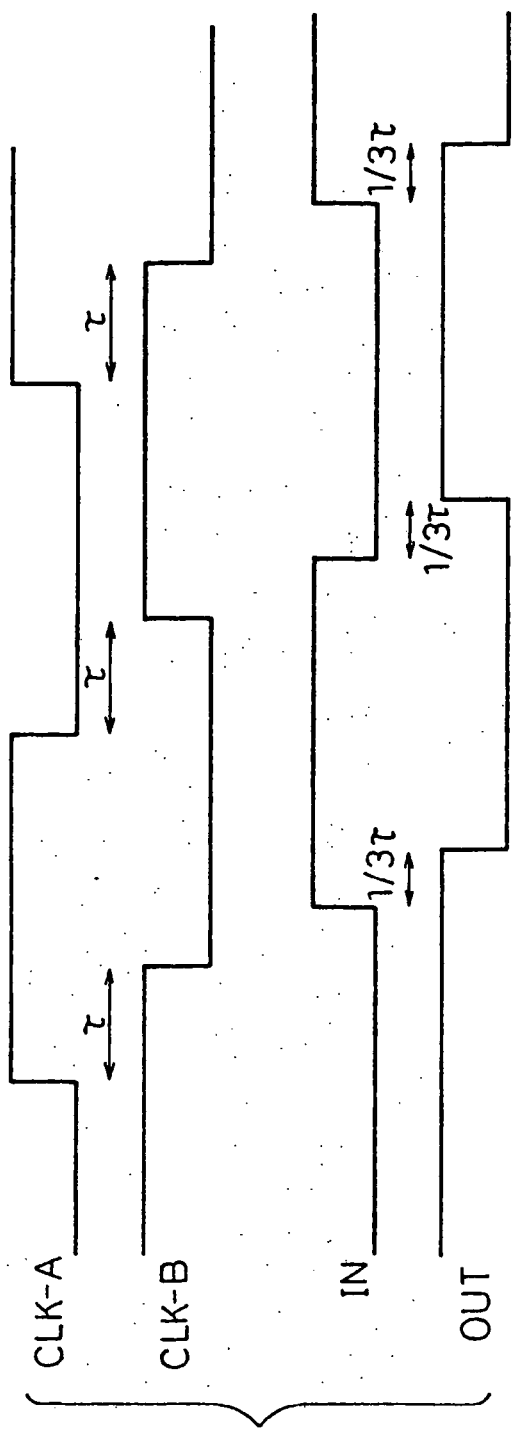
FIG. 39 is a timing chart for explaining operations of the controlled delay circuit of FIGS. 38A and 38B.

FIGS. 38A and 38B show a fourth embodiment of a controlled delay circuit according to the present invention, and FIG. 39 is a timing chart for explaining operations of the controlled delay circuit of FIGS. 38A and 38B.

In the controlled delay circuit of the fourth embodiment, a gate step information converter circuit CD1 (CD2) is inserted between the first converter circuit CA1 (CA2) and the second converter circuit CB1 (CB2). Note that, the gate step information converter circuit CD1 (CD2) supplies data from every "M"th (in this fourth embodiment, every third) of the first unit circuits UA of the first converter circuit CA1 (CA2) to the second unit circuits UB of the second converter circuit CB1 (CB2), to set the delay time of the second converter circuit CB1 (CB2) to 1/M (in this fourth embodiment, ⅓) of that of the first converter circuit CA1 (CA2).

Concretely, as shown in FIGS. 38A and 38B, in the controlled delay circuit of the fourth embodiment, one unit circuit (UD) of the gate step information converter circuit CD2 is provided for three unit circuits UA1, UA2, and UA3 of the first converter circuit CA2. Consequently, as shown in FIG. 39, the delay time included in the output signal OUT is determined to be $\tau/3$ (⅓ of the first time difference $\tau$).

Namely, according to this embodiment, an output signal including a required delay time ($\tau/M$) can be obtained. Further, the gate step information converter circuit CD (CD1, CD2) can supply data from one of the first unit circuits UA, to M pieces of the second unit circuits UB, to set the delay time of the second converter circuit CB (CB1, CB2) to M times as long as that of the first converter circuit CA (CA1, CA2).

Figure 40A:
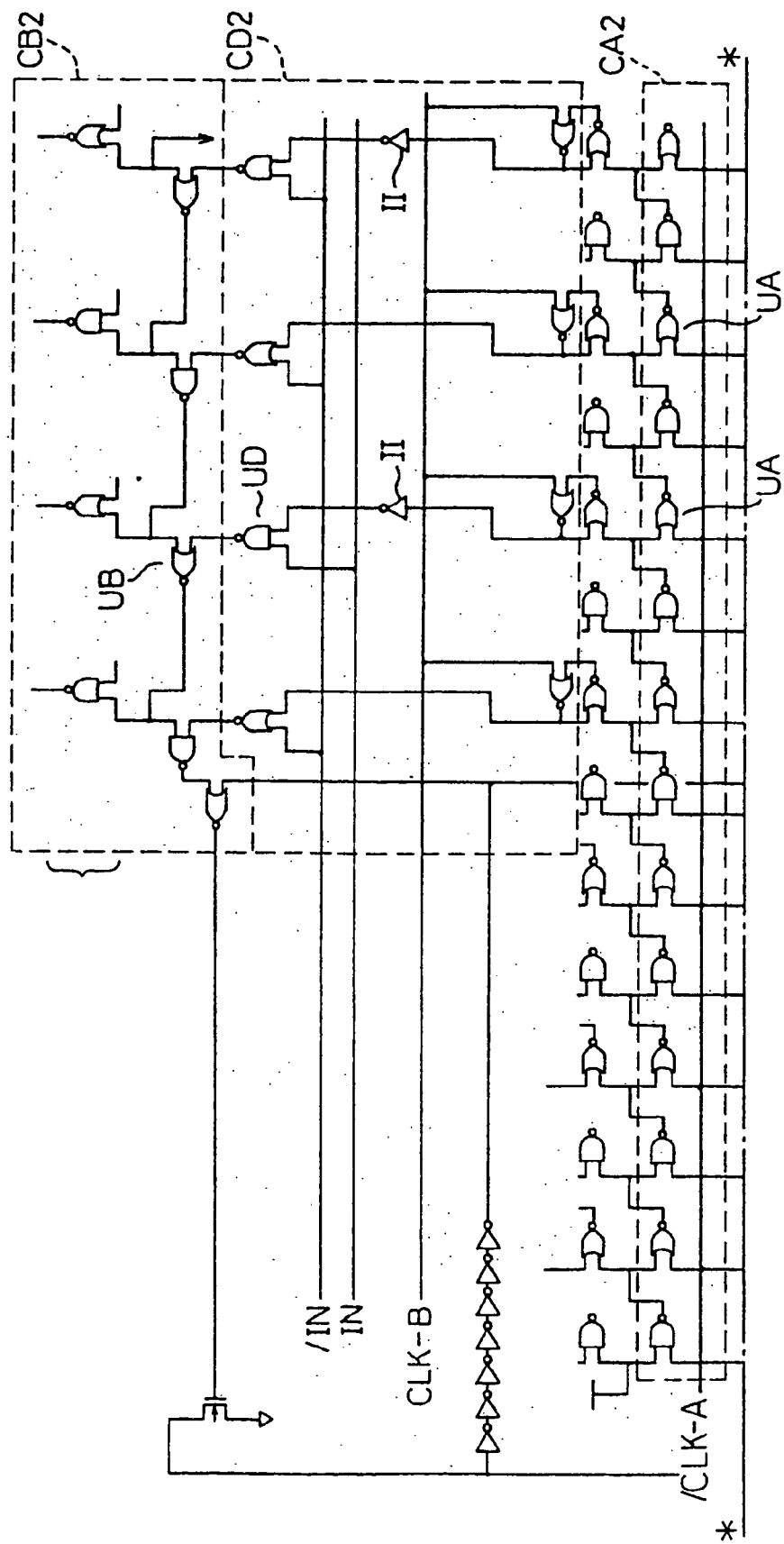
FIGS. 40A and 40B are circuit diagrams showing a fifth embodiment of a controlled delay circuit according to the present invention.
Figure 40B:
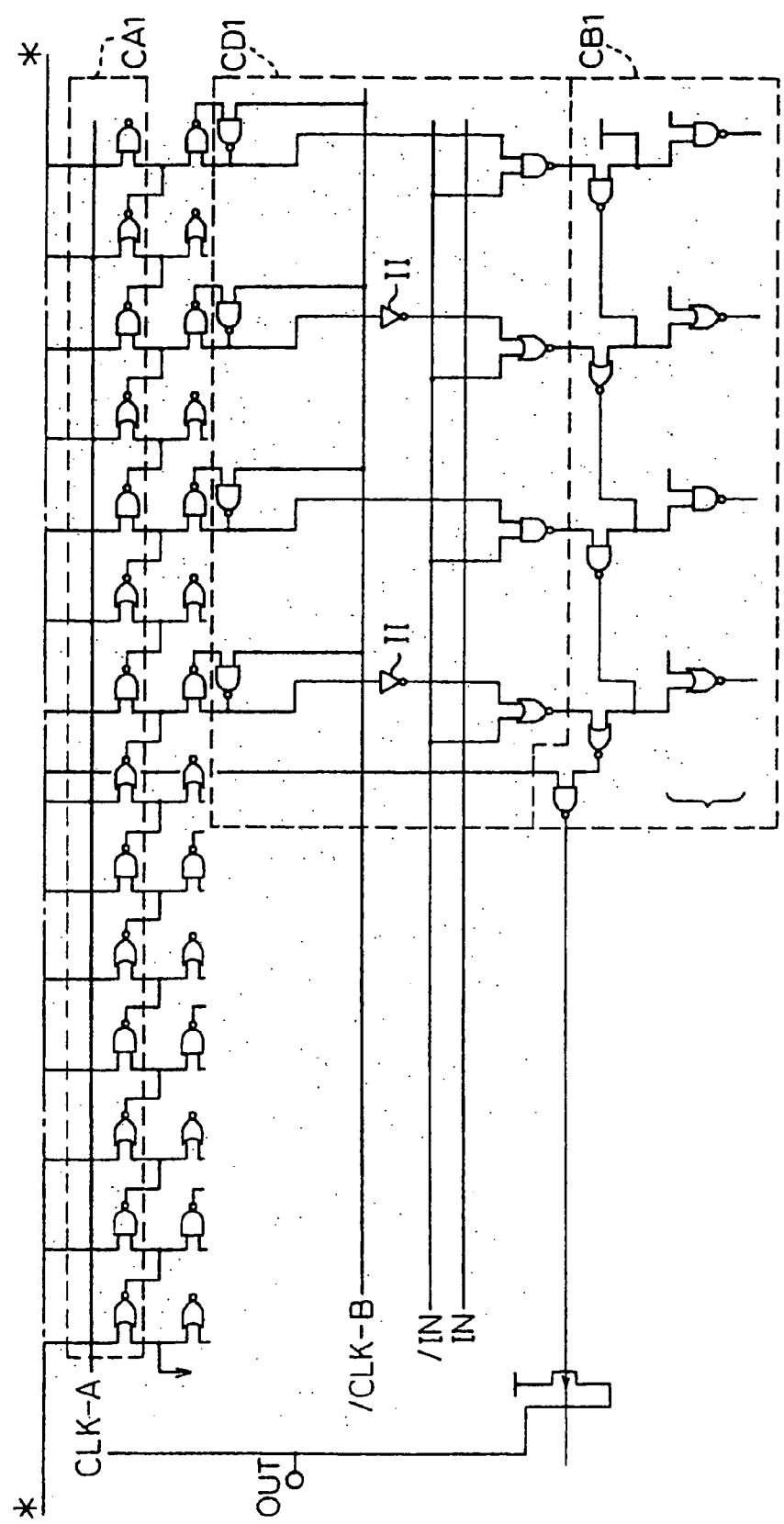
Figure 41:
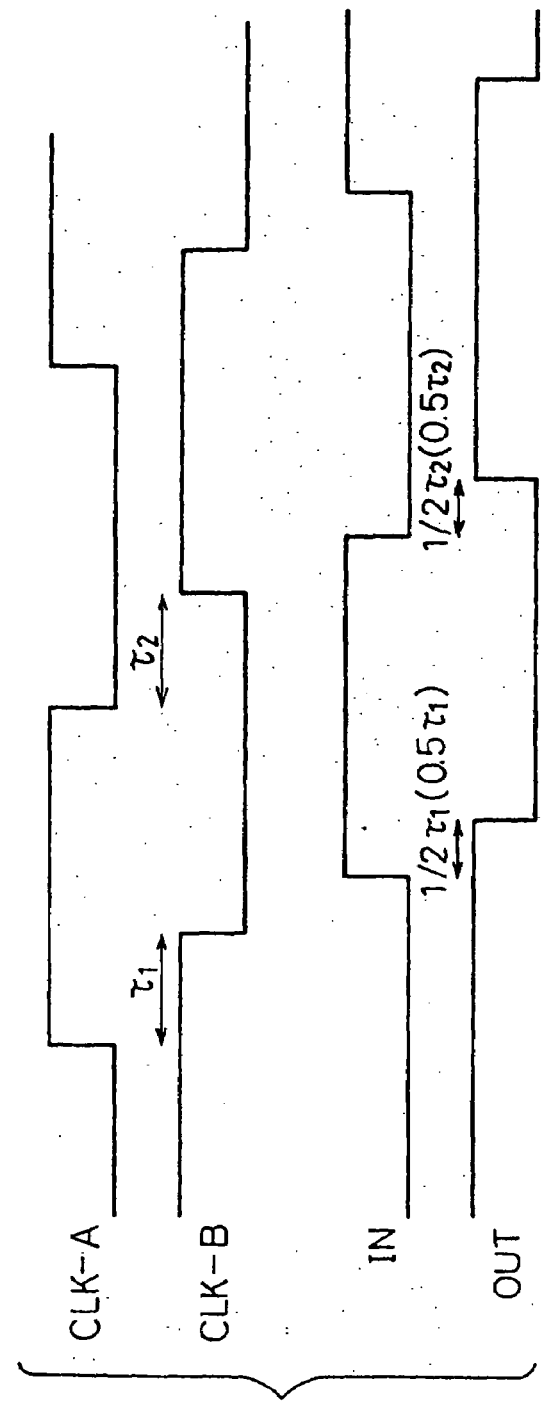
FIG. 41 is a timing chart for explaining operations of the controlled delay circuit of FIGS. 40A and 40B.

FIGS. 40A and 40B show a fifth embodiment of a controlled delay circuit according to the present invention, and FIG. 41 is a timing chart for explaining operations of the controlled delay circuit of FIGS. 40A and 40B.

As shown in FIGS. 40A to 41, in the controlled delay circuit of the fifth embodiment, the unit circuit (UD) of the gate step information converter circuit CD1 (CD2) is provided for two unit circuits (UA) of the first converter circuit CA1 (CA2). In this case, a specific number (odd number) of inverter circuits (in this fifth embodiment, one inverter circuit) II is provided for each input of the unit circuit of the gate step information converter circuit CD1 (CD2). Namely, one inverter circuit II is alternately provided for the unit circuits of the gate step information converter circuit.

Further, as shown in FIGS. 40A to 41, in fifth embodiment, the two first converter circuits CA1 and CA2 are provided to separately set a delay time of a rise of the first input signal CLK-A in the first converter circuit CA1 and a delay time of a fall of the first input signal CLK-A in the other first converter circuit CA2.

Namely, as shown in FIG. 41, time differences $\tau 1$ and $\tau 2$ can be separately set. The time difference $\tau 1$ is determined when the second input signal CLK-B is changed from a high level "H" to a low level "L" during the first input signal CLK-A is maintained at a high level "H", and the time difference $\tau 2$ is determined when the second input signal CLK-B is changed from a low level "L" to a high level "H" during the first input signal CLK-A is maintained at a low level "L". Further, in this fifth embodiment, the delay times included in the output signal OUT are determined to be $\tau 1/2 (0.5*\tau 1)$ and $\tau 2/2 (0.5*\tau 2)$. The delay time $0.5*\tau 1$ is a delay time when the output signal OUT is changed from a high level "H" to a low level "L", and the delay time $0.5*\tau 2$ is a delay time when the output signal OUT is changed from a low level "L" to a high level "H". Note that, in this fifth embodiment, the output signal OUT is inverted from the input signal (third input signal) IN, but these signal levels are changed in accordance with the circuit configurations (logic circuit configurations) of the first and second converters, gate step information converter circuit, and the like.

Figure 42A:
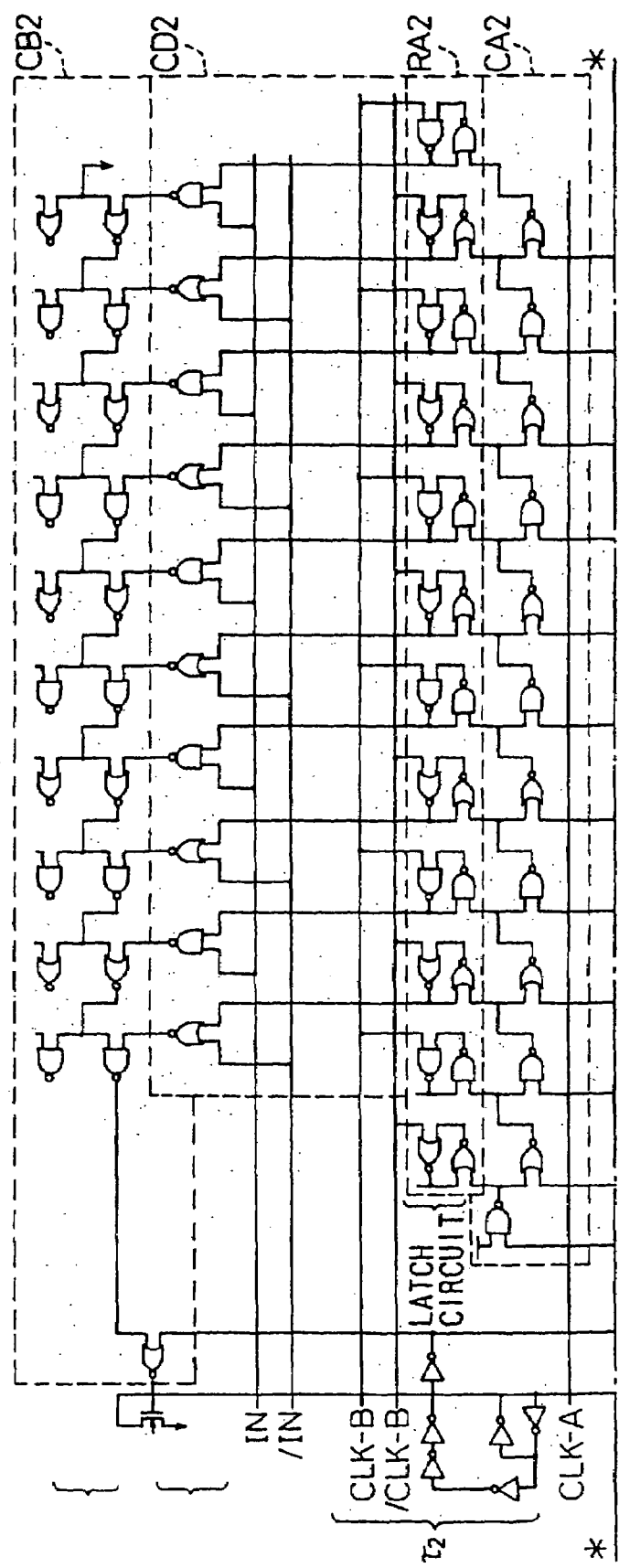
FIGS. 42A and 42B are circuit diagrams showing a sixth embodiment of a controlled delay circuit according to the present invention.
Figure 42B:
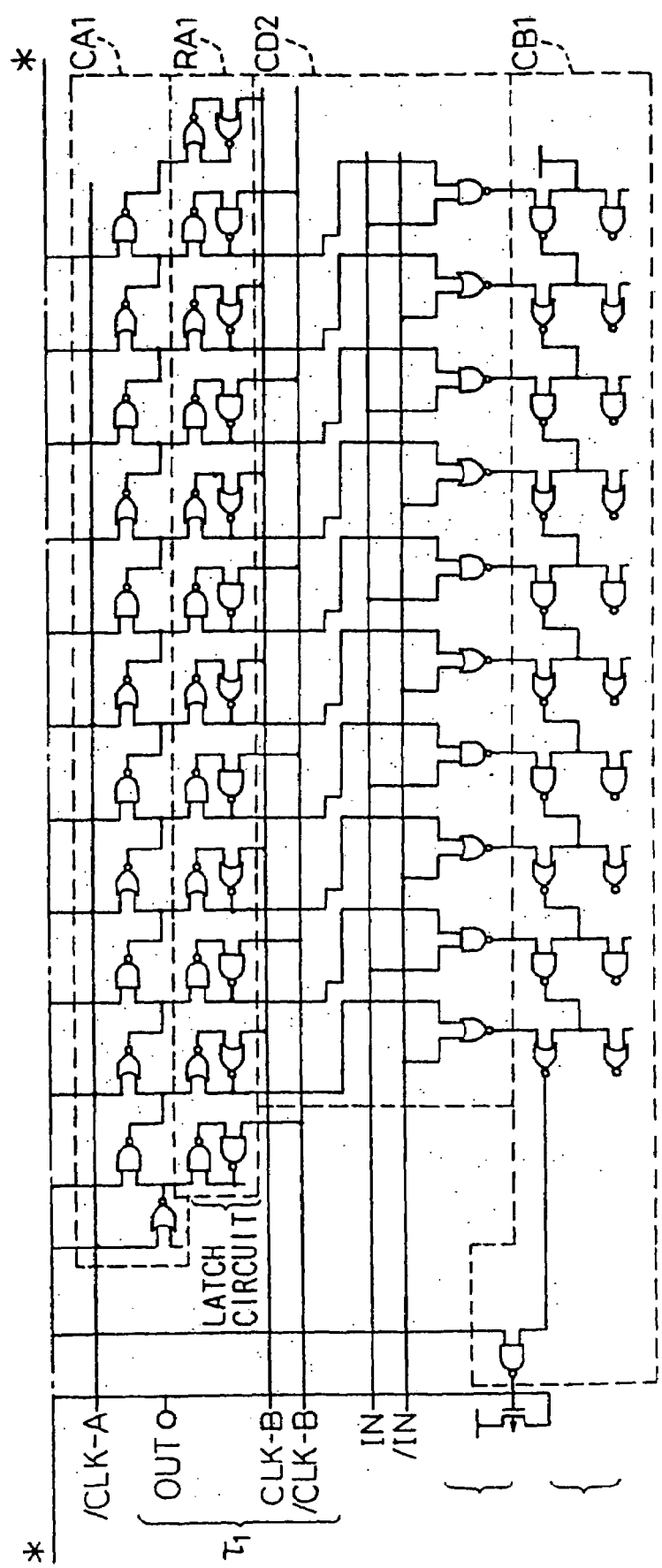
Figure 43:
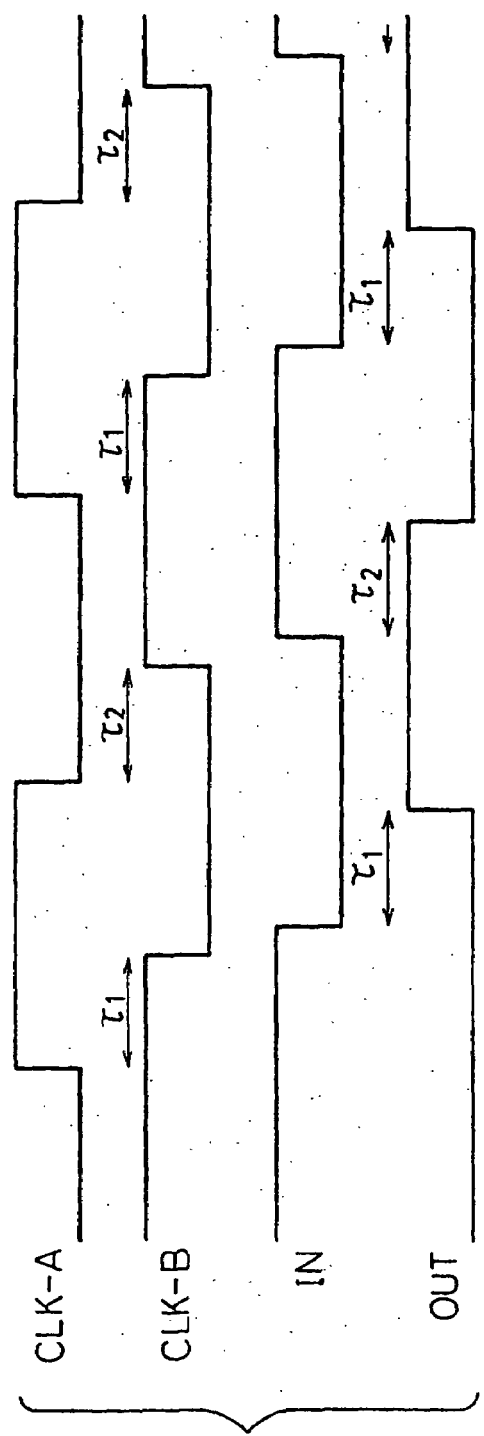
FIG. 43 is a timing chart for explaining operations of the controlled delay circuit of FIGS. 42A and 42B.

FIGS. 42A and 42B show a sixth embodiment of a controlled delay circuit according to the present invention, and FIG. 43 is a timing chart for explaining operations of the controlled delay circuit of FIGS. 42A and 42B.

As shown in FIGS. 42A and 42B, even and odd unit circuits in the first converter circuit CA1 (CA2) are alternately NAND and NOR unit circuits, and even unit circuits for producing a delay time of a rise of a signal and odd unit circuits for producing a delay time of a fall of the signal in the second converter circuit CB1 (CB2) are alternately NAND and NOR unit circuits with the arrangement of the NAND and NOR unit circuits for the rise delay time being opposite to that of the NAND and NOR unit circuits for the fall delay time. Note that the time difference τ1 is determined when the second input signal CLK-B is changed from a high level "H" to a low level "L" during the first input signal CLK-A is maintained at a high level "H", and the time difference τ2 is determined when the second input signal CLK-B is changed from a low level "L" to a high level "H" during the first input signal CLK-A is maintained at a low level "L". Further, output data (first gate step information (N-bit)) of the first converter circuit CA1 (CA2) are temporary stored (latched) in the latch circuit RA1 (RA2). Therefore, as shown in FIG. 43, an output signal OUT having delay times (rise delay time and fall delay time) τ1 and τ2 can be obtained.

Namely, in the sixth embodiment shown in FIGS. 42A to 43, the first converter circuit CA1 converts a time difference (τ1) between a rise of the first input signal CLK-A and a changeover point of the second input signal CLK-B into gate step information indicating the number of gates, and the other first converter circuit. CA2 converts a time difference (τ2) between a fall of the first input signal CLK-A and a changeover point of the second input signal CLK-B into gate step information indicating the number of gates. A delay time of a rise of the third input signal IN supplied to the second converter circuit CB (CB1, CB2) and a delay time of a fall of the third input signal IN are separately determined according to the two pieces of gate step information.

Further, the oscillation frequency of the third input signal IN can be changed in accordance with the gate step information indicating the number of gates.

Figure 44A:
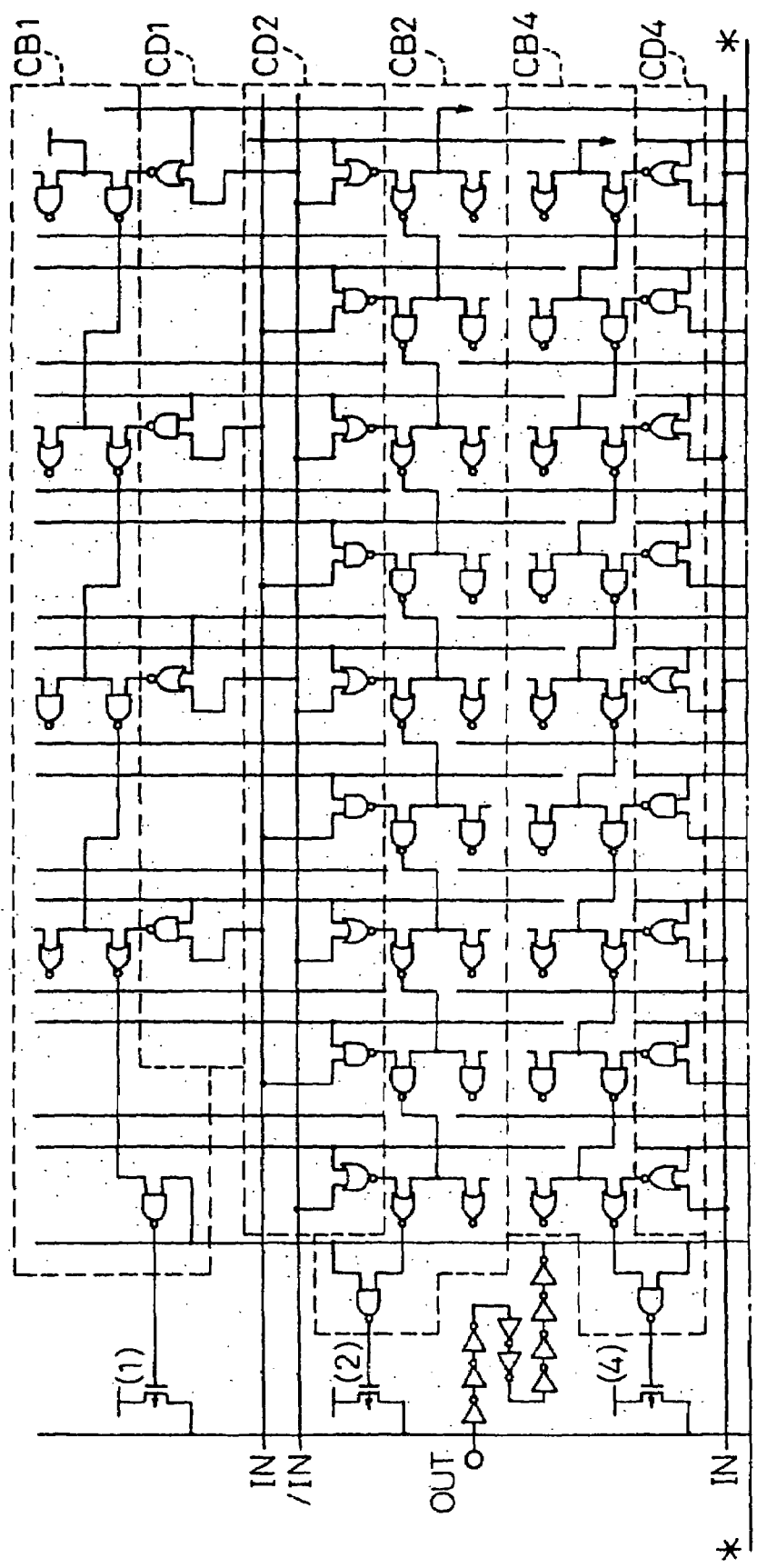
FIGS. 44A and 44B are circuit diagrams showing a seventh embodiment of a controlled delay circuit according to the present invention.
Figure 44B:
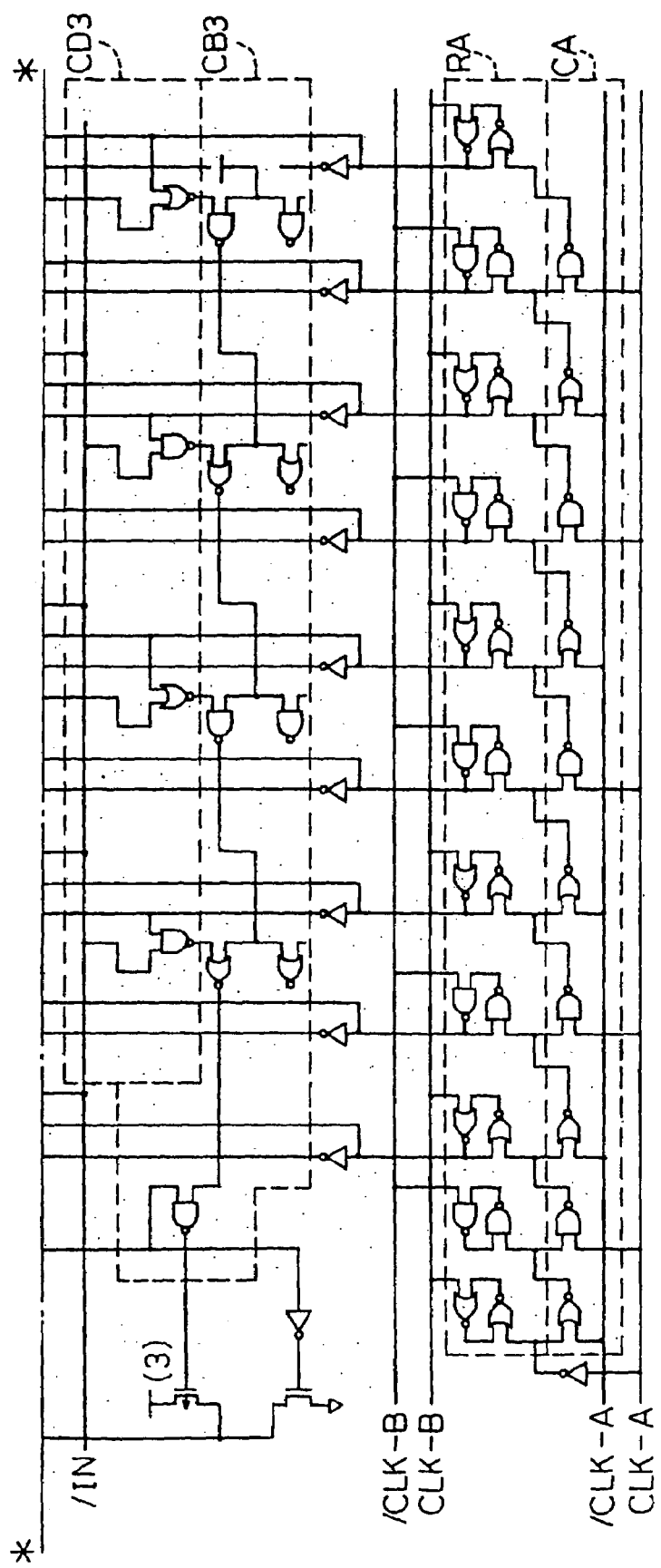
Figure 45:
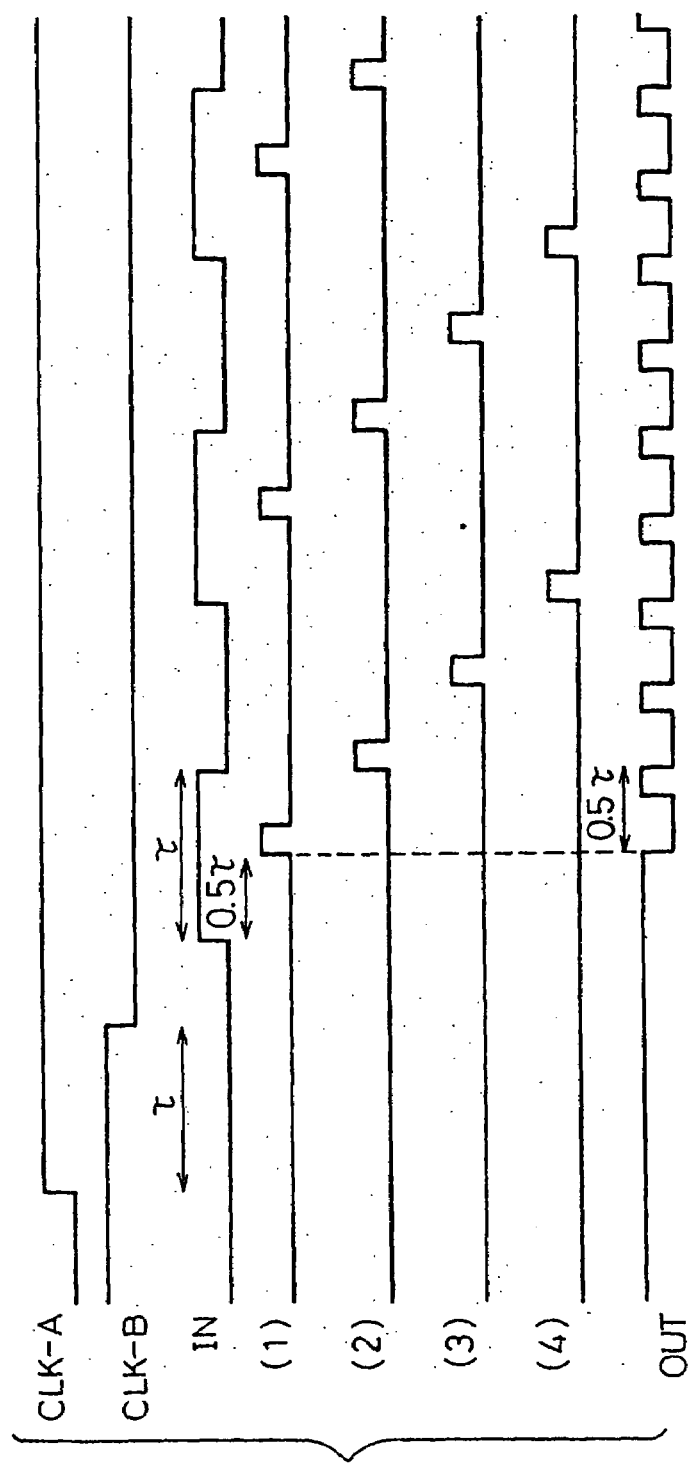
FIG. 45 is a timing chart for explaining operations of the controlled delay circuit of FIGS. 44A and 44B.

FIGS. 44A and 44B show a seventh embodiment of a controlled delay circuit according to the present invention, and FIG. 45 is a timing chart for explaining operations of the controlled delay circuit of FIGS. 44A and 44B.

In the controlled delay circuit of the seventh embodiment shown in FIGS. 44A and 44B, a plurality of second converter circuits CB1 to CB4 are provided in order to separately provide pieces of delay time for a rise and fall of the second input signal CLK-B, to increase the oscillation frequency of the third input signal (IN) by a multiple. Further, the plurality of second converter circuits CB1 to CB4 are used to separately provide pieces of delay time for a rise and fall of the second input signal CLK-B, to change the oscillation frequency of the third input signal IN.

Namely, as shown in FIG. 45, in the seventh embodiment, the frequency of the input signal (third input signal) IN is changed (increased to four times) by logically combining signals of the nodes (1) to (4). Further, in this seventh embodiment, the delay time included in the output signal OUT is determined to a half (τ/2) of the first time difference T.

Figure 46:
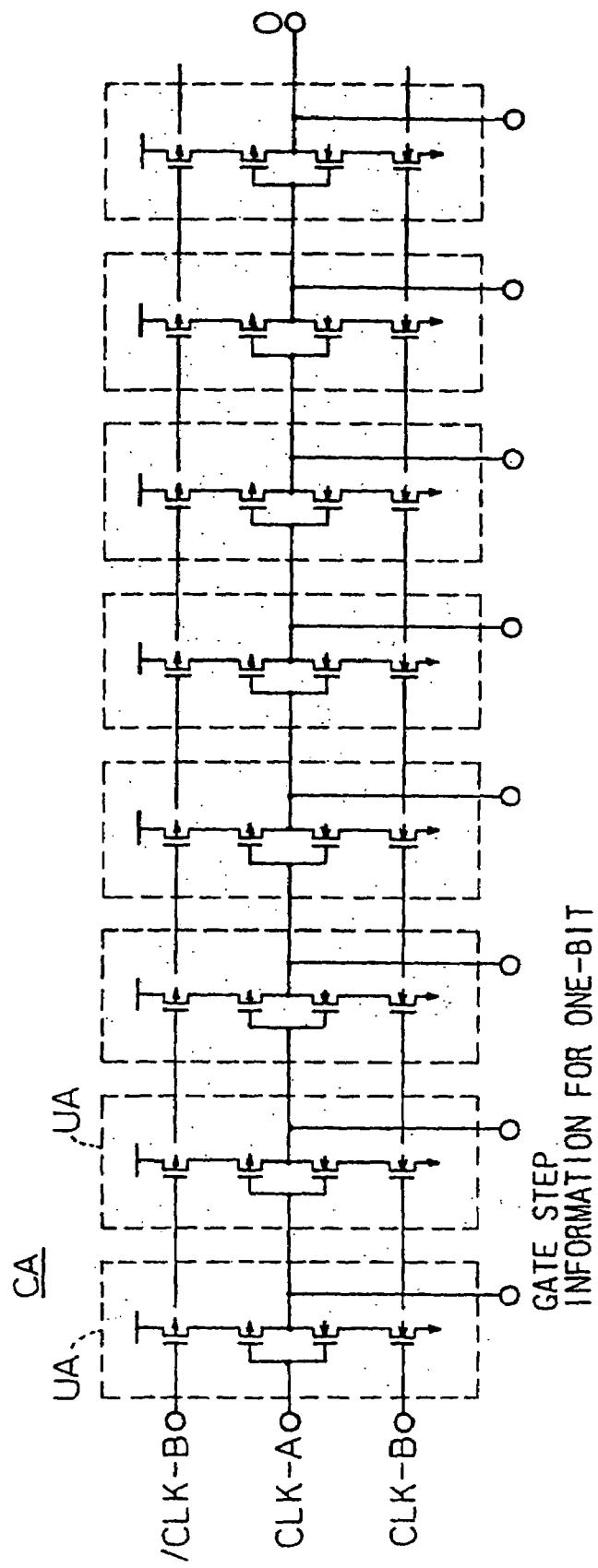
FIG. 46 is a circuit diagram showing an example of an array configuration applied to the controlled delay circuit according to the present invention.
Figure 47:
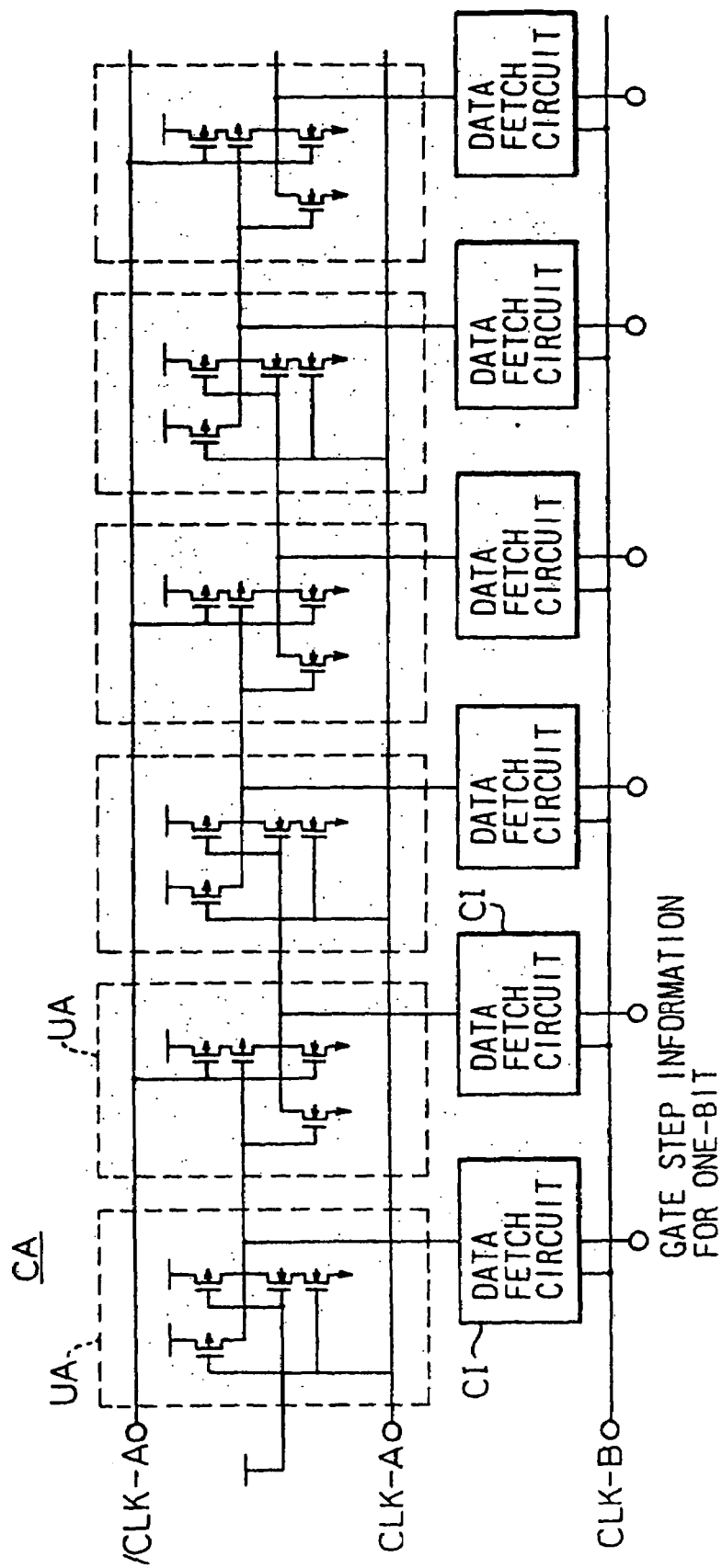
FIG. 47 is a circuit diagram showing another example of an array configuration applied to the controlled delay circuit according to the present invention.

FIG. 46 shows an example of an array configuration applied to the controlled delay circuit according to the present invention, and FIG. 47 shows another example of an array configuration applied to the controlled delay circuit according to the present invention. Note that the array configurations of FIGS. 46 and 47 show examples of the first converter circuit CA.

As shown in FIG. 46, the first stage (step) of the unit circuits UA of the first converter circuit CA is supplied with a first input signal CLK-A to start the transferring operation of the first converter circuit CA.

By comparing the unit circuit shown in FIG. 47 with that shown in FIGS. 34A and 34B, the first input signal CLK-A can be supplied as a reset signal (RESET) to the first unit circuits UA, to put a delay forming gate in each of the first unit circuits UA in a reset state or an inverted state. Note that, in the first converter circuit CA of FIG. 47, an input of the first stage of the unit circuits UA is fixed at a high level "H", and the transferring operation of the first converter circuit CA is started when the first input signal CLK-A specifies the inverted state. Namely, an input to the first one of the first unit circuits UA is set to a fixed level, and when the first input signal CLK-A specifies the inverted state, the first converter circuit CA starts signal transmission.

Figure 48:
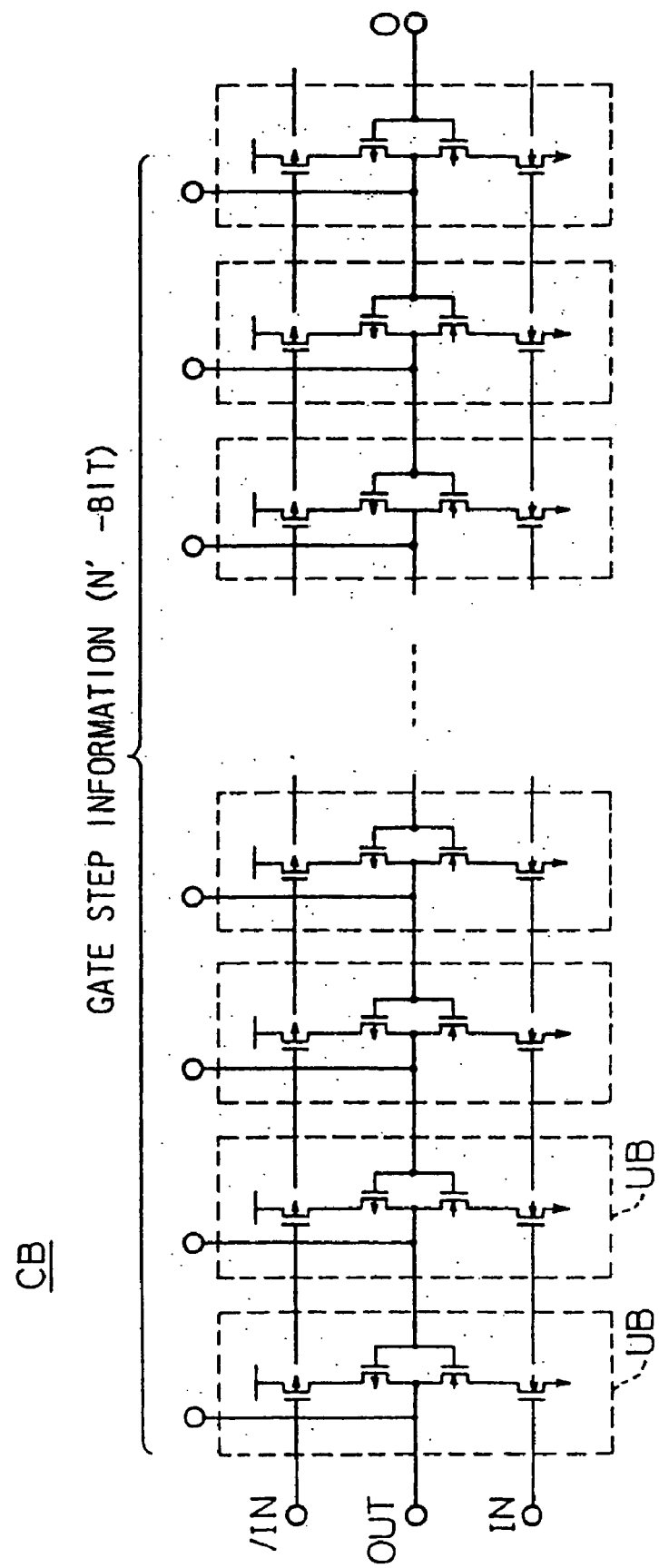
FIG. 48 is a circuit diagram showing still another example of an array configuration applied to the controlled delay circuit according to the present invention.
Figure 49:
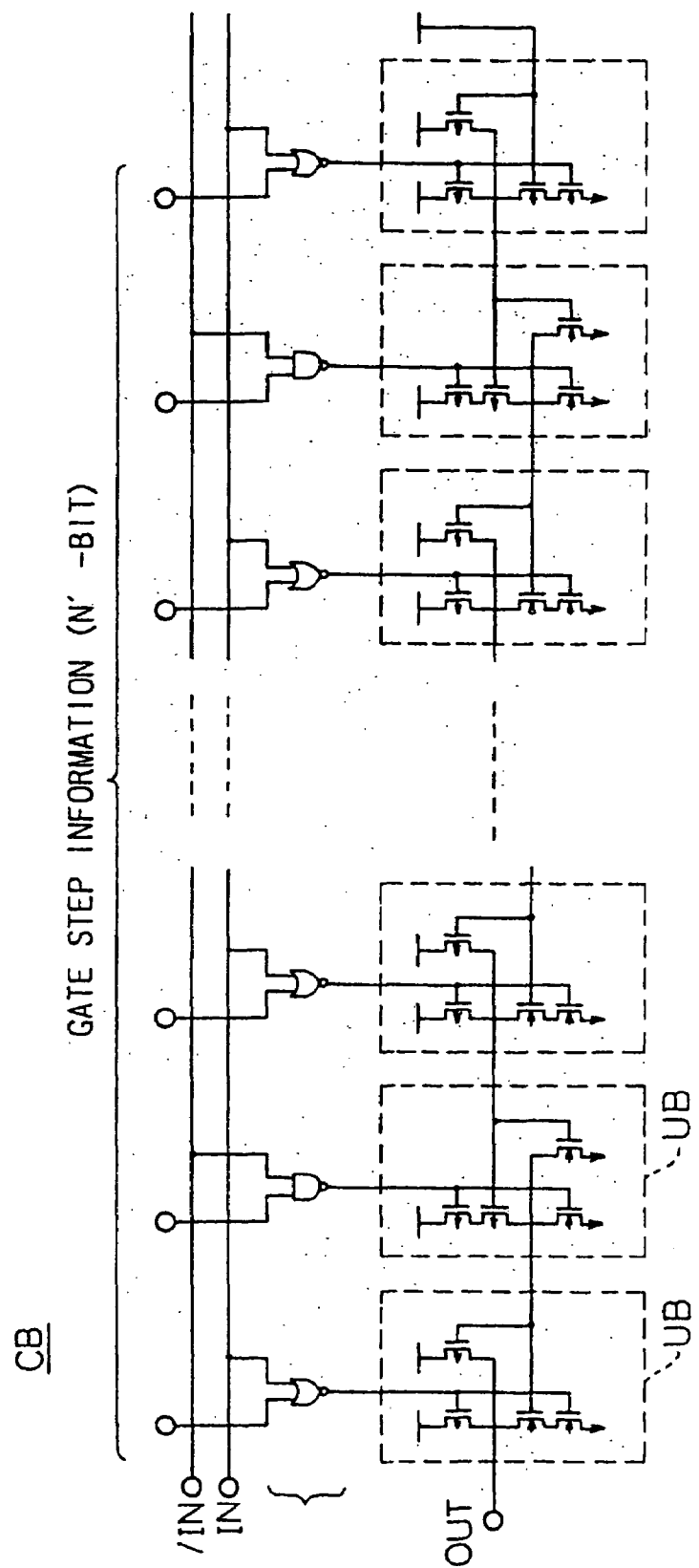
FIG. 49 is a circuit diagram showing still another example of an array configuration applied to the controlled delay circuit according to the present invention.

FIGS. 48 and 49 show still another examples of an array configuration applied to the controlled delay circuit according to the present invention, and the array configurations of FIGS. 48 and 49 show examples of the second converter circuit CB.

As shown in FIGS. 48 and 49, the second converter circuit CB receives the second gate step information (N'-bit) and converts into a second time difference (τ') which corresponds to a delay time included in the output signal OUT.

As described above, with reference to FIGS. 31 to 35 and FIGS. 40 to 53, the first stage of the second unit circuits UB includes an inverter delay circuit. Further, the first stage of the second unit circuits UB can be constituted to clamp an input to invert the second gate step information (N'-bit) if the time difference (τ) is longer than the delay time of the first converter circuit CA. In addition, the first stage of the second unit circuits UB can be constituted to clamp an input so that the delay circuit in the first stage of the second unit circuits may serve as an inverter.

Further, the first and second input signals CLK-A, CLK-B can be periodically supplied to the first converter circuit CA at intervals of M changeover points (for example, 8 or 16 changeover points), to reproduce the second gate step information (N'-bit). In this configuration, when a master clock is fluctuated, the delay time included in the output signal OUT can be maintained at a specific value. In addition, the reproduced second gate step information (N1-bit) can be reset when the second converter circuit CB does not transmit the third input signal IN, in order to avoid an obstruction for the transferring operation of the converter circuits (CA, CB).

Figure 50B:
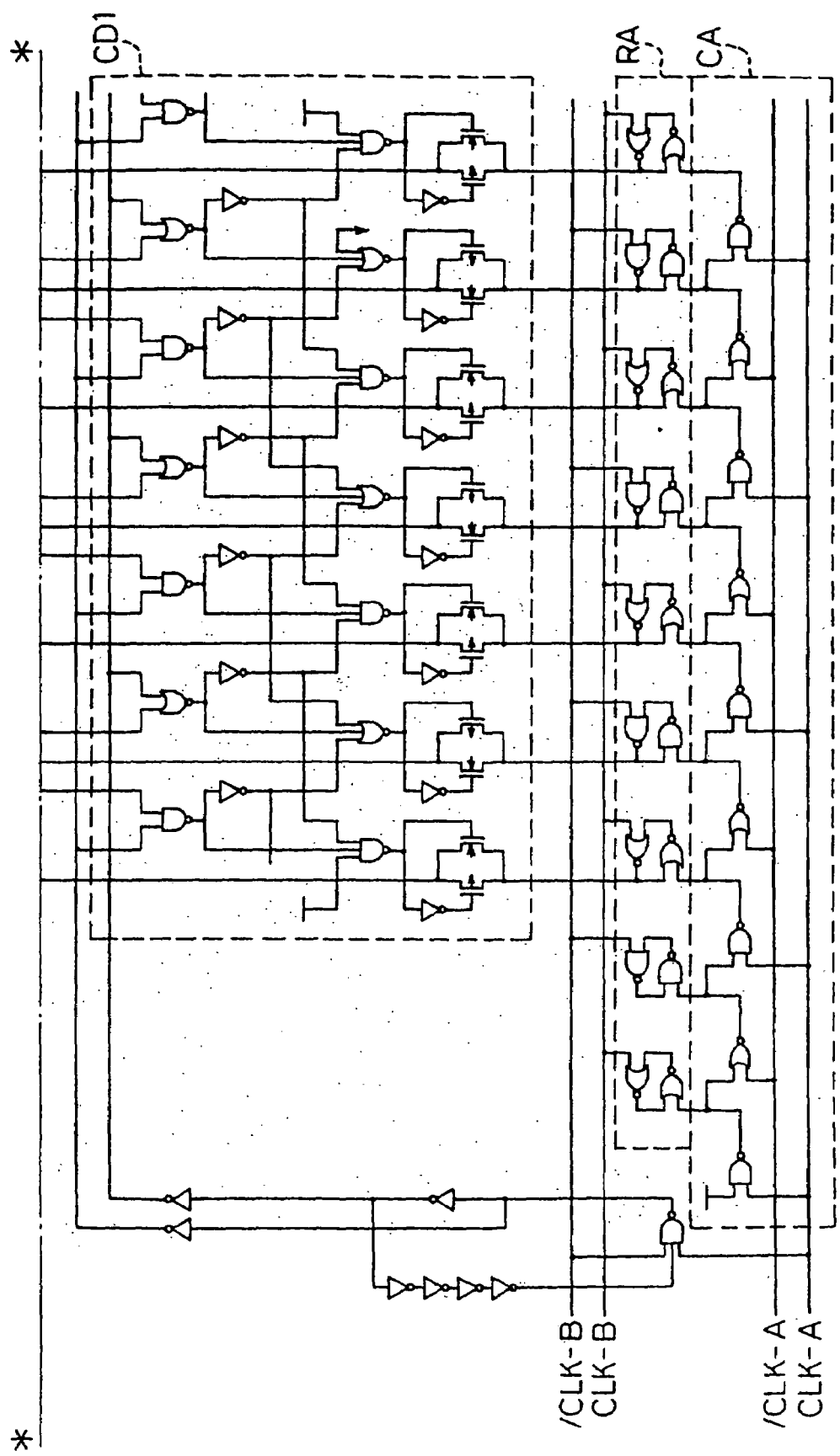
Figure 51:
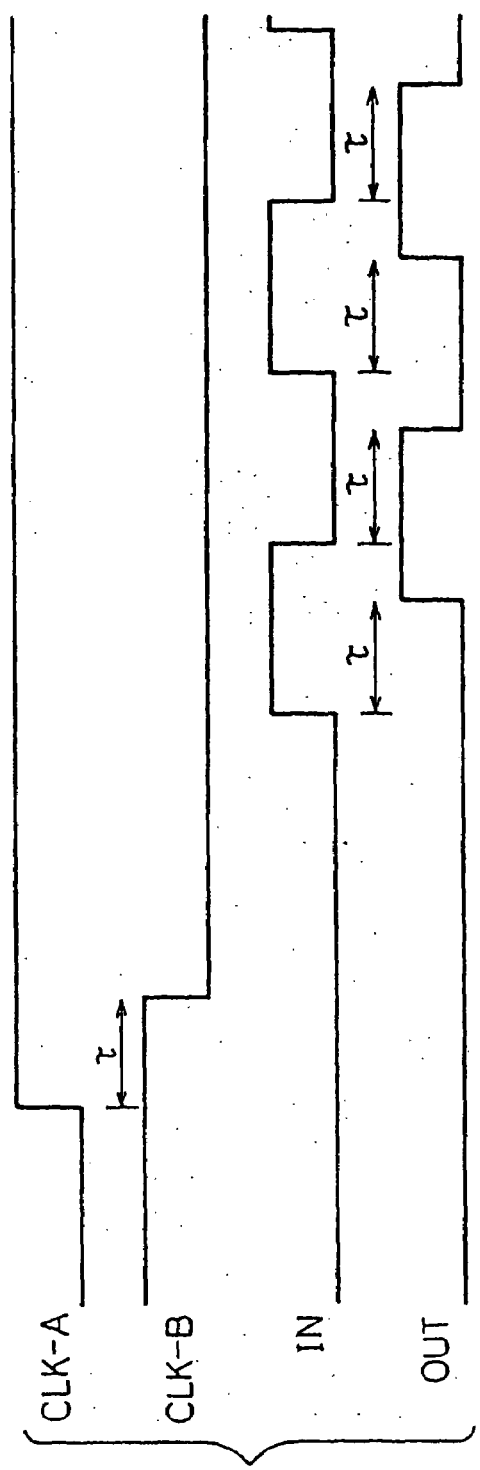
FIG. 51 is a timing chart for explaining operations of the controlled delay circuit of FIGS. 50A and 50B.

FIGS. 50A and 50B show an eighth embodiment of a controlled delay circuit according to the present invention, and FIG. 51 is a timing chart for explaining operations of the controlled delay circuit of FIGS. 50A and 50B. In FIGS. 50A and 50B, a reference CD' denotes a delay time fluctuation control circuit.

As shown in FIGS. 50A and 50B, in the eighth embodiment, a change between new and old values of the second gate step information (N'-bit) is set below a given value, to gradually change the delay time. Namely, in the eighth embodiment, the delay time fluctuation control circuit CD' receives new (present) outputs and old (previous) outputs of the first unit circuits UA of the first converter circuit CA, and output the reproduced second gate step information (N'-bit) whose change value is determined lower than a predetermined value (for example, three bit). Further, the operation of reproducing the second gate step information (N'-bit) are shown in FIG. 51. Namely, FIG. 51 shows that the delay time (τ) is determined from each changeover points (rise and fall points) of the input signal IN.

Figure 52A:
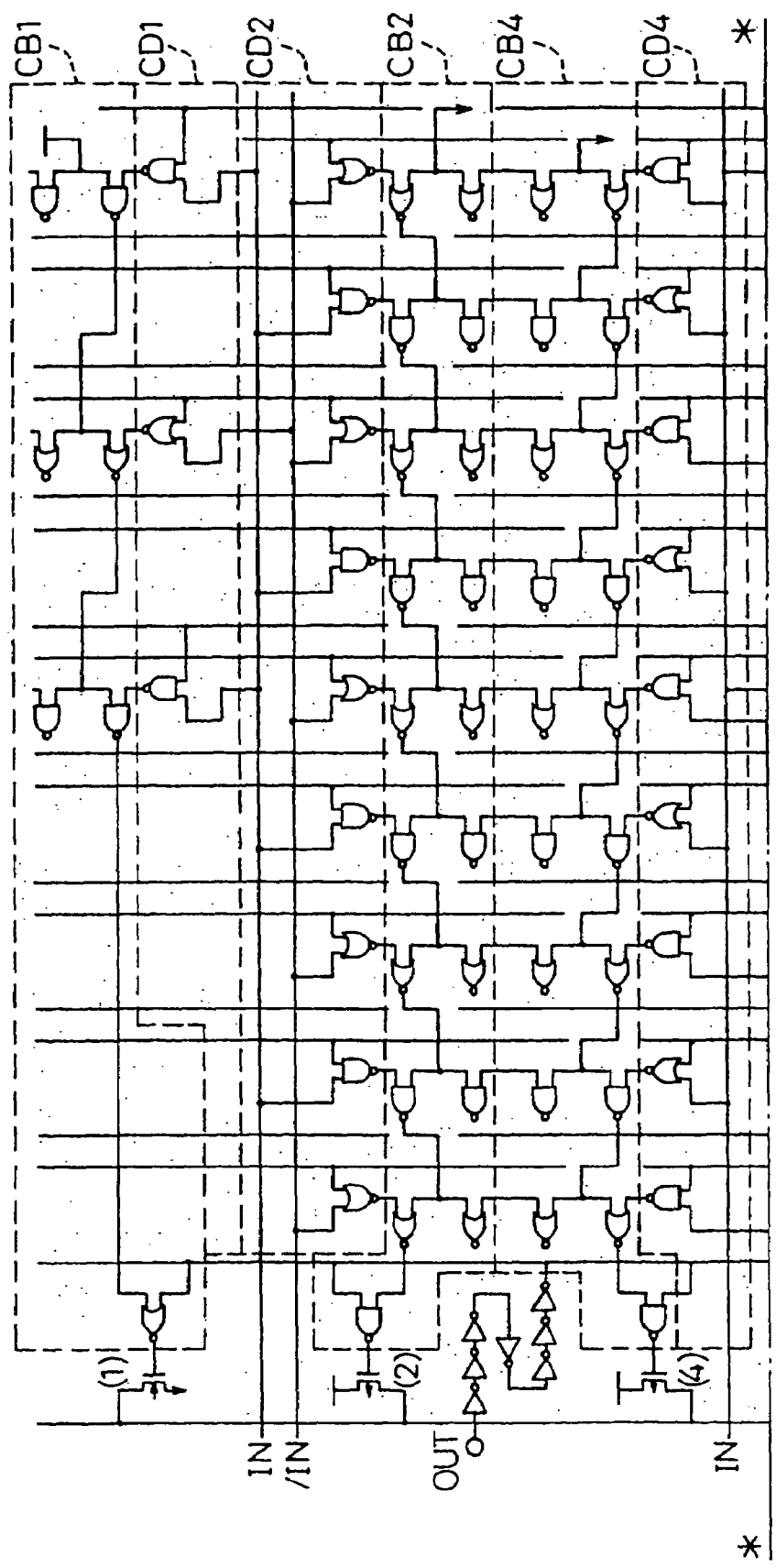
FIGS. 52A and 52B are circuit diagrams showing a ninth embodiment of a controlled delay circuit according to the present invention.
Figure 52B:
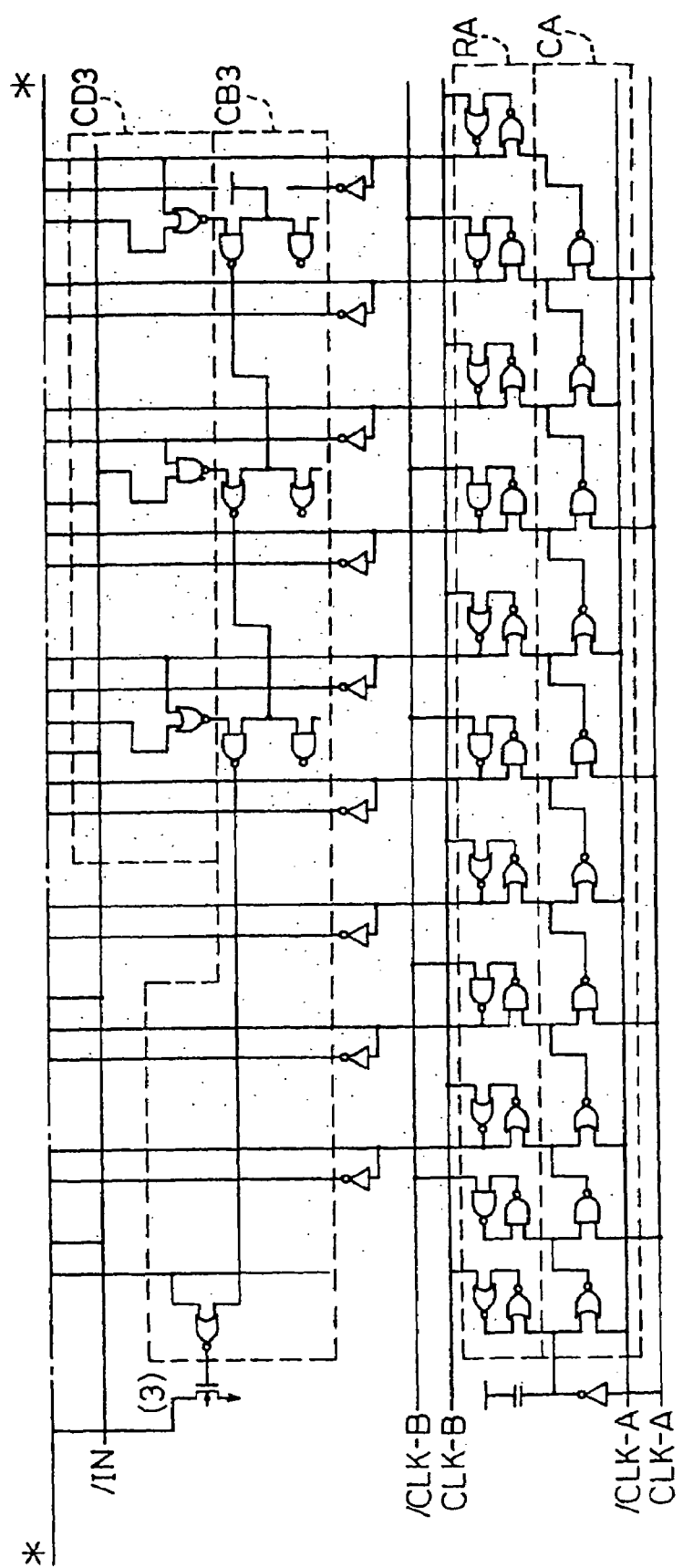
Figure 53:
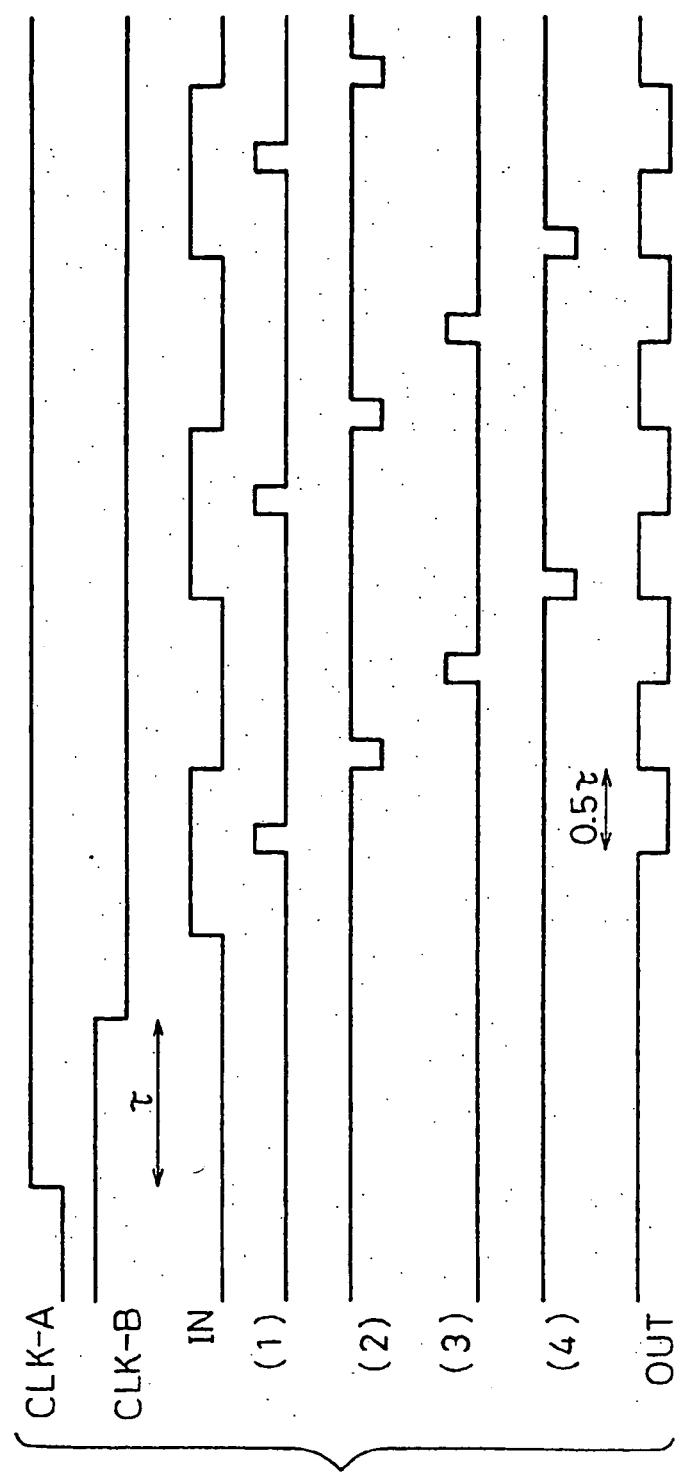
FIG. 53 is a timing chart for explaining operations of the controlled delay circuit of FIGS. 52A and 52B.

FIGS. 52A and 52B show a ninth embodiment of a controlled delay circuit according to the present invention, and FIG. 53 is a timing chart for explaining operations of the controlled delay circuit of FIGS. 52A and 52B.

This ninth embodiment of FIGS. 52A and 52B is a modification of the seventh embodiment of FIGS. 44A and 44B. Namely, in the ninth embodiment, a plurality pairs (two pairs) of second converter circuits (CB1, CB2; CB3, CB4) are provided, and one (CB1, CB2) of the second converter circuits of each pair delays the timing of a rise of an output (output signal) OUT, the other (CB2, CB4) of the second converter circuits of each pair delays the timing of a fall of the output OUT. The output changeover timing of opposite output OUT is determined by another output changeover timing means, and an output in each of the second converter circuits (CB1, CB2; CB3, CB4) and the output of the output changeover timing means are connected to a synthesis output node through buses.

Note that each of the second converter circuits CB1 and CB3 is constituted to receive alternative output of the first unit circuits UA of the first converter circuit CA through the gate step information converter circuit CD1 and CD3.

Therefore, as shown in FIG. 53, the frequency of the input signal (third input signal). IN is increased to two times (as large as that of the third input signal IN) by logically combining signals of the nodes (1) to (4). Further, in this ninth embodiment, the delay time included in the output signal OUT is determined to a half ($\tau/2$) of the first time difference $\tau$, and further, the output signal OUT is inverted.

Figure 54A:
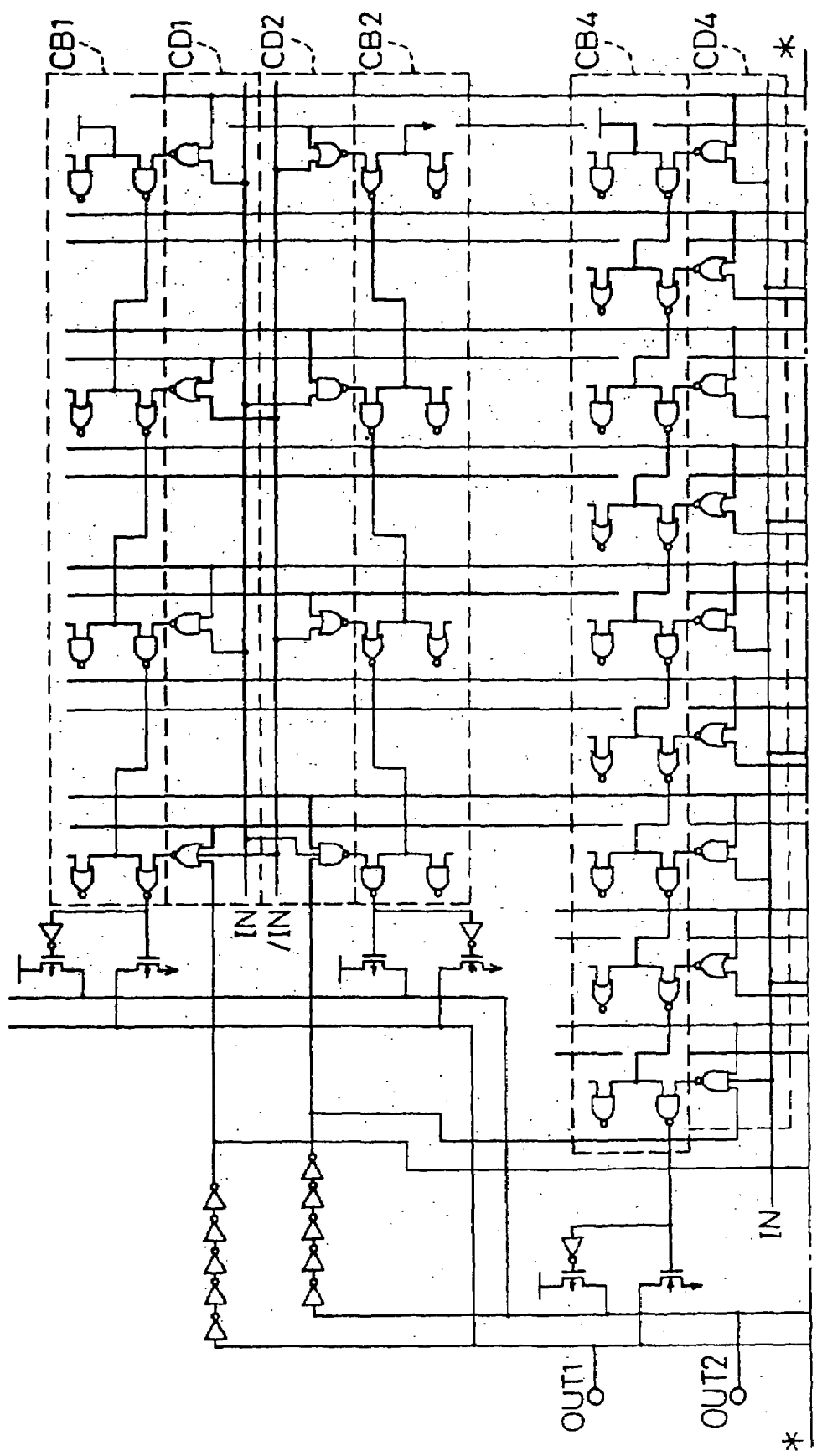
FIGS. 54A and 54B are circuit diagrams showing a tenth embodiment of a controlled delay circuit according to the present invention.
Figure 54B:
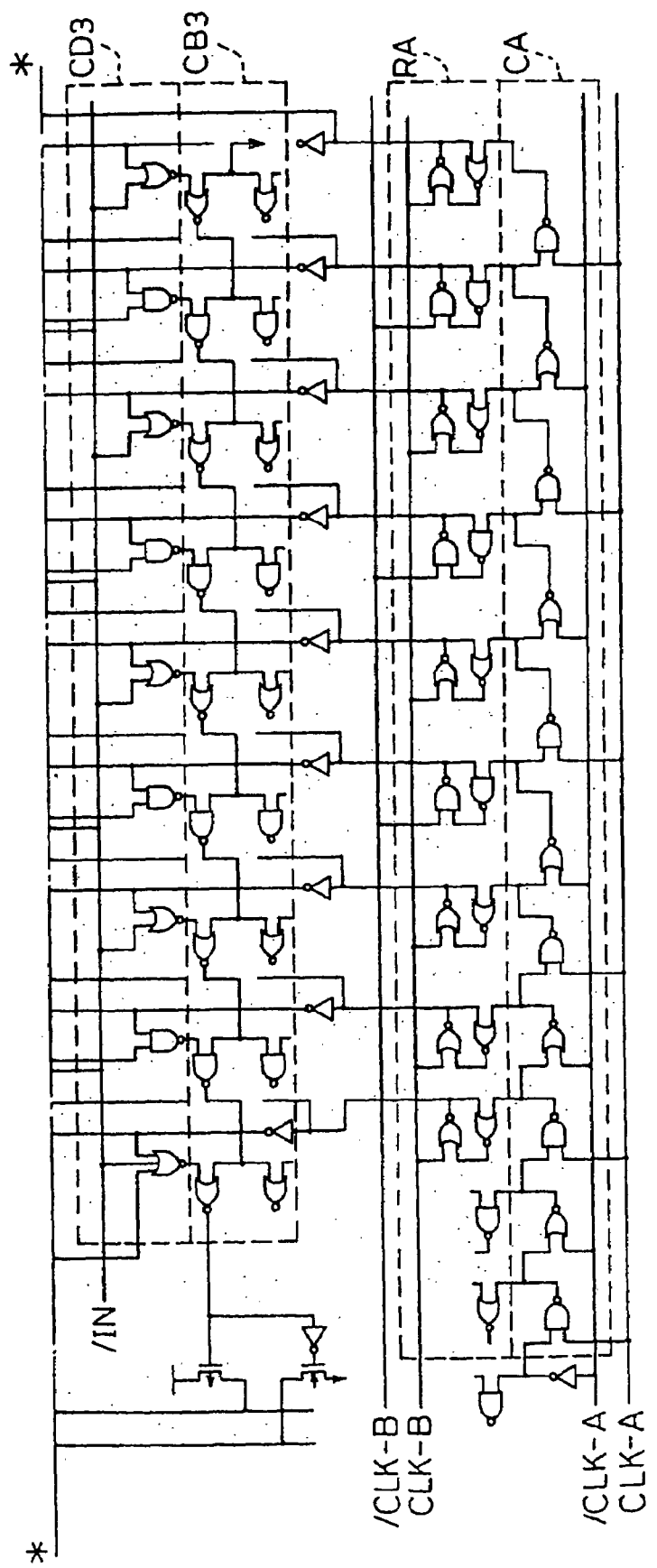
Figure 55:
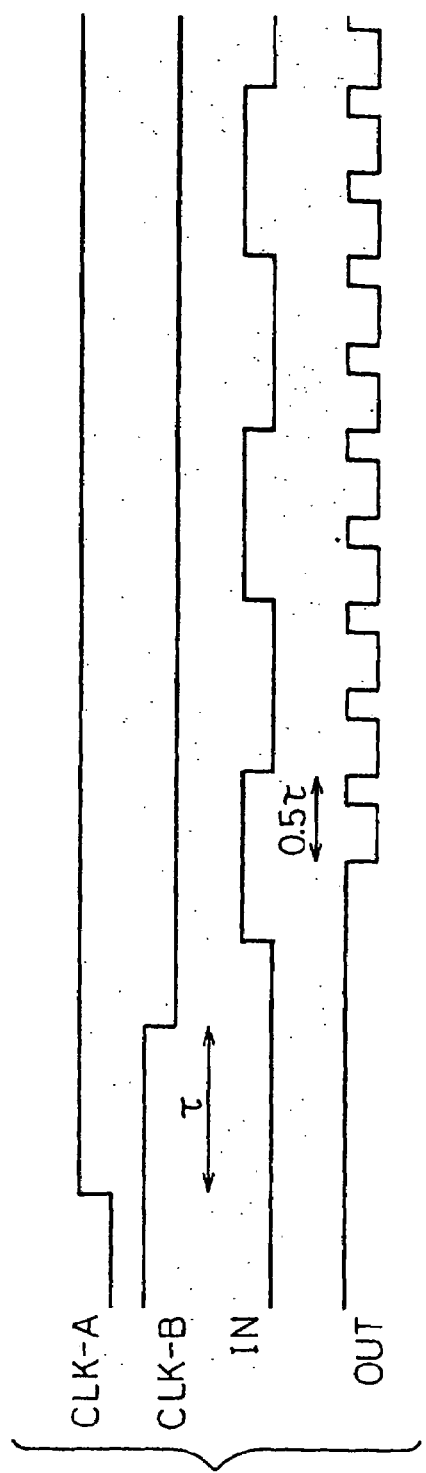
FIG. 55 is a timing chart for explaining operations of the controlled delay circuit of FIGS. 54A and 54B.

FIGS. 54A and 54B show a tenth embodiment of a controlled delay circuit according to the present invention, and FIG. 55 is a timing chart for explaining operations of the controlled delay circuit of FIGS. 54A and 54B.

As shown in FIGS. 54A and 54B, the controlled delay circuit of the tenth embodiment comprises four second converter circuits CB1, CB2, CB3, CB4, and thereby the output signal OUT is increased to two times as large as that of the third input signal IN. Namely, the controlled delay circuit comprises 2M second converter circuits (CB), to provide an output signal whose frequency is M times as large as that of the third input signal (IN).

Note that, as described above embodiments, in the case that two second converter circuits (CB1, CB2) are provided to separately form delays for a rise and fall of an input signal, an output in each of the second converter circuits is connected to a synthesized output node through a bus, and an output section in each of the second converter circuits is provided with a circuit for providing given data within a predetermined period after an output is changed from one to another, to sufficiently increase output impedance in the remaining period. Concretely, for example, as shown in the first embodiment of FIGS. 28 and 29, the latch circuit LA0 and the delay line DL0 having a plurality of inverter circuits can be provided at the output terminal (OUT), in order to maintain the output terminal (OUT) at a high impedance state without a specific short period (corresponding to the pulse width TWO in FIG. 29) when outputting data.

Further, it is possible that each of the second converter circuits (CB) is provided with a delay time fine adjustment circuit, so that each of the second converter circuits can provide an output signal whose timing frequency is synchronous to the third input signal IN. In addition, it is also possible to provide an odd number of second converter circuits (CB), to connect the inputs and outputs of the second converter circuits (CB) to one another to form a ring oscillator to provide a signal whose period is L/M times (L and M being integers) the time difference ($\tau$) set by the first converter circuit (CA).

Figure 56A:
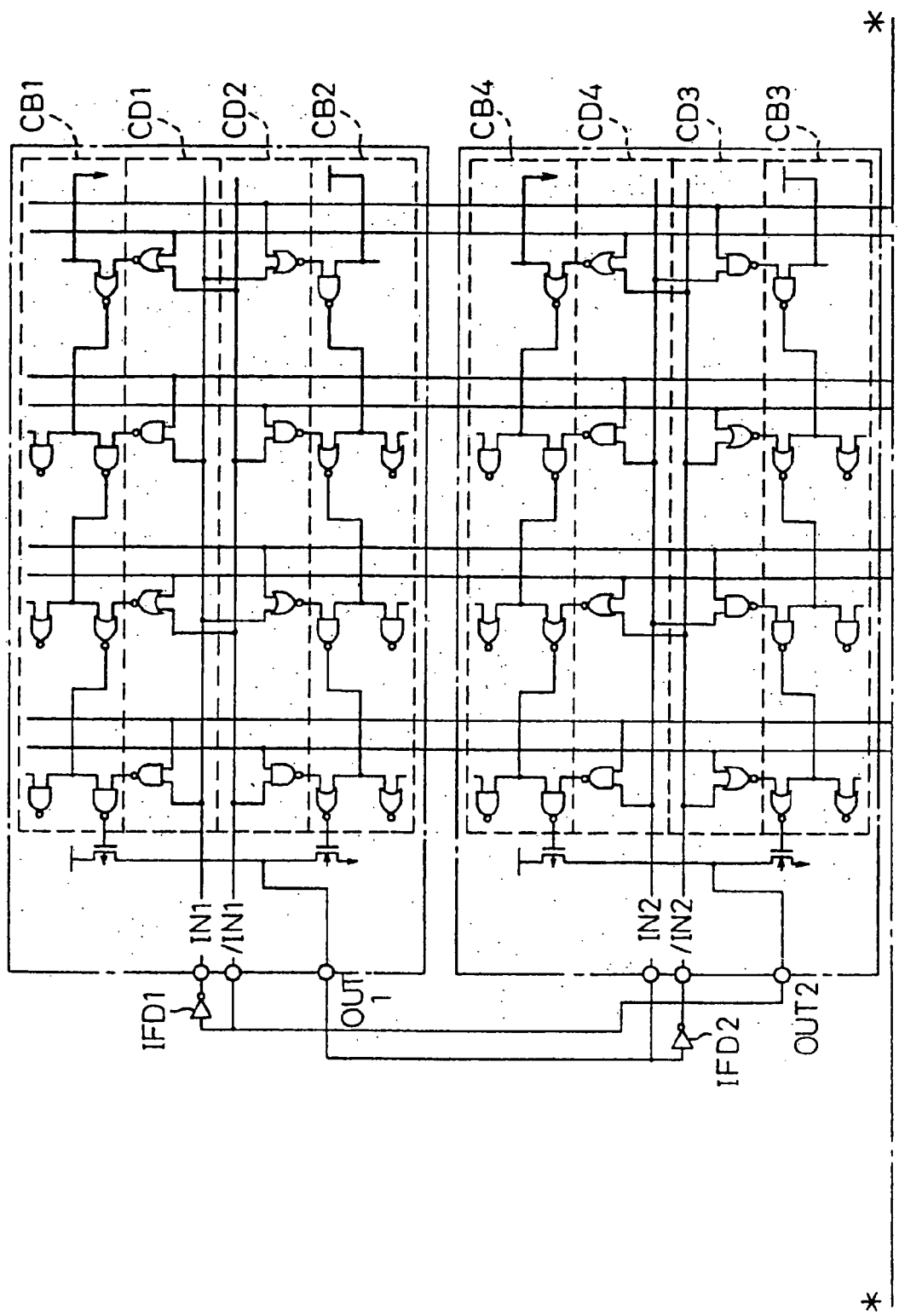
FIGS. 56A and 56B are circuit diagrams showing an eleventh embodiment of a controlled delay circuit according to the present invention.
Figure 56B:
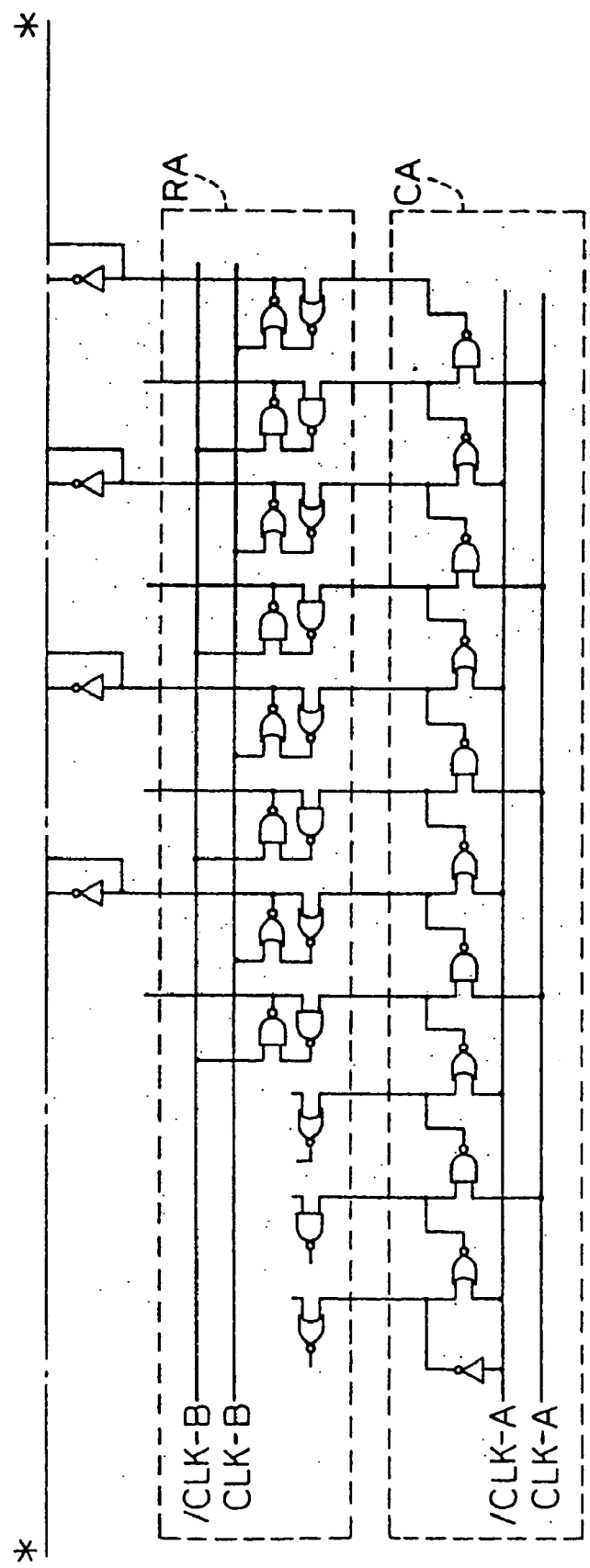
Figure 57:
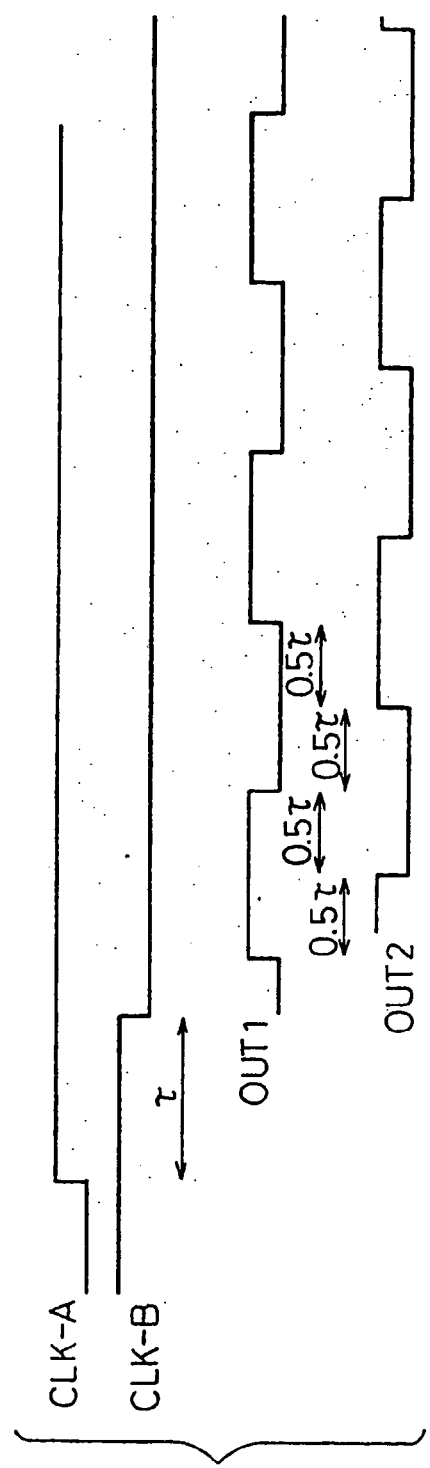
FIG. 57 is a timing chart for explaining operations of the controlled delay circuit of FIGS. 56A and 56B.

FIGS. 56A and 56B show an eleventh embodiment of a controlled delay circuit according to the present invention, and FIG. 57 is a timing chart for explaining operations of the controlled delay circuit of FIGS. 56A and 56B.

The controlled delay circuit of the eleventh embodiment comprises an even number of second converter circuits (CB) and an odd number of inverter gates, the inputs and outputs of the second converter circuits (CB) being connected to one another through the inverter gates, to form a ring oscillator to provide a signal whose period is L/M times (L and M being integers) the time difference ($\tau$) set by the first converter circuit (CA).

Namely, as shown in FIGS. 56A and 56B, the controlled delay circuit of the eleventh embodiment comprises four (even number) second converter circuits CB1, CB2 (CB3, CB4), and one (odd number) inverter gate IFD1 (IFD2). The output OUT1 of the second converter circuits CB1 and CB2 is directly connected to the input IN2 of the second converter circuits CB3 and CB4, and is connected to the input /IN2 of the second converter circuits CB3 and CB4 through the inverter circuit IFD2. Similarly, the output OUT2 of the second converter circuits CB3 and CB4 is directly connected to the input /IN1 of the second converter circuits CB1 and CB2, and is connected to the input IN1 of the second converter circuits CB1 and CB2 through the inverter circuit IFD1. Therefore, in the eleventh embodiment, a ring oscillator circuit is constituted, and two output signals OUT1 and OUT2 having a period $\tau$, and the phase difference thereof is $\tau/2$ (90 degree). Note that this eleventh embodiment is only one example, and various modifications can be applied to the eleventh embodiment, so that a signal whose period is L/M times (L and M being integers) the time difference ($\tau$) set by the first converter circuit (CA) can be obtained.

Figure 58A:
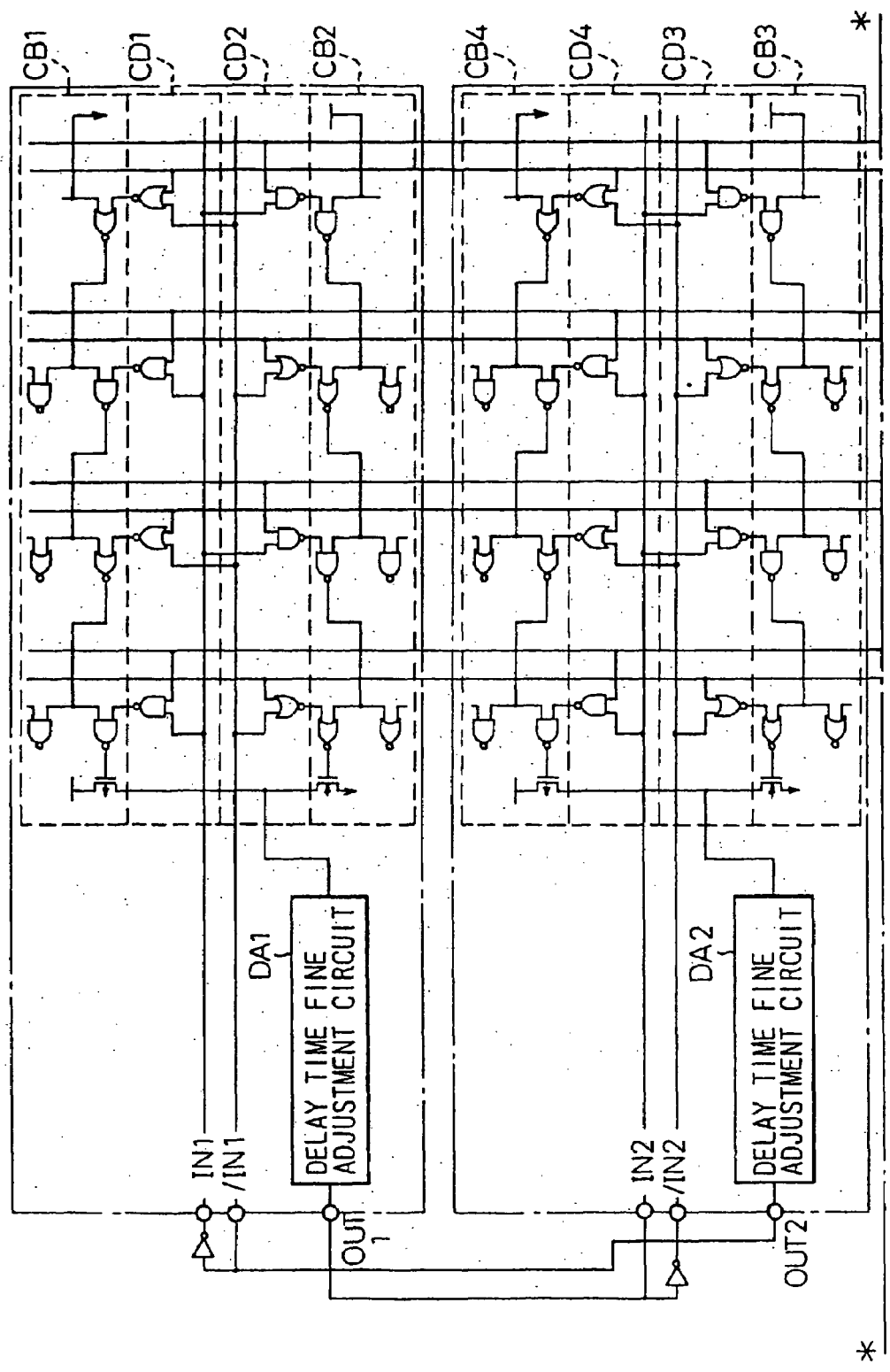
FIGS. 58A and 58B are circuit diagrams showing a twelfth embodiment of a controlled delay circuit according to the present invention.
Figure 58B:
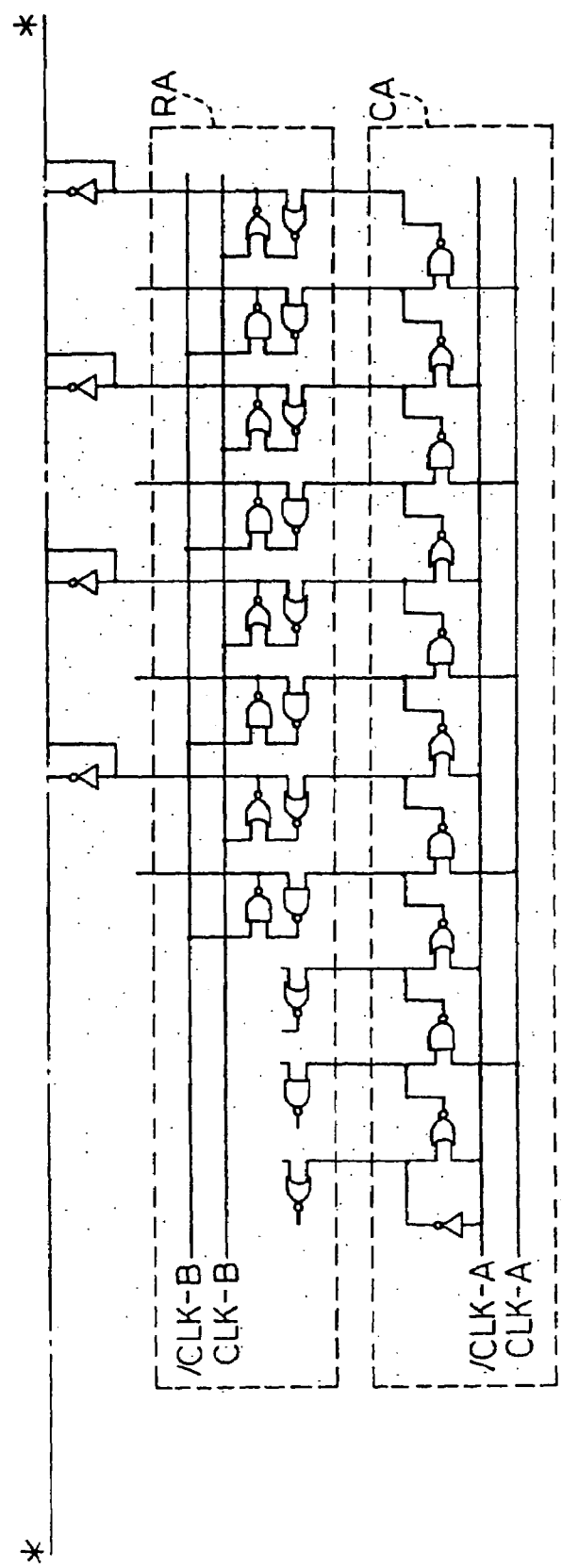

FIGS. 58A and 58B show a twelfth embodiment of a controlled delay circuit according to the present invention. Note that this twelfth embodiment corresponds to the above eleventh embodiment further including a delay time fine adjustment circuit DA (DA1, DA2).

Namely, in the twelfth embodiment, the delay time fine adjustment circuits DA1 and DA2 are provided for the second converter circuits CB1, CB2 and CB3, CB4, and output signals OUT1 and OUT2 are output through the delay time fine adjustment circuits DA1 and DA2, so that each of the second converter circuits CB1, CB2 and CB3; CB4 can provide an output signal OUT1 and OUT2 whose timing frequency is synchronous to the third input signal IN.

Note that, in the second converter circuits (CB), delay circuits for electrically controlling a delay time can be provided, to obtain a signal whose period is L/M times (L and M being integers) the time difference ($\tau$) set by the first converter circuit (CA), wherein the delay circuits are controlled to synchronize the changeover timing of the output of any one of the second converter circuits (CB) with the changeover timing of an external clock signal. Further, in the second converter circuits (CB), fixed delay time for determining in consideration of manufacturing fluctuations can be provided, to obtain an internal clock signal that changes more quickly than the external clock signal by the fixed time, wherein the delay circuits are controlled to synchronize the changeover timing of the output of any one of the second converter circuits (CB) with the changeover timing of an external clock signal.

As described above, according to the controlled delay circuit of the present invention an output signal including a required delay time or a required frequency can be obtained by decreasing consumption power without receiving influence of noises caused by power voltage or temperature fluctuations.

Figure 59:
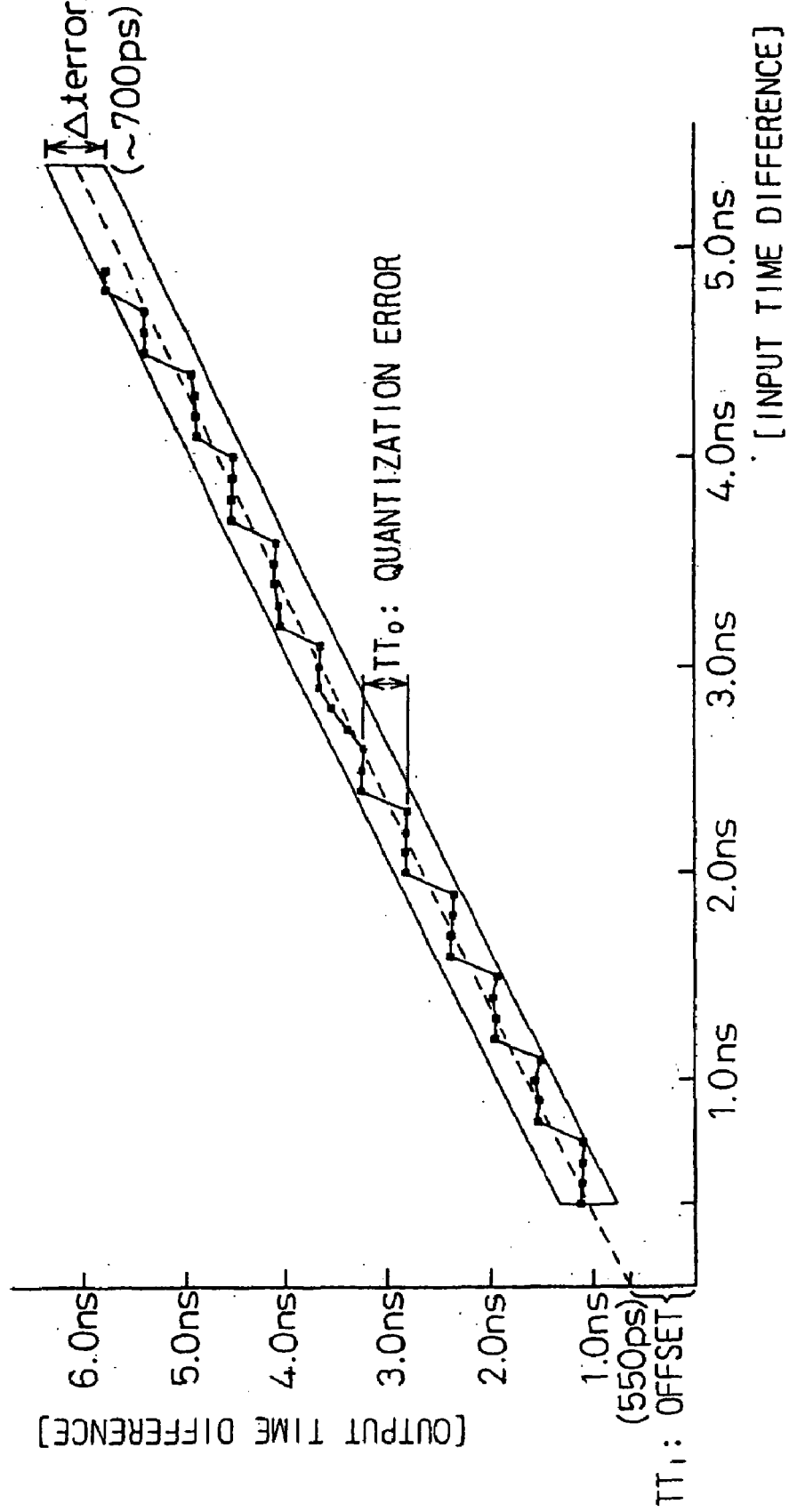
FIG. 59 is a diagram showing the relationship between an input time difference and an output time difference in the controlled delay circuit of FIGS. 26A and 26B.

By the way, FIG. 59 shows the relationship between an input time difference and an output time difference in the controlled delay circuit of FIGS. 26A and 26B employed by the DLL circuit of the related art.

The relationship is not an ideal straight line (a dotted line in FIG. 59) but a stepwise line (a continuous line in FIG. 59) with a delay contained in an output signal OUT fluctuating with respect to an input signal IN. Namely, the output time difference involves a quantization error TT0 corresponding to, for example, a gate unit as well as an offset TT1 with respect to the input time difference, to deteriorate the accuracy of an output signal provided by the DLL circuit.

The PLL circuit mentioned before is vulnerable to power source noise because it is an analog circuit and consumes much current depending on the scale of the circuit. The DLL circuit of the related art provides an output signal of poor accuracy due to the quantization error TT0 and offset TT1.

Next, controlled delay circuits and control signal generators according to a thirteenth to nineteenth embodiments of the present invention will be explained with reference to the accompanying drawings.

Figure 60:
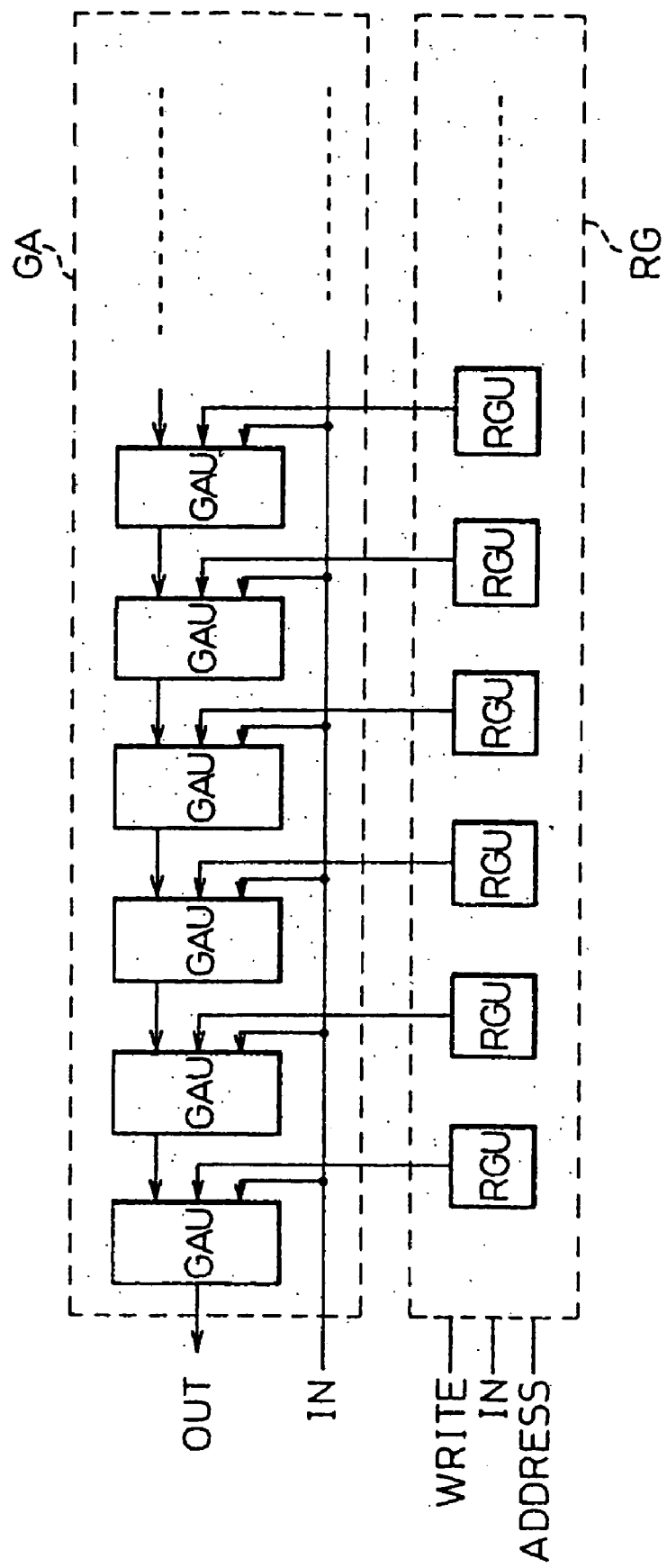
FIG. 60 is a block diagram showing a controlled delay circuit according to a thirteenth embodiment of the present invention.

FIG. 60 is a block diagram showing a controlled delay circuit according to a thirteenth embodiment of the present invention. The controlled delay circuit has a gate array GA and a register circuit RG serving as a gate specifying circuit.

The gate array GA has cascaded gate units GAUs each of which receives the output of the preceding gate unit, an input signal IN, and the output of a corresponding register unit RGU of the register circuit RG. The register circuit RG specifies one of the gate units GAUs that starts to delay the input signal IN.

Each gate unit GAU may consist of inverters, NOR gates, NAND gates, and a combination of them. The register circuit RG receives an address signal ADDRESS, a write signal WRITE, and the input signal IN, to store data that specifies one of the gate units GAUs that starts to delay the input signal IN. Namely, the number of gate units from the gate unit specified by the data stored in the register circuit RG to the gate unit that provides an output signal OUT determines a delay time applied to the input signal IN, and the delayed input signal is provided as the output signal OUT.

Figure 61:
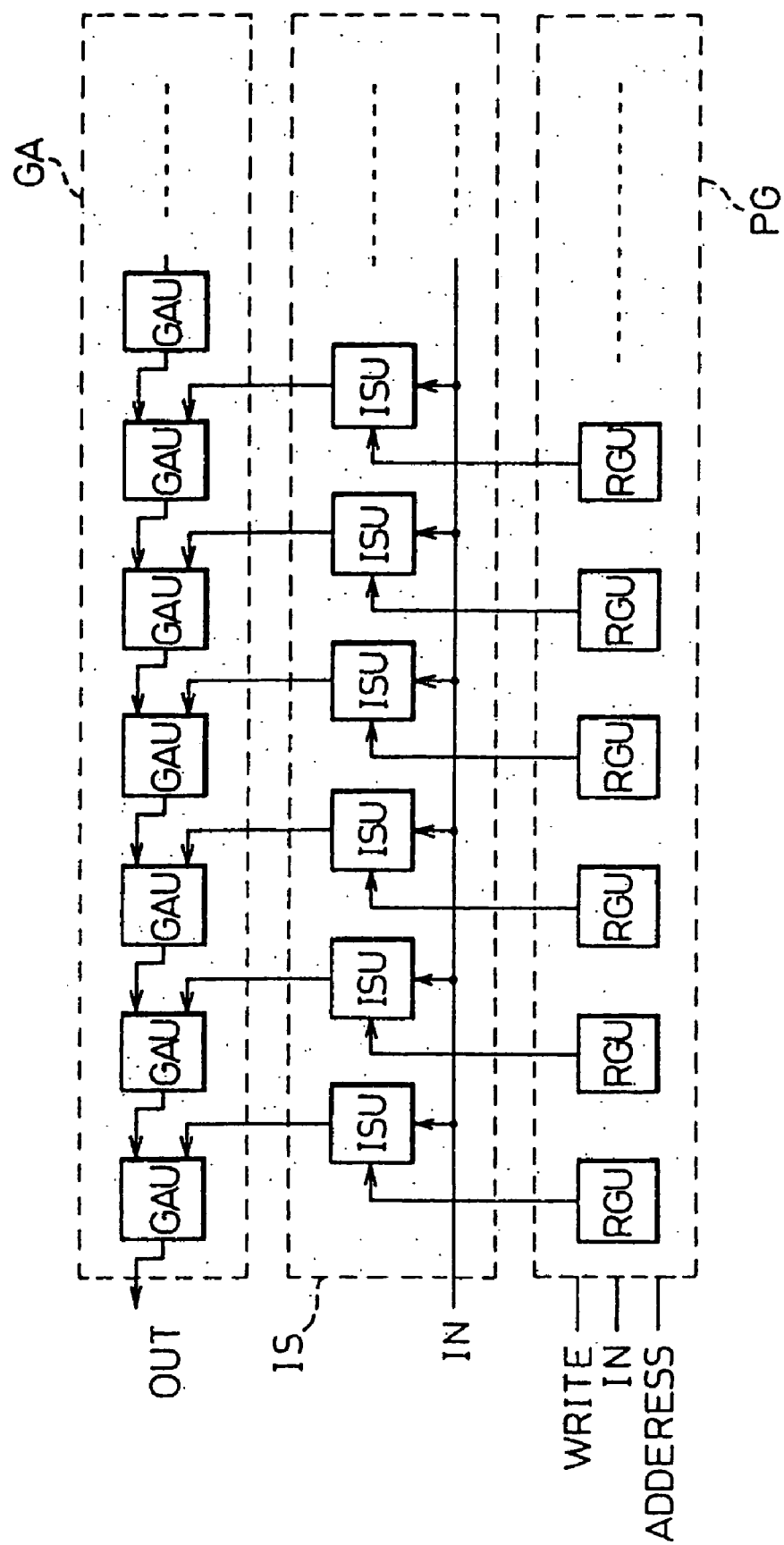
FIG. 61 is a block diagram showing a controlled delay circuit according to a fourteenth embodiment of the present invention.

FIG. 61 is a block diagram showing a controlled delay circuit according to a fourteenth embodiment of the present invention. This controlled delay circuit has an input switching circuit IS in addition to the arrangement of FIG. 60.

The input switching circuit IS has switching units ISUs for gate units GAUs of a gate array GA, respectively. Each of the switching units ISUs receives an input signal IN and the output of a corresponding register unit RGU of a register circuit RG. Data stored in the register circuit RG specifies one of the switching units ISUs, and through the specified switching unit ISU, the input signal IN is supplied to a corresponding gate unit GAU. Namely, the input signal IN is supplied to one of the gate units GAUs that is specified by data stored in the register circuit RG. The number of gate units from the specified gate unit to the gate unit that provides an output signal OUT determines a delay time applied to the input signal IN, and the delayed input signal is provided as the output signal OUT.

Figure 62:
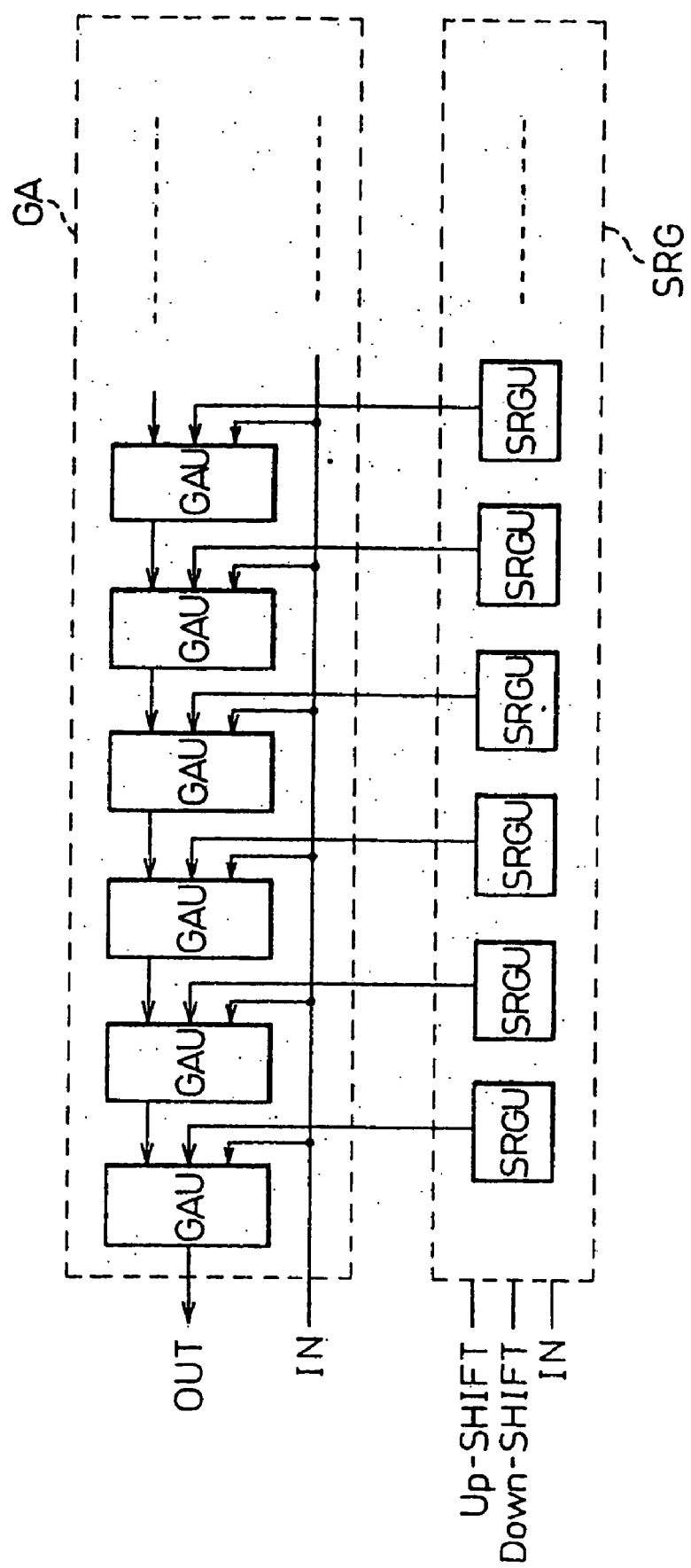
FIG. 62 is a block diagram showing a controlled delay circuit according to a fifteenth embodiment of the present invention.
Figure 63:
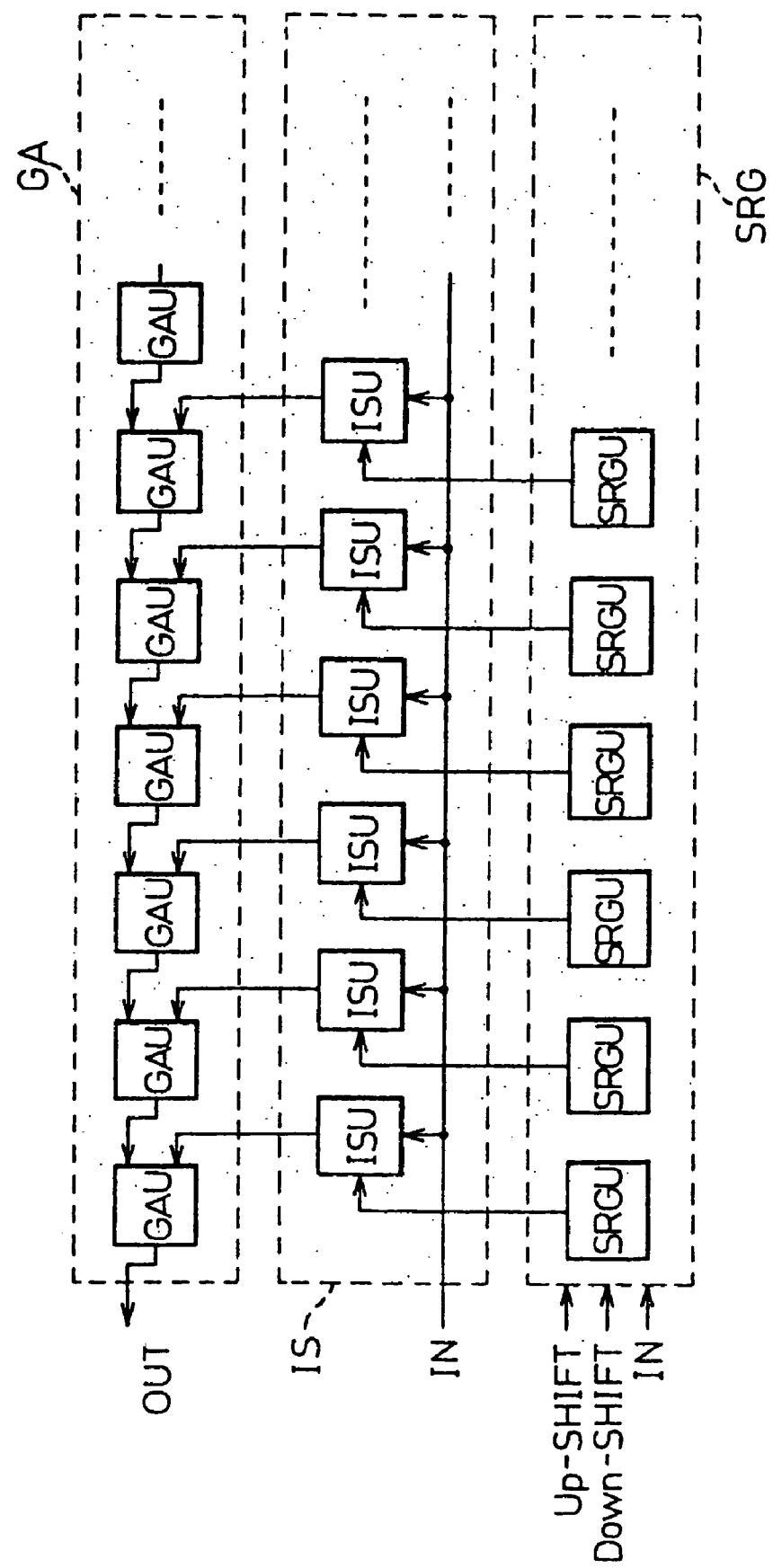
FIG. 63 is a block diagram showing a controlled delay circuit according to a sixteenth embodiment of the present invention.

FIGS. 62 and 63 are block diagrams showing controlled delay circuits according to a fifteenth and sixteenth embodiments of the present invention, respectively. These controlled delay circuits employ each a shift register circuit SRG instead of the register circuit RG of FIGS. 60 and 61.

The thirteenth and fourteenth embodiments of FIGS. 60 and 61 employ the register circuit RG as the gate specifying circuit to directly set data, which specifies one of the gate units GAUs that starts to delay an input signal IN, according to the address signal ADDRESS, write signal WRITE, and input signal IN. On the other hand, the fifteenth and sixteenth embodiments of FIGS. 62 and 63 use an up-shift signal Up-SHIFT, a down-shift signal Down-SHIFT, and an input signal IN, to set data to specify one of the gate units GAUs that starts to delay the input signal IN.

Namely, each of the controlled delay circuits of FIGS. 62 and 63 successively shifts data in the shift register units SRGUs in response to the shift signals Up-SHIFT and Down-SHIFT, to select one of the gate units GAUs. The other arrangements of the fifteenth and sixteenth embodiments of FIGS. 62 and 63 are the same as those of the thirteenth and fourteenth embodiments of FIGS. 60 and 61, respectively.

Figure 64:
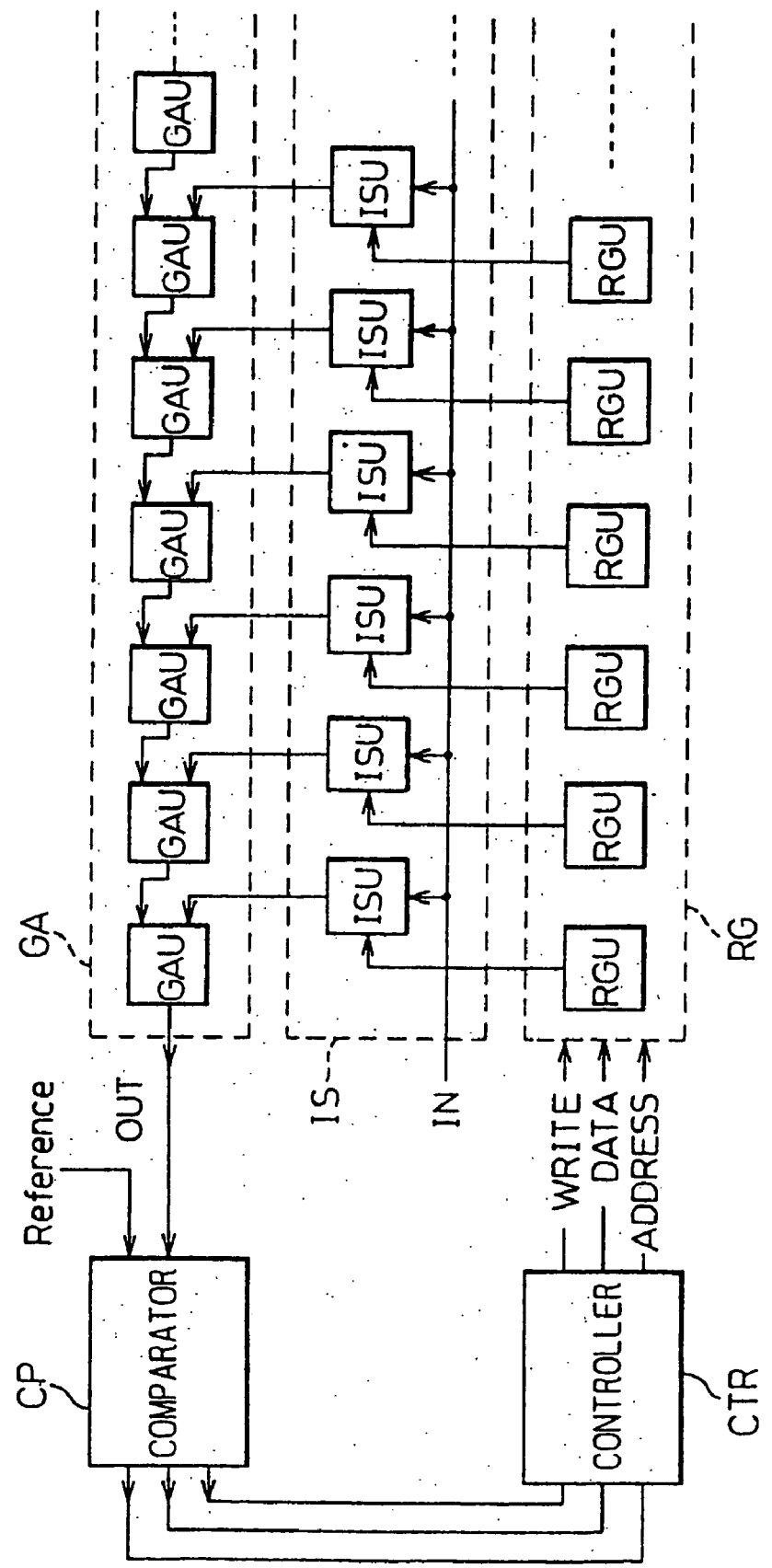
FIG. 64 is a block diagram showing a controlled delay circuit according to a seventeenth embodiment of the present invention.

FIG. 64 is a block diagram showing a controlled delay circuit according to a seventeenth embodiment of the present invention. This controlled delay circuit employs a comparator CP and a controller CTR.

The comparator CP compares an output signal OUT of a gate array GA with a reference signal "Reference", and provides output signals according to which the controller CTR supplies a write signal WRITE, a data signal DATA, and an address signal ADDRESS to a register circuit RG.

If a delay time contained in the output signal OUT of the gate array GA is smaller than the reference signal, i.e., if the output signal OUT is ahead of the reference signal, the number of gate units involved in delaying the input signal IN must be increased. Accordingly, necessary data is written in a register unit RGU on the right side of the presently set register unit so that a switching unit ISU on the right side of the presently selected switching unit is selected in an input switching circuit IS. If the delay time contained in the output signal OUT is greater than the reference signal, i.e., if the output signal OUT is behind the reference signal, the number of gate units GAUs involved in delaying the input signal IN must be decreased. Accordingly, necessary data is written in a register unit RGU on the left side of the presently set register unit so that a switching unit ISU on the left side of the presently selected switching unit is selected.

Figure 65:
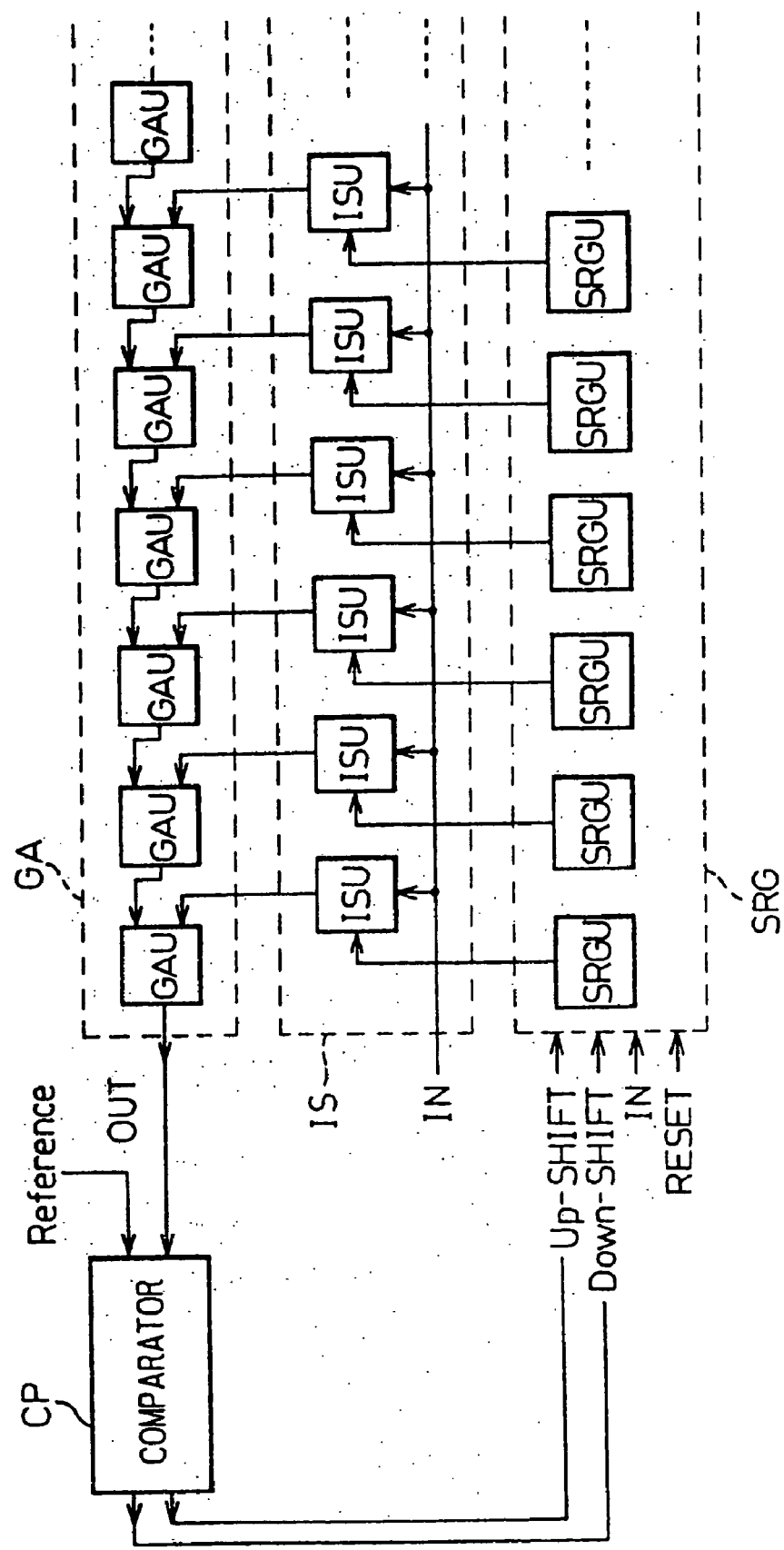
FIG. 65 is a block diagram showing a controlled delay circuit according to an eighteenth embodiment of the present invention.

FIG. 65 is a block diagram showing a controlled delay circuit according to an eighteenth embodiment of the present invention. This embodiment employs a shift register circuit SRG instead of the register circuit RG of the seventeenth embodiment of FIG. 64.

In FIG. 65, a comparator CP compares an output signal OUT of a gate array GA with a reference signal "Reference" and provides an output signal according to which a shift-up signal Up-SHIFT or a shift-down signal Down-SHIFT is supplied to the shift register circuit SRG.

If a delay time contained in the output signal OUT of the gate array GA is smaller than the reference signal, the number of gate units GAU involved in delaying the input signal IN must be increased. Accordingly, the comparator CP provides the shift register circuit SRG with the shift-up signal Up-SHIFT. If the delay time contained in the output signal OUT is larger than the reference signal, the number of gate units GAUs involved in delaying the input signal IN must be decreased. Accordingly, the comparator CP provides the shift register circuit SRG with the shift-down signal Down-SHIFT.

Figure 66A:
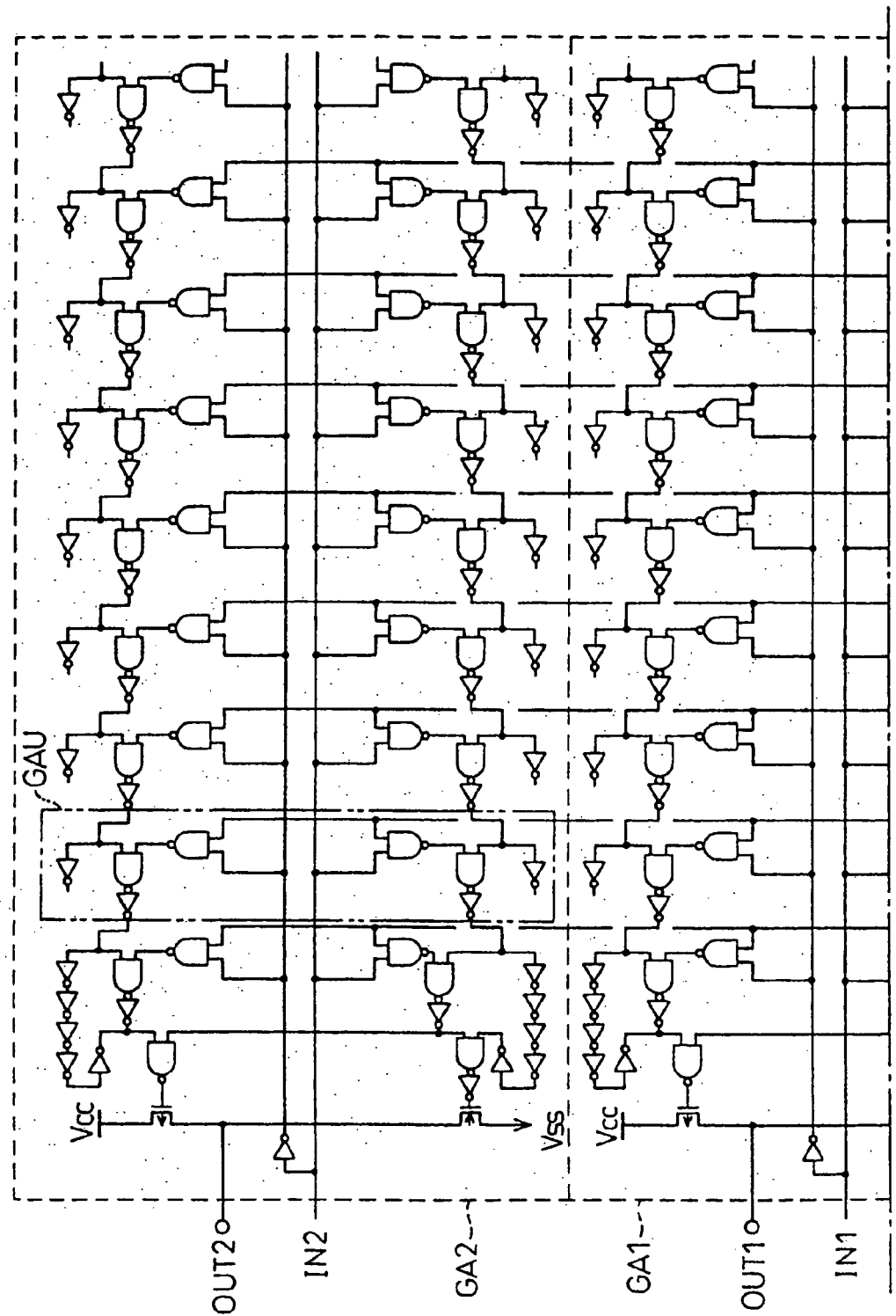
FIGS. 66A and 66B are circuit diagrams showing a controlled delay circuit according to a nineteenth embodiment of the present invention.
Figure 66B:
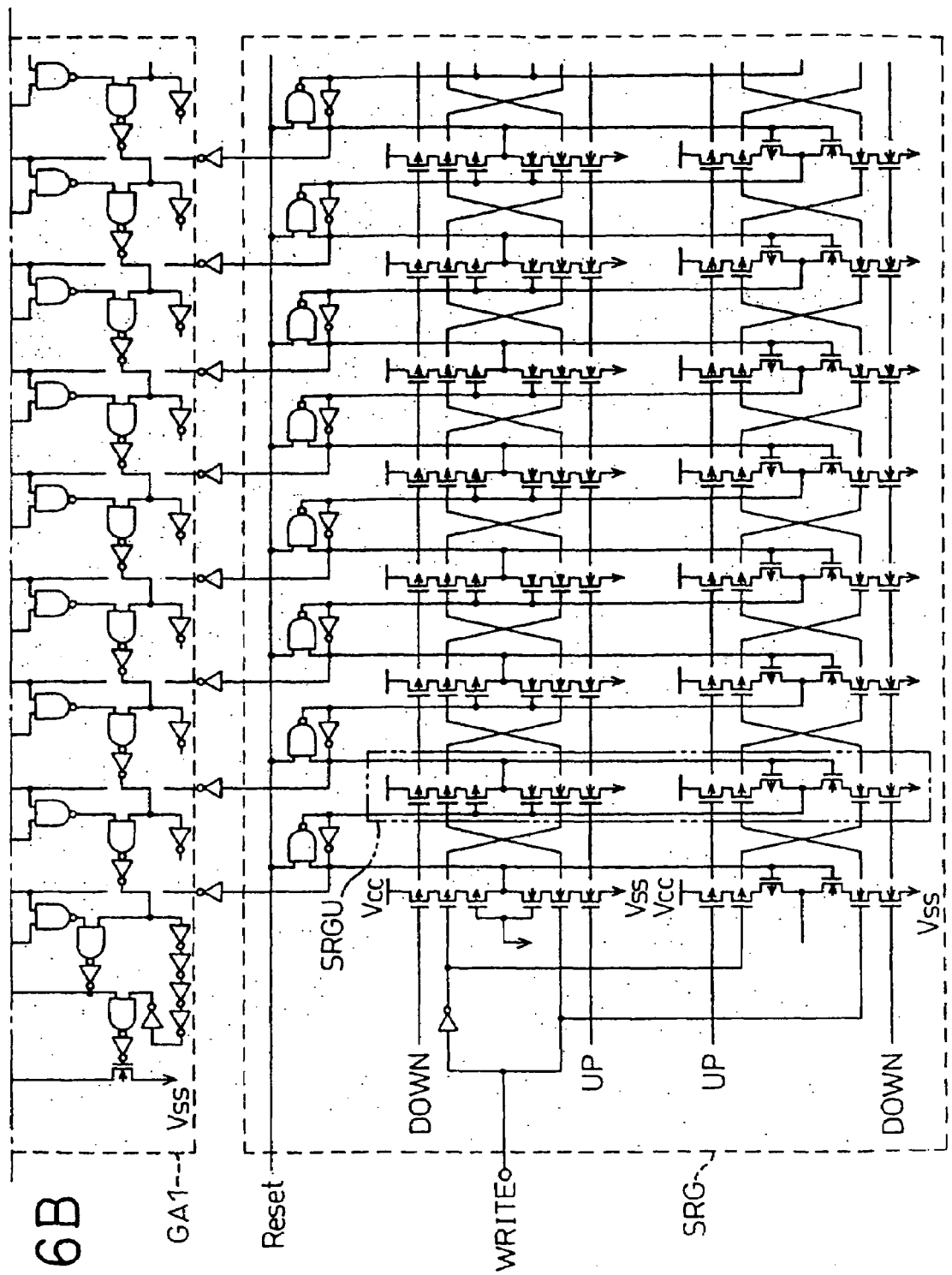

FIGS. 66A and 66B are circuit diagrams showing a controlled delay circuit according to a nineteenth embodiment of the present invention.

There are two gate arrays GA1 and GA2 that receive the output of a single shift register circuit SRG. An input signal IN1 to the gate array GA1 is different from an input signal IN2 to the gate array GA2. As a result, an output OUT1 from the gate array GA1 and an output OUT2 from the gate array GA2 are different from each other but have the same delay time.

A write control signal WRITE controls the write state of the shift register circuit SRG. Under the write state with the signal WRITE being at high level, data stored in the shift register circuit SRG to select gate units GAUs of the gate arrays GA1 and GA2 is shifted according to shift-up and shift-down signals Up-SHIFT and Down-SHIFT.

Each gate unit GAU consists of four inverters and four NAND gates, and each shift register unit SRGU consists of six N-channel MOS transistors and six P-channel MOS transistors. Naturally, the units GAUs and SRGUs may have different structures.

Figure 67:
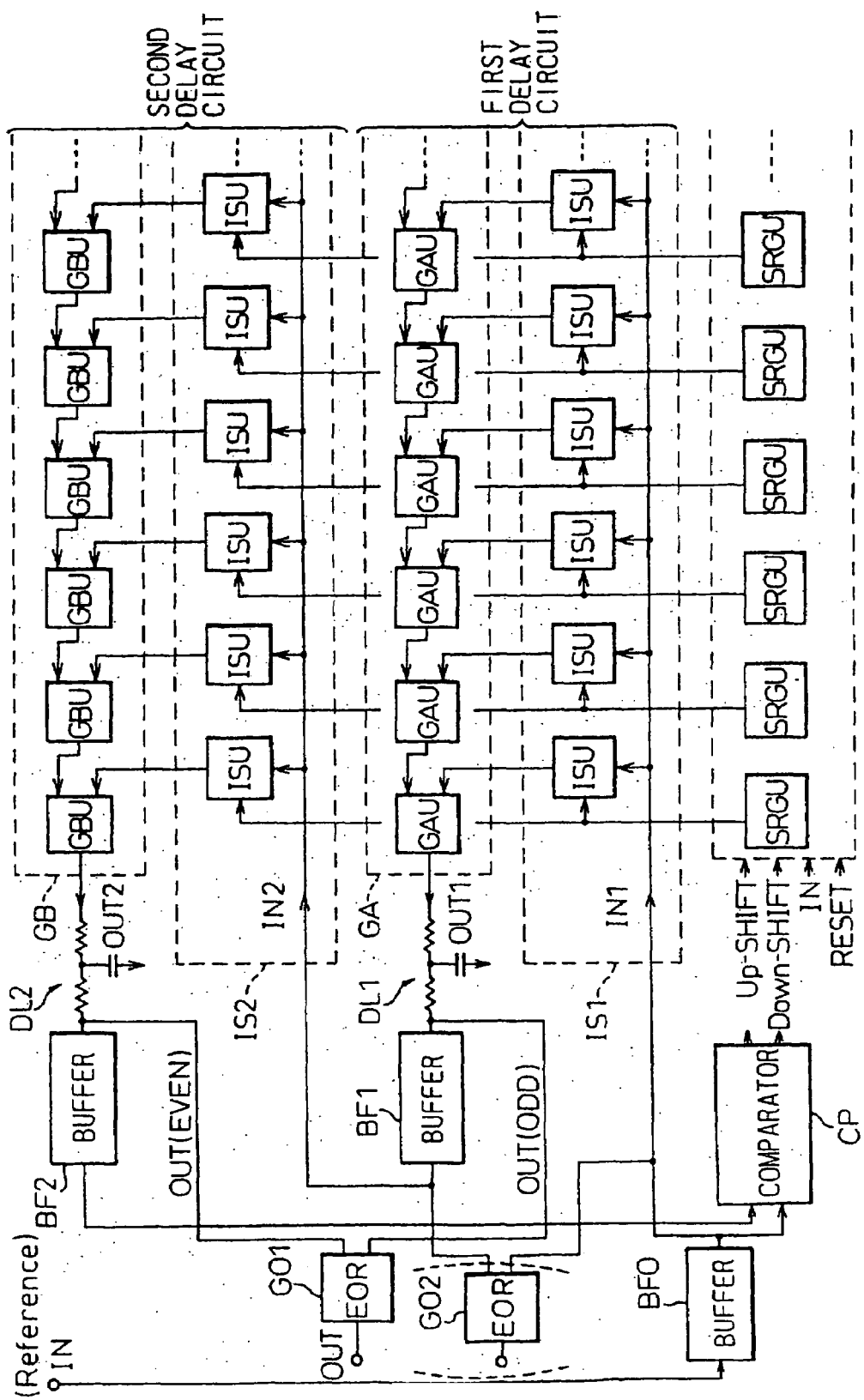
FIG. 67 is a block diagram showing an example of a control signal generator according to the present invention.

FIG. 67 is a block diagram showing an example of a control signal generator according to the present invention. This circuit consists of a first controlled delay circuit (first delay circuit), a second controlled delay circuit (second delay circuit), a comparator CP, and a shift register SRG.

The first controlled delay circuit consists of a first gate array GA having cascaded gate units GAUs and a first input switching circuit IS1 for controlling the supply of an input signal IN (IN1) to each gate unit GAU of the first gate array GA according to data stored in the shift register circuit SRG. The second controlled delay circuit consists of a second gate array GB having cascaded gate units GBUs and a second input switching circuit IS2 for controlling the supply of an output signal OUT1 (IN2) of the first gate array GA to each gate unit GBU of the second gate array GB according to the data stored in the shift register SRG.

The input signal IN is passed through a buffer BF0 and is supplied as the input signal IN1 to the first input switching circuit IS1. The output signal OUT1 of the first gate array GA is passed through a buffer BF1 and is supplied as the input signal IN2 to the second input switching circuit IS2. An EOR gate G01 logically processes the output signal OUT1 of the first gate array GA and an output signal OUT2 of the second gate array GB and provides an output signal OUT. An EOR gate G02 may be installed to logically process the input signal IN (IN1) passed through the buffer BF0 and the output signal OUT1 of the first gate array GA passed through the buffer BF1, to provide an output signal. The period of the output signal OUT provided by the EOR gate G01 (G02) is half that of the input signal IN. Namely, the frequency of the output signal OUT is twice as large as that of the input signal IN.

Corresponding gate units GAU and GBU of the first and second gate arrays GA and GB are simultaneously specified according to data stored in the shift register circuit SRG. Delay monitor circuits DL1 and DL2 each made of resistors and a capacitor are used to cancel long wiring delays.

As explained above in detail, the present invention provides a controlled delay circuit having a gate specifying circuit for specifying, according to stored data, one of gates of a gate array to start delaying an input signal. The present invention also provides a control signal generator employing such a controlled delay circuit, for correctly generating a high-speed clock signal without a quantization error or an offset.

Many different embodiments of the present invention may be constructed without departing from the spirit and scope of the present invention, and it should be understood that the present invention is not limited to the specific embodiments described in this specification, except as defined in the appended claims.

What is claimed is:

1. An electric circuit comprising:
   a first clock buffer circuit receiving an external clock signal;
   a first delay circuit for receiving an output of said first clock buffer circuit; and
   a first clock timing control circuit, being supplied with an output of said first delay circuit, for generating a preceding internal clock before the output of said first clock buffer circuit being output; and
   a first clock delivery circuit for receiving and outputting the preceding internal clock;
   wherein said first delay circuit duplicates delay time characteristics of said first clock buffer circuit and said first clock delivery circuit.

2. An electric circuit as claimed in claim 1, wherein the electric circuit multiplies a time difference between the external clock signal and the internal clock, which changes in response to the external clock signal, by a factor of N, where N is an integer equal to or larger than 2.

3. An electric circuit as claimed in claim 1, wherein said first delay circuit includes a second delay circuit for duplicating delay time characteristics of said first clock delivery circuit, and a third delay circuit for duplicating delay time characteristics of said first clock buffer circuit.

4. An electric circuit comprising:
   a first clock buffer circuit receiving an external clock signal;
   a first delay circuit for receiving an output of said first clock buffer circuit;
   a first clock timing control circuit, being supplied with an output of said first delay circuit, for generating a preceding internal clock before the output of said first clock buffer circuit being output;
   a first clock delivery circuit for receiving and outputting the preceding internal clock;
   a first optional circuit; and
   a first output circuit for receiving the preceding internal clock and an output of said optional circuit, and outputting the output of said optional circuit in synchronization with the preceding internal clock;
   wherein said first delay circuit duplicates delay time characteristics of said first clock buffer circuit and said first clock delivery circuit.

5. An electric circuit as claimed in claim 4, wherein said electric circuit further comprises a first clock frequency control circuit for receiving an output of said clock buffer circuit, and an output of said first clock frequency control circuit is also supplied to said first clock timing control circuit.

6. An electric circuit as claimed in claim 4, wherein said first clock timing control circuit stores capability information into a memory, and the capability information relates to the input from the output of said first clock buffer circuit and the output of said first delay circuit.

7. An electric circuit as claimed in claim 4, wherein the electric circuit multiplies a time difference between the external clock signal and the internal clock, which changes in response to the external clock signal, by a factor of N, where N is an integer equal to or larger than 2.

8. An electric circuit as claimed in claim 4, wherein said first delay circuit includes a second delay circuit for duplicating delay time characteristics of said first clock delivery circuit, and a third delay circuit for duplicating delay time characteristics of said first clock buffer circuit.

9. An electric circuit comprising:
   a first clock buffer circuit receiving an external clock signal;
   a first delay circuit for receiving an output of said first clock buffer circuit;

a first clock timing control circuit, being supplied with an output of said first delay circuit, for generating an output coincident with said external clock signal; and a first clock delivery circuit for receiving and outputting the external clock signal;

wherein said first delay circuit duplicates delay tine characteristics of said first clock buffer circuit and said first clock delivery circuit.

10. An electric circuit as claimed in claim 9, wherein the electric circuit multiplies a time difference between the external clock signal and the internal clock, which changes in response to the external clock signal, by a factor of N, where N is an integer, equal to or larger than 2.

11. An electric circuit as claimed in claim 9, wherein said first delay circuit includes a second delay circuit for duplicating delay time characteristics of said first clock delivery circuit, and a third delay circuit for duplicating delay time characteristics of said first clock buffer circuit.

12. An electric circuit comprising:

a first clock buffer circuit receiving an external clock signal;

a first delay circuit for receiving an output of said first clock buffer circuit;

a first clock timing control circuit, being supplied with an output of said first delay circuit, for generating an output coincident wit said external clock signal;

a first clock delivery circuit for receiving and outputting the external clock signal;

a first optional circuit; and a first output circuit for receiving the output coincident with the external clock signal and an output of said optional circuit, and outputting the output of said optional circuit in synchronization with the output coincident with the external clock signal;

wherein said first delay circuit duplicates delay time characteristics of said first clock buffer circuit and said first clock delivery circuit.

13. An electric circuit as claimed in claim 12, wherein said electric circuit further comprises a first clock frequency control circuit for receiving an output of said clock buffer circuit, an output of said first clock frequency control circuit is also supplied to said first clock timing control circuit, and said first clock timing control circuit generates an output coincident with a part of said external clock signal.

14. An electric circuit as claimed in claim 12, wherein said first clock timing control circuit stores capability information into a memory, the capability information relates to the input from the output of said first clock buffer circuit and the output of said first delay circuit, and said first clock timing control circuit generates an output coincident with a part of said external clock signal.

15. An electric circuit as claimed in claim 12, wherein the electric circuit multiplies a time difference between the external clock signal and the internal clock, which changes in response to the external clock signal, by a factor of N, where N is an integer equal to or larger than 2.

16. An electric circuit as claimed in claim 12, wherein said first delay circuit includes a second delay circuit for duplicating delay time characteristics of said first clock delivery circuit, and a third delay circuit for duplicating delay time characteristics of said first clock buffer circuit.

* * * * *